(12) United States Patent
Yamagiwa et al.

(10) Patent No.: US 11,196,443 B2
(45) Date of Patent: Dec. 7, 2021

(54) DATA COMPRESSOR, DATA DECOMPRESSOR, AND DATA COMPRESSION/DECOMPRESSION SYSTEM

(71) Applicant: UNIVERSITY OF TSUKUBA, Ibaraki (JP)

(72) Inventors: Shinichi Yamagiwa, Ibaraki (JP); Koichi Marumo, Ibaraki (JP); Ryuta Morita, Ibaraki (JP)

(73) Assignee: UNIVERSITY OF TSUKUBA, Ibaraki (JP)

(*) Notice: Subject to any disclaimer, the term of this patent is extended or adjusted under 35 U.S.C. 154(b) by 0 days.

(21) Appl. No.: 17/270,601

(22) PCT Filed: Aug. 22, 2019

(86) PCT No.: PCT/JP2019/032877
§ 371 (c)(1),
(2) Date: Feb. 23, 2021

(87) PCT Pub. No.: WO2020/045238
PCT Pub. Date: Mar. 5, 2020

(65) Prior Publication Data
US 2021/0258020 A1 Aug. 19, 2021

(30) Foreign Application Priority Data
Aug. 31, 2018 (JP) .............................. JP2018-163608

(51) Int. Cl.
*H03M 7/00* (2006.01)
*H03M 7/30* (2006.01)

(52) U.S. Cl.
CPC ....... *H03M 7/3064* (2013.01); *H03M 7/3066* (2013.01); *H03M 7/6005* (2013.01); *H03M 7/6011* (2013.01)

(58) Field of Classification Search
CPC ............ H03M 7/3064; H03M 7/3066; H03M 7/6005; H03M 7/6011; H03M 7/42; H03M 5/00; H03M 7/00
(Continued)

(56) References Cited

U.S. PATENT DOCUMENTS 5,674,382 A * 10/1997 Chapman ............... C02F 11/08
137/93
6,834,283 B1 12/2004 Satoh
(Continued)

FOREIGN PATENT DOCUMENTS

JP 2000-201080 A 7/2000
JP 2014-236449 A 12/2014
(Continued)

OTHER PUBLICATIONS

Marumo et al., "Time-sharing Multithreading on Stream-based Lossless Data Compression", 2017 Fifth International Symposium on Computing and Networking (CANDAR), Nov. 19, 2017, pp. 305-310.
(Continued)

*Primary Examiner* — Jean B Jeanglaude
(74) *Attorney, Agent, or Firm* — Marshall, Gerstein & Borun LLP

(57) ABSTRACT

A technique to prevent a retrieving process of a conversion rule from taking a longer time is provided. Provided are a conversion table in which a predetermined number of entry regions capable of storing a mapping between first data and second data smaller in size than the first data are included, the predetermined number of entry regions are divided into a plurality of bank regions, and each of the plurality of bank regions includes entry regions smaller in number than the predetermined number, a determination unit configured to uniquely determine, among the plurality of bank regions, a bank region corresponding to the first data, and a processing unit configured to search entry regions of the determined bank region the predetermined number of times each or a smaller number of times than the predetermined number each, output, when the second data corresponding to the first data is stored, the second data, and when the second data corresponding to the first data is not stored, register the (Continued)

second data corresponding to the first data in an entry region in which another piece of second data is not stored and output the first data.

9 Claims, 52 Drawing Sheets

(58) Field of Classification Search
USPC .................................................... 341/50, 51
See application file for complete search history.

(56) References Cited

U.S. PATENT DOCUMENTS

| | | | | |
|---|---|---|---|---|
| 8,902,087 | B1* | 12/2014 | Kozin | H03M 7/3088 |
| | | | | 341/51 |
| 9,647,682 | B1* | 5/2017 | Heng | H03M 7/3088 |
| 2010/0106692 | A1* | 4/2010 | Moloney | H03M 7/3066 |
| | | | | 707/693 |
| 2018/0054215 | A1 | 2/2018 | Yamagiwa et al. | |
| 2018/0115322 | A1 | 4/2018 | Fukui | |
| 2019/0207625 | A1* | 7/2019 | Kataoka | G06F 40/242 |

FOREIGN PATENT DOCUMENTS

| | | |
|---|---|---|
| JP | 2016-184830 A | 10/2016 |
| WO | WO-2016/140071 A1 | 9/2016 |

OTHER PUBLICATIONS

Search Report in International Application No. PCT/JP2019/032877 dated Oct. 15, 2019, 2 pages.

* cited by examiner

FIG. 4

| UNCOMPRESSED SYMBOL SEQUENCE | | COMPRESSED SYMBOL | REFERENCE FREQUENCY | RETRIEVAL DIRECTION |
|---|---|---|---|---|
| SYMBOL 0 | SYMBOL 1 | | | |
| A | A | 0 | 1 | |
| B | B | 1 | 1 | |
| C | C | 2 | 2 | |
| D | D | 3 | 1 | ↓ |

| INPUT SYMBOL | CORRESPONDING BANK REGION |
|---|---|
| AA | BANK REGION 1 |
| AB | BANK REGION 1 |
| AC | BANK REGION 1 |
| AD | BANK REGION 2 |
| AE | BANK REGION 2 |
| BA | BANK REGION 3 |
| BB | BANK REGION 3 |
| BC | BANK REGION 3 |
| BD | BANK REGION 4 |
| BE | BANK REGION 4 |

FIG. 7

INPUT DATA: AABBAAABADACBB

| UNCOMPRESSED SYMBOL SEQUENCE | | COMPRESSED SYMBOL | REFERENCE FREQUENCY | |
|---|---|---|---|---|
| SYMBOL 0 | SYMBOL 1 | | | |
|  |  |  |  | } BANK REGION 1 |
|  |  |  |  |  |
|  |  |  |  | } BANK REGION 2 |
|  |  |  |  |  |
|  |  |  |  | } BANK REGION 3 |
|  |  |  |  |  |
|  |  |  |  | } BANK REGION 4 |
|  |  |  |  |  |

OUTPUT DATA:

FIG. 9

| INPUT DATA: AABBAAABADACBB | | | |
|---|---|---|---|

| UNCOMPRESSED SYMBOL SEQUENCE | | COMPRESSED SYMBOL | REFERENCE FREQUENCY | |
|---|---|---|---|---|
| SYMBOL 0 | SYMBOL 1 | | | |
| A | A | 0 | 2 | BANK REGION 1 |
| A | B | 1 | 1 | |
| A | D | 2 | 1 | BANK REGION 2 |
| | | | | |
| B | B | 4 | 1 | BANK REGION 3 |
| | | | | |
| | | | | BANK REGION 4 |
| | | | | |

| OUTPUT DATA: AABB0ABADAC |
|---|

FIG. 10

INPUT DATA: AABBAAABADACBB

| UNCOMPRESSED SYMBOL SEQUENCE | | COMPRESSED SYMBOL | REFERENCE FREQUENCY | |
|---|---|---|---|---|
| SYMBOL 0 | SYMBOL 1 | | | |
| A | A | 0 | 1 | BANK REGION 1 |
| A | C | 1 | 1 | |
| A | D | 2 | 1 | BANK REGION 2 |
| | | | | |
| B | B | 4 | 1 | BANK REGION 3 |
| | | | | |
| | | | | BANK REGION 4 |
| | | | | |

OUTPUT DATA: AABB0ABADAC

FIG. 11

INPUT DATA: AABBAAABADAC<u>BB</u>

| UNCOMPRESSED SYMBOL SEQUENCE | | COMPRESSED SYMBOL | REFERENCE FREQUENCY | |
|---|---|---|---|---|
| SYMBOL 0 | SYMBOL 1 | | | |
| A | A | 0 | 1 | BANK REGION 1 |
| A | C | 1 | 1 | |
| A | D | 2 | 1 | BANK REGION 2 |
| | | | | |
| B | B | 4 | <u>2</u> | BANK REGION 3 |
| | | | | |
| | | | | BANK REGION 4 |
| | | | | |

OUTPUT DATA: AABB0ABADAC<u>4</u>

FIG. 15

| INPUT SYMBOL | CORRESPONDING BANK |
|---|---|
| AA | DECOMPRESSION BANK REGION 1 |
| AB | DECOMPRESSION BANK REGION 1 |
| AC | DECOMPRESSION BANK REGION 1 |
| AD | DECOMPRESSION BANK REGION 2 |
| AE | DECOMPRESSION BANK REGION 2 |
| BA | DECOMPRESSION BANK REGION 3 |
| BB | DECOMPRESSION BANK REGION 3 |
| BC | DECOMPRESSION BANK REGION 3 |
| BD | DECOMPRESSION BANK REGION 4 |
| BE | DECOMPRESSION BANK REGION 4 |
| 0 | DECOMPRESSION BANK REGION 1 |
| 1 | DECOMPRESSION BANK REGION 1 |
| 2 | DECOMPRESSION BANK REGION 2 |
| 3 | DECOMPRESSION BANK REGION 2 |
| 4 | DECOMPRESSION BANK REGION 3 |
| 5 | DECOMPRESSION BANK REGION 3 |
| 6 | DECOMPRESSION BANK REGION 4 |
| 7 | DECOMPRESSION BANK REGION 4 |

FIG. 17

INPUT DATA: AABB0ABADAC4

| DECODED SYMBOL SEQUENCE | | COMPRESSED SYMBOL | REFERENCE FREQUENCY | |
|---|---|---|---|---|
| SYMBOL 0 | SYMBOL 1 | | | |
|  |  |  |  | } BANK REGION 1 |
|  |  |  |  | |
|  |  |  |  | } BANK REGION 2 |
|  |  |  |  | |
|  |  |  |  | } BANK REGION 3 |
|  |  |  |  | |
|  |  |  |  | } BANK REGION 4 |
|  |  |  |  | |

OUTPUT DATA:

FIG. 19

INPUT DATA: AABB0ABADAC4

| DECODED SYMBOL SEQUENCE | | COMPRESSED SYMBOL | REFERENCE FREQUENCY | |
|---|---|---|---|---|
| SYMBOL 0 | SYMBOL 1 | | | |
| A | A | 0 | 1 | BANK REGION 1 |
| A | C | 1 | 1 | |
| A | D | 2 | 1 | BANK REGION 2 |
| | | | | |
| B | B | 4 | 2 | BANK REGION 3 |
| | | | | |
| | | | | BANK REGION 4 |
| | | | | |

OUTPUT DATA: AABBAAABADACBB

FIG. 26

| BANK REGION | NUMBER OF RETRIEVALS | NUMBER OF HITS |
|---|---|---|
| BANK REGION 1 | 5 | 2 |
| BANK REGION 2 | 4 | 1 |
| BANK REGION 3 | 0 | 0 |
| BANK REGION 4 | 3 | 3 |

| DIVISION/INTEGRATION THRESHOLD | STATUS |
|---|---|
| 1.0 | DIVISION |

FIG. 33
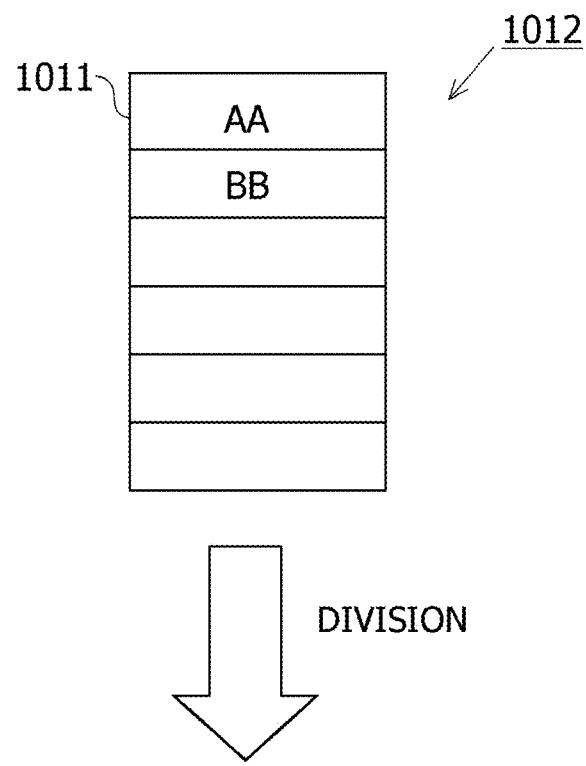
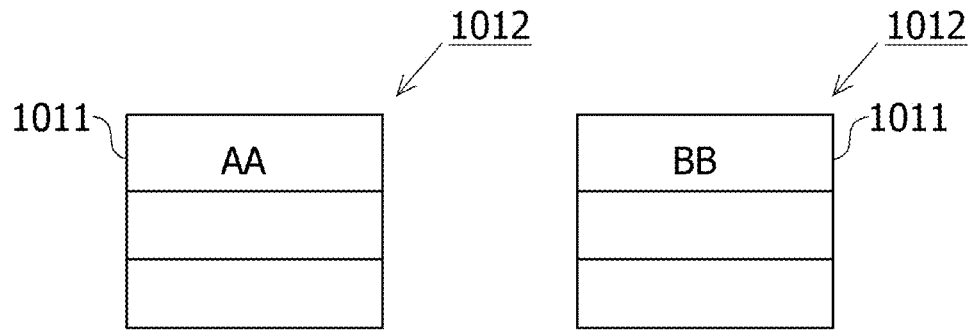

FIG. 34
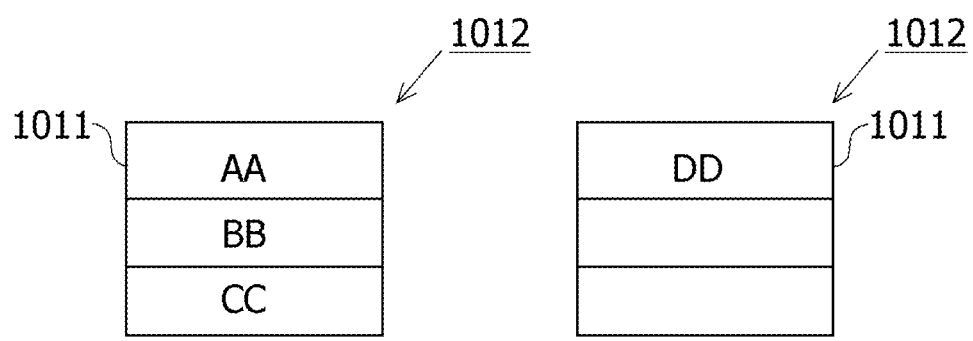
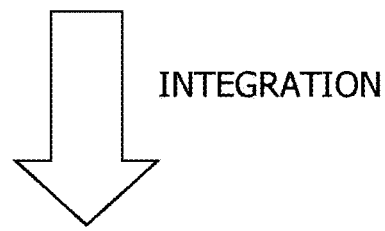
INTEGRATION
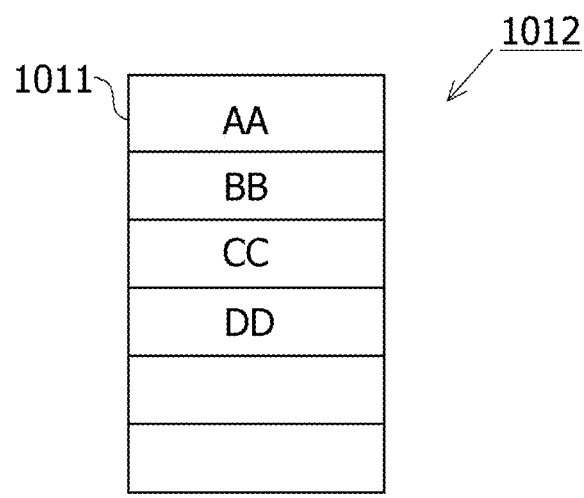

FIG. 38
(a)
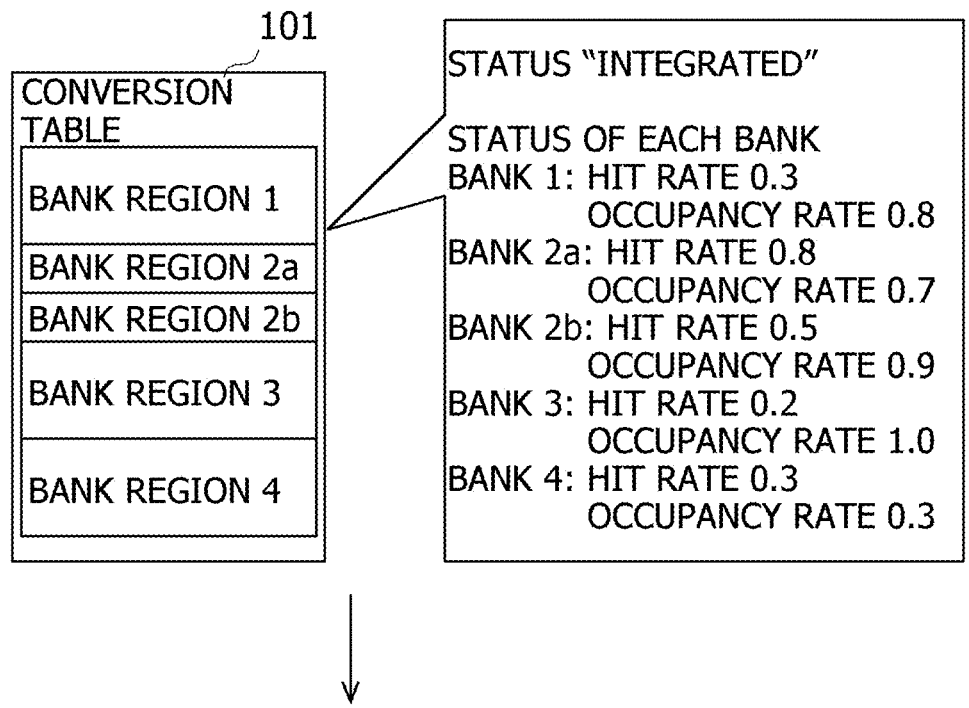
(b)
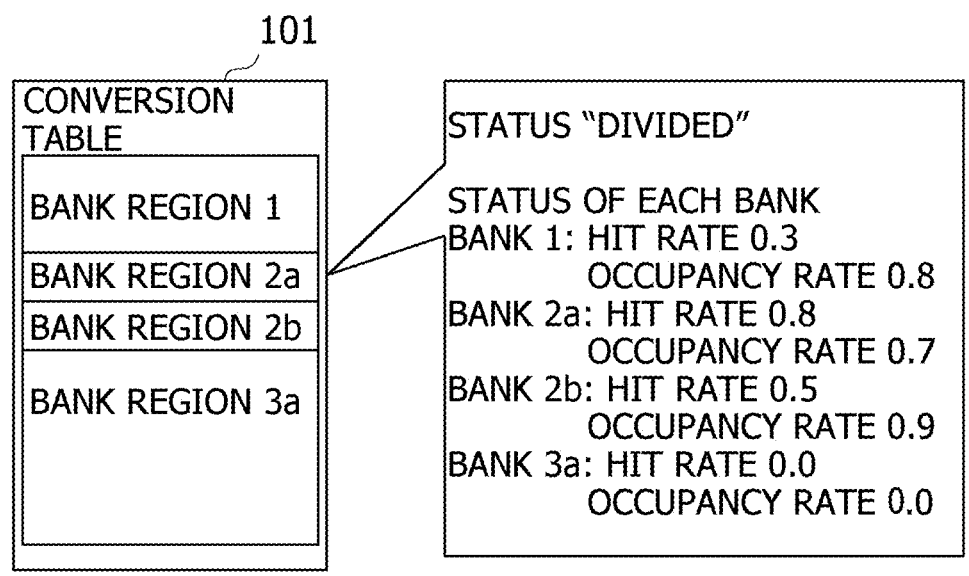

FIG. 46

| INPUT SIGNAL SEQUENCE | OUTPUT VALUE |
|---|---|
| 0001 | 00 |
| 0010 | 01 |
| 0100 | 10 |
| 1000 | 11 |

FIG. 48

| INPUT SIGNAL SEQUENCE | OUTPUT VALUE |
|---|---|
| 00000001 | 000 |
| 00000010 | 001 |
| 00000100 | 010 |
| 00001000 | 011 |
| 00010000 | 100 |
| 00100000 | 101 |
| 01000000 | 110 |
| 10000000 | 111 |

FIG. 52

| SELECTION SIGNAL FROM DETERMINATION UNIT | COMPRESSED SYMBOL | BINARY NUMBER | INDEX |
|---|---|---|---|
| 0 | 0 | 000 | 0 |
| 0 | 1 | 001 | 1 |
| 0 | 2 | 010 | 2 |
| 0 | 3 | 011 | 3 |
| 1 | 0 | 100 | 4 |
| 1 | 1 | 101 | 5 |
| 1 | 2 | 110 | 6 |
| 1 | 3 | 111 | 7 |

DATA COMPRESSOR, DATA DECOMPRESSOR, AND DATA COMPRESSION/DECOMPRESSION SYSTEM

CROSS-REFERENCE TO RELATED APPLICATIONS

The present application claims priority under 35 U.S.C. § 119 to Japanese Patent Application No. 2016-163608, filed Aug. 31, 2018. The contents of this application are incorporated herein by reference in their entirety.

TECHNICAL FIELD

The present invention relates to a data compressor, a data compression method, a data compression program, a data decompressor, a data decompression method, a data decompression program, and a data compression/decompression system.

BACKGROUND ART

In recent years, technologies have been proposed that allow a transmitter to compress stream data when the stream data is transmitted between the transmitter and a receiver. For example, a data compressor has been proposed that includes a conversion unit that converts two or more consecutive symbols to one symbol if the two or more consecutive symbols are input as input data and a conversion rule for converting the input data to one symbol is registered in a dictionary, and an output unit that outputs one symbol if the conversion unit converts the two or more consecutive symbols to one symbol, and if not, outputs two or more symbols has been proposed (e.g., Patent document 1).

CITATION LIST

Patent Documents

[Patent document 1] Japanese Patent Laid-Open 2014-236449
[Patent document 2] Japanese Patent Laid-Open 2016-184830

SUMMARY OF INVENTION

Problems to be Solved by the Invention

The conversion to one symbol described above, that is, compression, is performed if the input data is registered in a dictionary. If a process of retrieving data corresponding to the input data from the dictionary is implemented by hardware, the retrieval time can be shortened by performing parallel matching of the input data with a plurality of individual entry regions registered in the dictionary. In contrast, if the above-described retrieving process is implemented by software, the matching of the input data with the plurality of entry regions registered in the dictionary is a sequential process in which the entry regions are searched one by one. In such a process, the retrieving process may become a bottleneck and a delay occurs, and there is a possibility where the transmission of the stream data is not performed properly. Although the implementation by hardware circuit makes it possible to search entry regions together, the circuit configuration becomes complicated if the number of entry regions increases, which makes it difficult to accelerate a compression process.

One aspect of the technique of the disclosure is intended to provide a technique to prevent a process of retrieving a conversion rule from taking a longer time.

Means for Solving the Problems

One aspect of the disclosed technique is exemplified by a data compressor as follows. The present data compressor is a data compressor configured to compress a first data sequence including a plurality of pieces of first data to a second data sequence smaller in size than a size of the first data sequence, the data compressor including a conversion table in which a predetermined number of entry regions capable of storing a mapping between the first data and second data smaller in size than the first data are included, the predetermined number of entry regions are divided into a plurality of bank regions, and each of the plurality of bank regions includes entry regions smaller in number than the predetermined number, a determination unit configured to uniquely determine, among the plurality of bank regions, a bank region corresponding to a value of each of the plurality of pieces of first data, and a processing unit configured to search, for each of the plurality of pieces of first data, entry regions of the corresponding bank region determined by the determination unit the predetermined number of times each or a smaller number of times than the predetermined number each, output, when the second data corresponding to the first data is stored, the stored second data, and acquire, when the second data corresponding to the first data is not stored, the second data corresponding to the first data to register the acquired second data in an entry region in which another piece of second data is not stored and output the first data.

Effects of the Invention

According to the technique of the disclosure, it is possible to prevent a process of retrieving a conversion rule from taking a longer time.

BRIEF DESCRIPTION OF THE DRAWINGS

FIG. 4 is a diagram illustrating an example of a bank region.
FIG. 5 is a diagram schematically illustrating an association of input symbols and bank regions based on a hash function of the data compressor.
FIG. 7 is a first diagram for describing a specific example in which records are to be added to a conversion table.
FIG. 9 is a third diagram for describing a specific example in which records are added to the conversion table.
FIG. 10 is a fourth diagram for describing a specific example in which records are added to the conversion table.
FIG. 11 is a diagram illustrating an example of a conversion table when compression of stream data is completed.

FIG. 15 is a diagram schematically illustrating an association of input symbols and decompression bank regions based on a hash function of the data decompressor.

FIG. 17 is a first diagram for describing generation and updating of a conversion table.

FIG. 19 is a third diagram for describing generation and updating of the conversion table.

FIG. 26 is a diagram illustrating an example of a hit status record table.

FIG. 30 is a diagram in which compression rates of the data compressor according to the second embodiment are verified while changing a threshold of hit rate and a threshold of the number of occupancies.

FIG. 32 is a diagram illustrating an example of a status management table according to the third embodiment.

FIG. 33 is a diagram schematically illustrating division of a bank region according to the third embodiment.

FIG. 34 is a diagram schematically illustrating integration of bank regions according to the third embodiment.

FIG. 38 is a second diagram schematically illustrating division and integration of bank regions according to the third embodiment.

FIG. 46 is a diagram illustrating an example of a correspondence between input signal sequences input from a matching circuit and output values output by a match encoder in the fourth embodiment.

FIG. 48 is a diagram illustrating an example of a correspondence between input signal sequences input from a matching circuit and output values output by a match encoder in the comparative example.

FIG. 52 is a diagram illustrating an example of a correspondence between selection signals from a determination unit, compressed symbols, and indexes in the second modified example.

MODE FOR CARRYING OUT THE INVENTION

Figure 1:
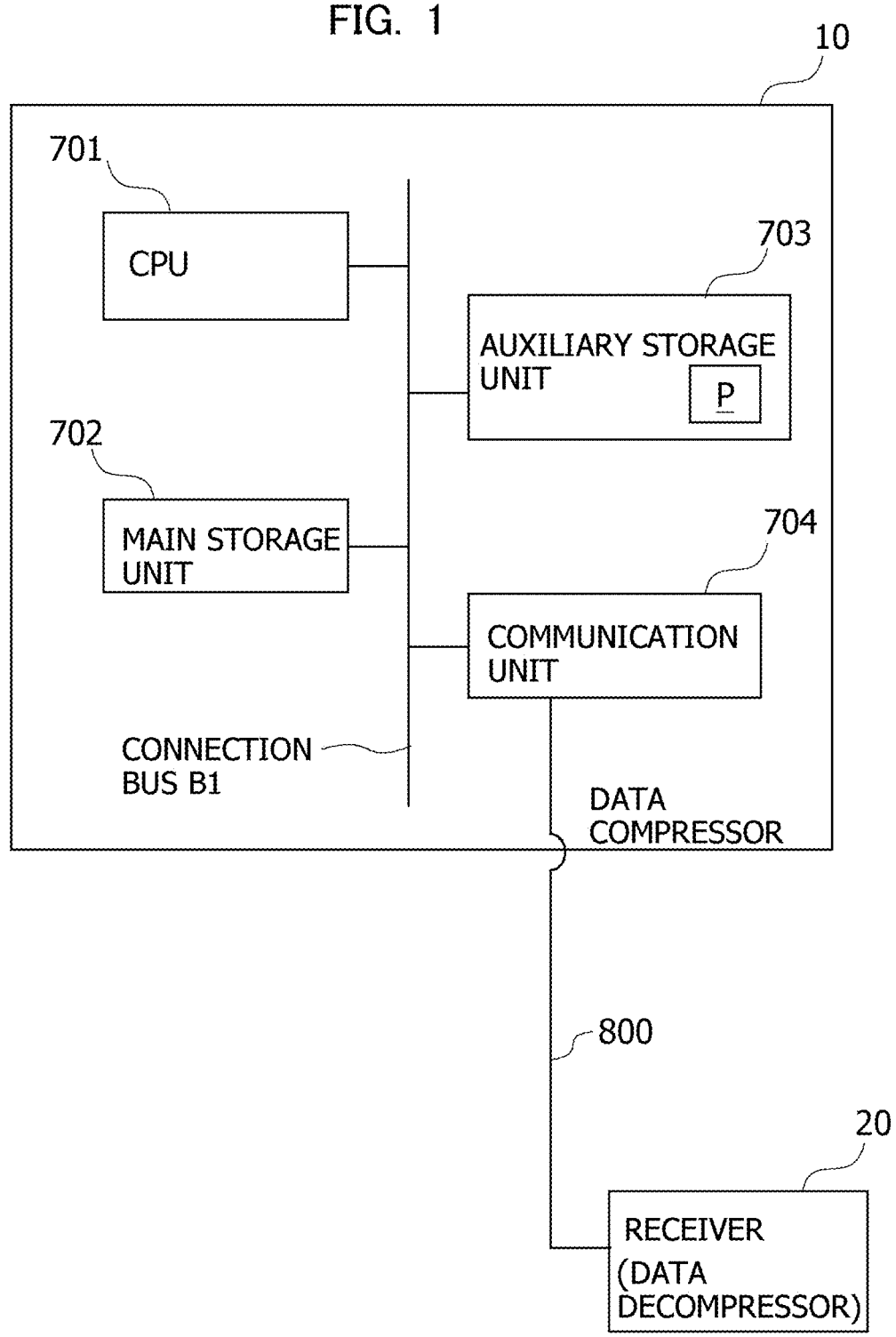
FIG. 1 is a diagram illustrating a configuration of a data compressor and a receiver according to a first embodiment.

A data compressor according to the technique of the disclosure has, for example, the following configuration.

A data compressor configured to compress a first data sequence including a plurality of pieces of first data to a second data sequence in a size smaller than a size of the first data sequence, and include a conversion table in which a predetermined number of entry regions capable of storing a mapping between the first data and second data in a size smaller than the first data are provided, the predetermined number of entry regions being divided into a plurality of bank regions, and each of the plurality of bank regions being formed by a smaller number of consecutive entry regions than the predetermined number, a determination unit configured to uniquely determine a bank region corresponding to each value of the plurality of pieces of first data from among the plurality of bank regions, and a processing unit configured to retrieve, for each of the plurality of pieces of first data, the consecutive entry regions forming a corresponding bank region determined by the determination unit by the predetermined number or a number smaller than the predetermined number, to output the second data when the second data corresponding to the first data is stored, and to acquire the second data corresponding to the first data, to register the acquired second data in an entry region in which other second data is not stored, and to output the first data when the second data corresponding to the first data is not stored.

In the data compressor according to the technique of the disclosure, the first data is a predetermined number of consecutive symbols among symbols included in the first data sequence. The second data is smaller in size than the first data. In other words, the number of symbols included in the first data may be greater than the number of symbols included in the second data. The plurality of bank regions may be formed by collecting a plurality of storage devices, and may be formed by logically dividing addresses of one storage device. The consecutive entry regions may have consecutive physical addresses for each of the entry regions, or consecutive logical addresses.

The process of the uniquely determining refers to determining the same bank region if the same data is input and does not exclude determining the same bank region for different data. The process of the uniquely determining may be that, for example, using a hash function, a hash value and a bank region for the first data (or some data included in the first data) are associated with each other, and the same bank region is determined for the first data having the same value. Further, if the same bank region is determined for the first data having the same value, a means other than a hash function may be used.

The searching of the entry regions by the predetermined number or a number smaller than the predetermined number includes searching each entry region in a determined bank one by one to retrieve an entry region in which the second data corresponding to the first data is stored. There is no limitation to an order in which entry regions are searched, and entry regions may be searched from the first entry region of a bank to the last entry region, or from the last entry region of a bank to the first entry region. In addition, the input data may be associated with the entry regions and then an entry region may be searched based on the association. A hash function may be used to associate the input data with the entry regions.

In the data compressor described above, a conversion table having a predetermined number of entry regions is divided into a plurality of bank regions formed by a smaller number of consecutive entry regions than the predetermined number. The data compressor uniquely determines a bank region corresponding to a value of each of the plurality of pieces of first data from among the plurality of bank regions, and searches entry regions within the determined bank region by a predetermined number or a smaller number than the predetermined number to perform a compression process on the first data. Thus, according to such a data compressor, a range for the search can be narrowed compared to the entire conversion table, and a process of retrieving a conversion rule registered in the conversion table can be prevented from taking a longer time.

The techniques of the disclosure can also be further understood from the aspects of a data decompressor that decompresses data compressed using a data compression method, a data compression program, and the above-described data compressor, a data decompression method, a data decompression program, and a data compression/decompression system including the data compressor and the data decompressor.

Embodiments of the data compressor, the data compression method, the data compression program, the data decompressor, the data decompression method, the data decompression program, and the data compression/decompression system will be described below with reference to the drawings. The data compressor according to the embodiments performs a compression process on data (e.g., stream data) to be transmitted to a receiver and transmits the compressed data to the receiver via a transmission line. Configurations of the embodiments described below are mere examples, and the technique of the disclosure is not limited to the configurations of the embodiments.

First Embodiment

FIG. 1 is a diagram illustrating a configuration of a data compressor and a receiver according to a first embodiment. The data compressor 10 and the receiver 20 are communicably connected via a transmission line 800. The data compressor 10 illustrated in FIG. 1 is an information processing device including a central processing unit (CPU) 701, a main storage unit 702, an auxiliary storage unit 703, a communication unit 704, and a connection bus B1. The CPU 701, the main storage unit 702, the auxiliary storage unit 703, and the communication unit 704 are connected to each other by the connection bus B1.

The CPU 701 is also referred to as a microprocessor unit (MPU) or a processor. The CPU 701 is not limited to a single processor, but may have a multi-processor configuration. In addition, a single CPU 701 connected with a single socket may have a multi-core configuration. At least some of processing operations performed by the CPU 701 may be performed by a processor other than the CPU 701, for example, a dedicated processor such as a digital signal processor (DSP), a graphics processing unit (GPU), a numeric data processor, a vector processor, or an image processing processor. In addition, at least some of the processing operations performed by the CPU 701 may be executed by an integrated circuit (IC) or other digital circuits. In addition, at least a portion of the CPU 701 may include an analog circuit. The integrated circuit includes a large-scale integrated circuit (LSI), an application-specific integrated circuit (ASIC), and a programmable logic device (PLD). The PLD includes, for example, a field-programmable gate array (FPGA). The CPU 701 may be a combination of a processor and an integrated circuit. The combination is referred to as, for example, a microcontroller unit (MCU), a system-on-a-chip (SoC), a system LSI, a chipset, or the like. In the information processing device 700, the CPU 701 loads a program stored in the auxiliary storage unit 703 into the work area of the main storage unit 702 to control peripheral devices through the execution of the program. This allows the information processing device 700 to execute processing that meets a predetermined purpose. The main storage unit 702 and the auxiliary storage unit 703 are recording media from which the information processing device 700 can read data.

The main storage unit 702 is exemplified as a storage unit accessed directly from the CPU 701. The main storage unit 702 includes a random access memory (RAM) and a read only memory (ROM).

The auxiliary storage unit 703 holds various types of programs and data in the recording medium in a readable and writable form. The auxiliary storage unit 703 also holds a data compression program P according to the first embodiment. The auxiliary storage unit 703 is also referred to as an external storage device. The auxiliary storage unit 703 holds an operating system (OS), various programs, various tables, and the like. The OS includes a communication interface program on which data is exchanged with an external device or the like connected via the communication unit 704. The external device or the like includes, for example, other information processing devices and external storage devices connected on a computer network or the like.

The auxiliary storage unit 703 is, for example, an erasable programmable ROM (EPROM), a solid state drive (SSD), a hard disk drive (HDD), or the like. In addition, the auxiliary storage unit 703 is, for example, a compact disc (CD) drive device, a digital versatile disc (DVD) drive device, a Blu-ray (a registered trademark) Disc (BD) drive device, or the like.

The communication unit 704 is, for example, an interface with the transmission line 800. The communication unit 704 communicates with the receiver 20 via the transmission line 800.

The receiver 20 is an information processing device having a hardware configuration similar to the data compressor 10 described above.

Figure 2:
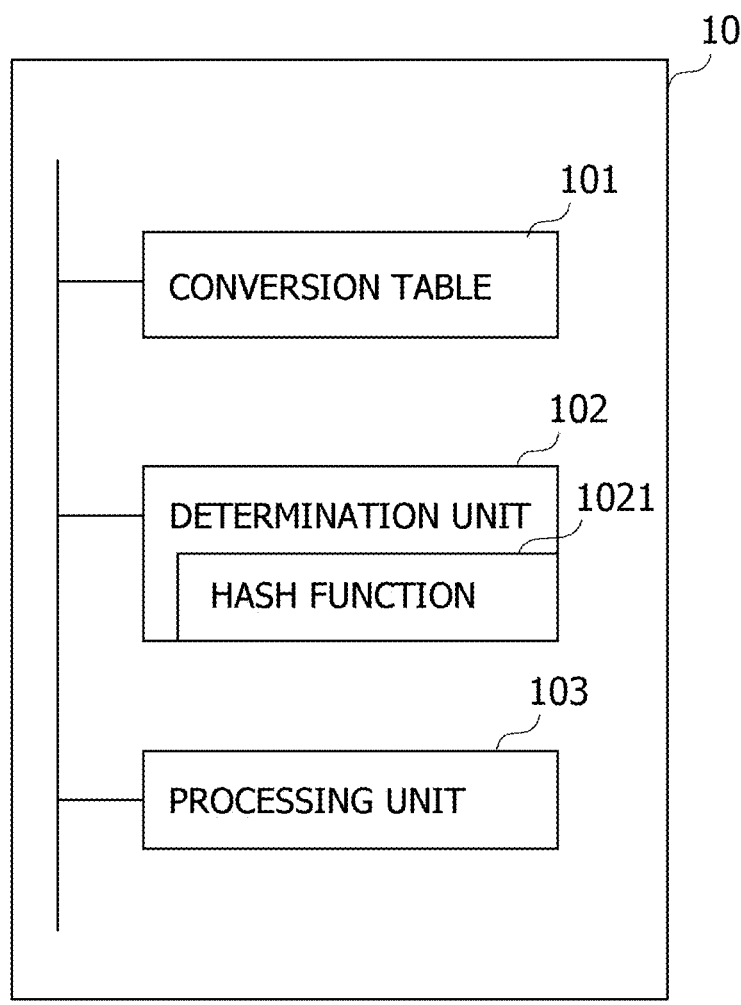
FIG. 2 is a diagram illustrating an example of logical blocks of the data compressor according to the first embodiment.

FIG. 2 is a diagram illustrating an example of logical blocks of the data compressor according to the first embodiment. As described above, the data compressor 10 performs a compression process on stream data (lossless compression process or lossy compression process) and outputs stream data including at least a compressed portion. Further, the stream data may be text data or binary data. In addition, the data compressor 10 treats the stream data as a sequence of symbols that are fixed-length processing units. A size of one symbol can be arbitrarily determined, and if the stream data is text data, for example, the size can be two characters.

The data compressor 10 includes a conversion table 101, a determination unit 102, and a processing unit 103. In the data compressor 10, the CPU 701 loads the data compression program P stored in the auxiliary storage unit 703 into the main storage unit 702 and executes the data compression program P to implement the conversion table 101, the determination unit 102, and the processing unit 103.

Figure 3:
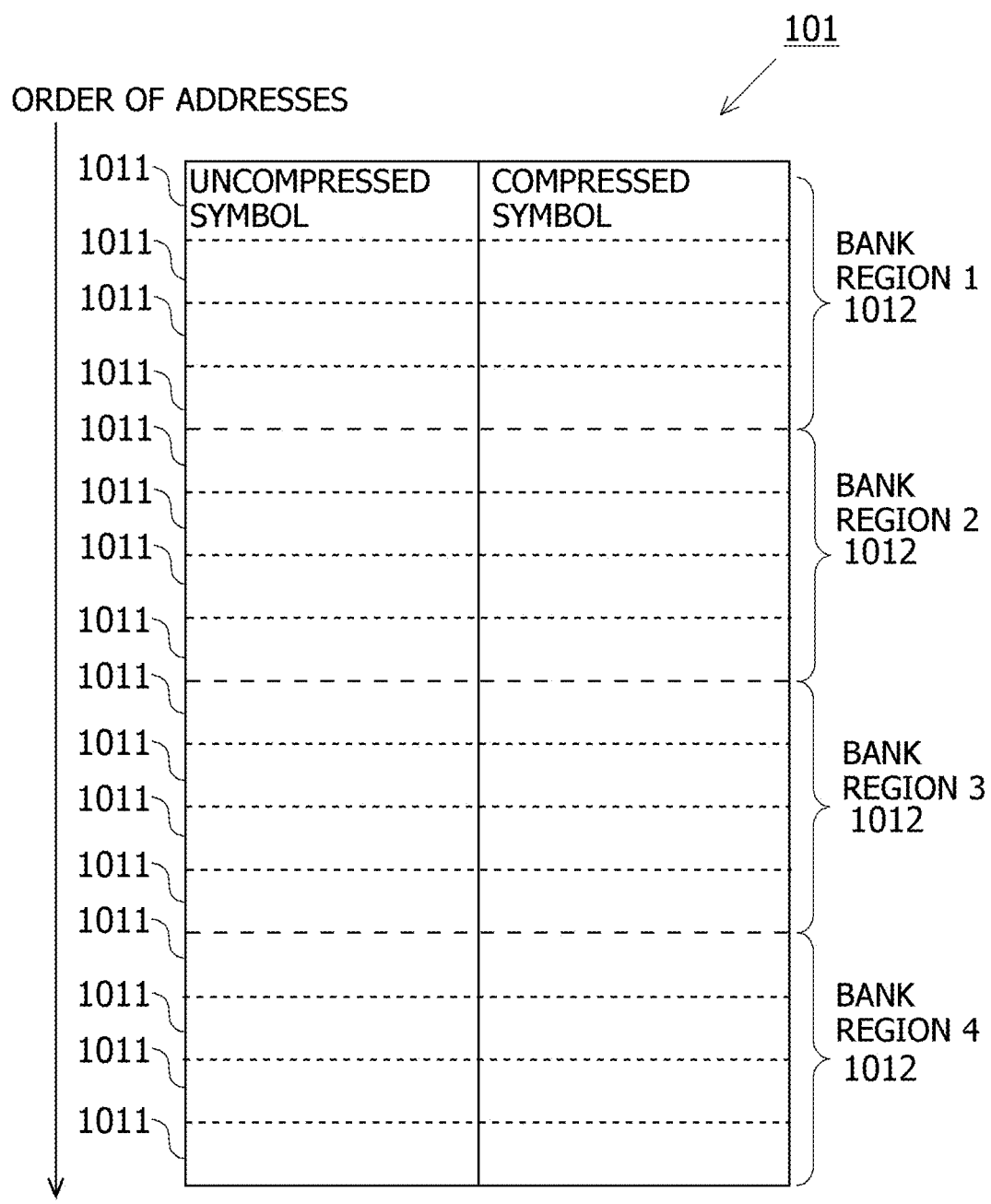
FIG. 3 is a diagram illustrating an example of a conversion table according to the first embodiment.

The conversion table 101 has a plurality of entry regions in which a mapping between uncompressed data and compressed data can be stored. The conversion table 101 is stored in the auxiliary storage unit 703, for example. FIG. 3 is a diagram illustrating an example of the conversion table according to the first embodiment. The conversion table 101 illustrated in FIG. 3 has 16 entry regions 1011 in which a mapping between uncompressed data and compressed data having a smaller data size than the uncompressed data can be stored. The entry regions 1011 are allocated consecutively in order according to logical addresses or physical addresses (hereinafter referred to as "addresses" if the logical addresses and physical addresses are not specifically distinguished). The 16 entry regions 1011 in the conversion table 101 are divided into four bank regions 1012. Each of the bank regions 1012 has four entry regions 1011. Hereinafter, in a case that the bank regions 1012 are distinguished from each other in the present specification, the bank regions will also be referred to as a bank region 1, a bank region 2, a bank region 3, and a bank region 4 in order of addresses.

FIG. 4 is a diagram illustrating an example of a bank region. The bank region is a table in which two symbols to be converted "symbol sequence to be compressed" (i.e., an unconverted symbol sequence), one symbol converted through a compression process "compressed symbol" (i.e., a converted symbol), and "reference frequency" representing the number of accesses to the compressed symbols are associated for each entry region 1011 to be managed. Information registered in the entry region 1011 is also referred to as a record. Further, the two symbols included in the input symbol sequence will be referred to as "symbol 0" and "symbol 1" for convenience. In the first embodiment, although a record of the entry region 1011 is dynamically added and deleted, some record may be registered in the entry region 1011 in advance at the beginning of a process. In the first embodiment, one alphabet indicated in FIG. 4 is assumed to represent one symbol.

Upon input of stream data to be compressed into the data compressor 10, the determination unit 102 determines a bank region 1012 to be used for a compression process of consecutive symbol sequences (e.g., two-character symbols, also referred to as a "symbol pair") included in the input stream data. For the determination of the bank region 1012, the determination unit 102 uses a hash function 1021. The hash function 1021 has a calculation result associated with any one of the bank regions and outputs a calculation result uniquely determined from the same input value. The determination unit 102 performs calculation using the hash function 1021 on data of a part of an input symbol pair to acquire the calculation result and determines the bank region 1012 corresponding to the acquired calculation result as a bank region 1012 to be used in the compression process for the symbol pair. Further, data of a part of a symbol pair refers to, for example, the lower two bits of the symbol pair.

The processing unit 103 uses the bank region 1012 determined by the determination unit 102 to perform the compression process for the symbol pair. The processing unit 103 searches each of the entry regions 1011 of the bank region 1012 one by one, and in a case that a record indicating a symbol pair as uncompressed data is registered in any entry region 1011 of the determined bank region 1012, that is, in a case that a compressed symbol corresponding to the symbol pair is registered, converts the symbol pair into a compressed symbol, and output the symbol. In addition, in a case that a record indicating a symbol pair as uncompressed data has not been registered in any entry region 1011 of the determined bank region 1012, that is, in a case that no compressed symbol corresponding to the symbol pair is registered, as a result of the retrieval, the symbol pair is output as it is without being compressed, and a record indicating the symbol pair as an uncompressed symbol is registered in an entry region 1011 continuous with the entry region 1011 in which the record is registered.

Furthermore, the processing unit 103 adds and deletes a record registered in the entry region 1011 with respect to the bank region 1012 in accordance with the appearance frequency of the symbols included in the stream data.

[Hash Function of Data Compressor]

FIG. 5 is a diagram schematically illustrating an association of input symbols and bank regions based on a hash function of the data compressor. The hash function 1021 associates the input symbol with the bank regions as illustrated in FIG. 3. In the hash function 1021 schematically illustrated in FIG. 5, for example, the symbol "AA" is associated with the "bank region 1".

[Compression Process]

Figure 6:
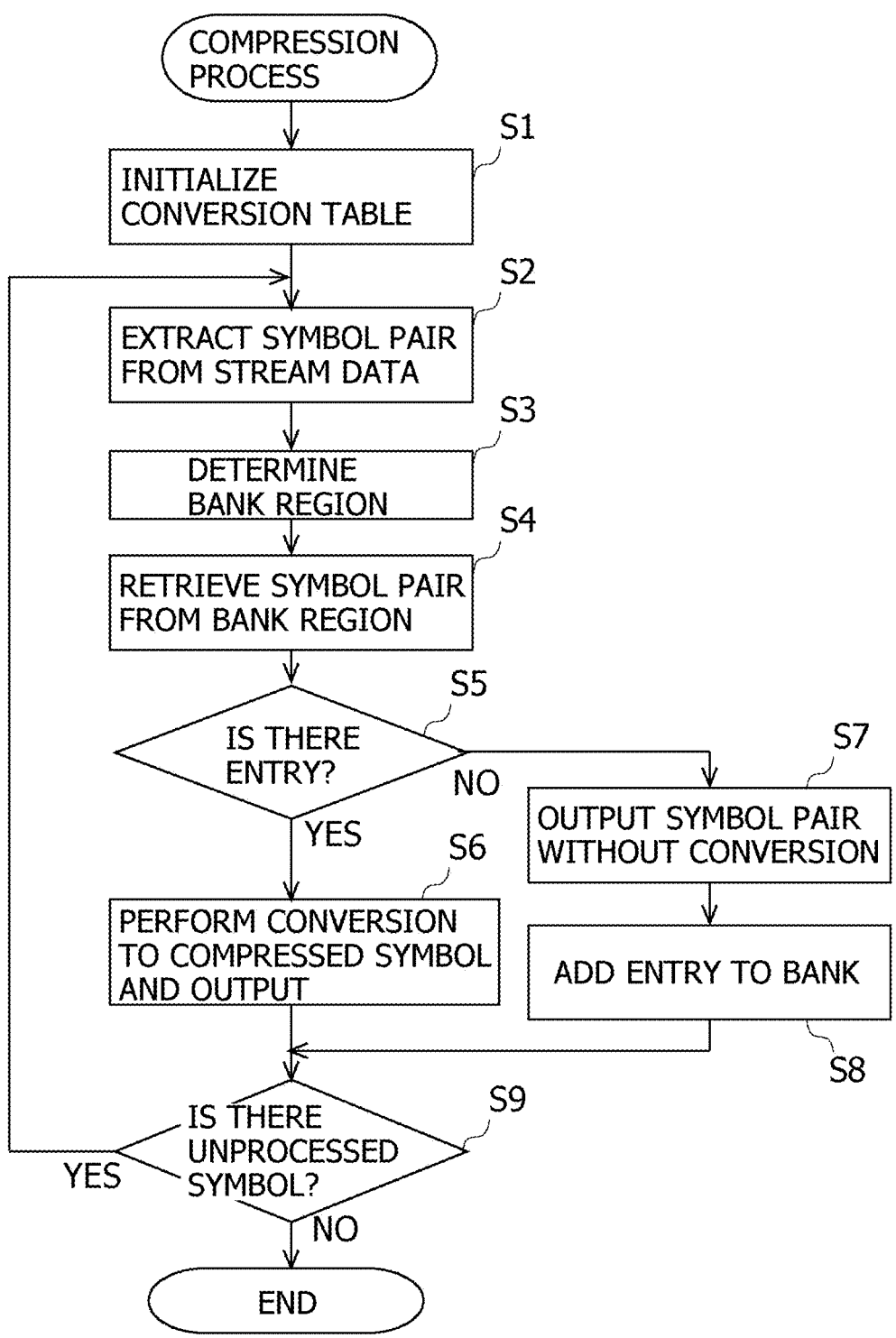
FIG. 6 is a process flow diagram schematically illustrating a compression processing step performed by the data compressor according to the first embodiment.

FIG. 6 is a process flow diagram schematically illustrating a compression processing step performed by the data compressor according to the first embodiment. In step S1, the processing unit 103 of the data compressor 10 initializes entries of each bank region (a bank region 1 to a bank region 4) of the conversion table 101. In step S1, for example, all of the entries in each bank may be deleted or predetermined entries may be registered in advance.

In step S2, the determination unit 102 of the data compressor 10 extracts a symbol pair from stream data. In step S3, the determination unit 102 determines the bank region 1012 associated with the symbol pair extracted in step S2 using a hash function 1021. The process of step S3 is an example of a "determination step".

In step S4, the processing unit 103 of the data compressor 10 retrieves the bank region 1012 determined in step S2 for whether the symbol pair is registered as an uncompressed symbol sequence.

If the entry region 1011 in which the symbol pair is held as an uncompressed symbol sequence is registered in the bank region 1012 (YES in step S5), the processing unit 103 outputs the compressed symbol registered with the entry (step S6).

On the other hand, if the entry region 1011 in which the symbol pair is held as an uncompressed symbol sequence has not been registered in the bank region 1012 (NO in step S5), the processing unit 103 outputs the symbol pair extracted in step S2 in order (step S6). In addition, the processing unit 103 registers an entry in which the symbol pair is set as an uncompressed symbol sequence in the bank selected in step S3 (step S8). The processes from step S4 to step S8 are an example of a "processing step".

Then, if there is a subsequent symbol pair in the stream data (YES in step S9) after step S6 or S8, the process returns to step S2 to repeat the process. On the other hand, if there is no subsequent symbol pair in the stream data (NO in step S9), the compression process ends. Further, in a case that the end of the stream data has one symbol that does not constitute a symbol pair, the symbol is output as it is. Note that the flow described above is an example, and some processes may be performed in a switched order or performed in parallel. For example, the order of step S7 and step S8 may be reversed.

[Generation and Updating of Conversion Table]

Next, a specific example in which a record is added to the conversion table 101 will be described using the hash function 1021 schematically illustrating the mapping in FIG. 5 and FIGS. 7 to 11. FIGS. 7 to 11 are diagrams for describing generation and updating of the conversion table 101 In this example, it is assumed that stream data "AAB-BAAABADACBB" (referred to as "input data") is compressed by the data compressor 10 and the compressed data is transmitted. In addition, the data compressor 10 processes the input data by two symbols. In other words, the input data is processed in units of "AA", "BB", "AA", and so on.

Figure 8:
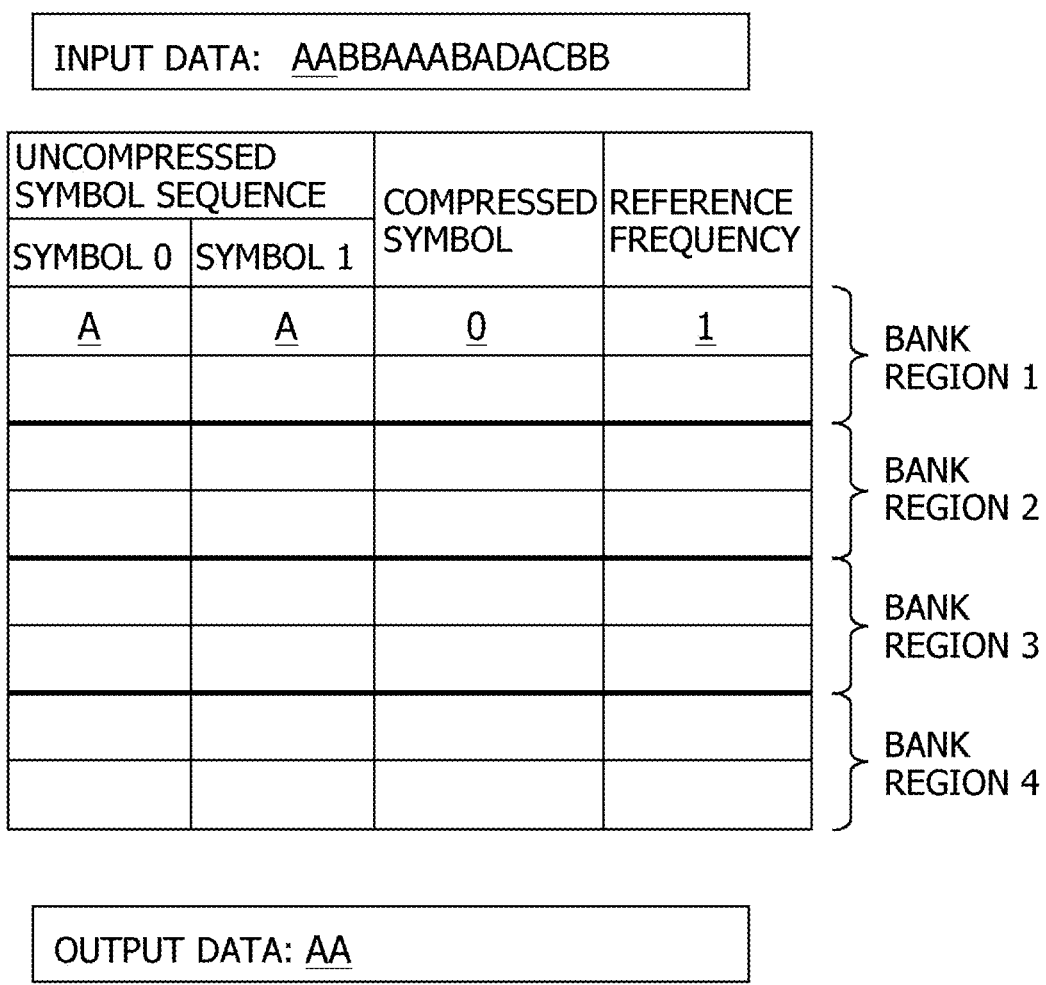
FIG. 8 is a second diagram for describing a specific example in which records are added to the conversion table.

First, it is assumed that records are not registered in any of the entries of the bank region 1 to the bank region 4 in the initial conversion table 101 before the process is started as illustrated in FIG. 7. In addition, it is assumed that the maximum number (amounts) of entries of each bank region 1012 in the conversion table 101 is 2. Then, when a first symbol pair "AA" of the input data is input as illustrated in FIG. 8, the determination unit 102 uses the hash function 1021 to determine the bank region as a bank region to be used for the compression process of the symbol pair "AA".

The processing unit 103 retrieves each entry region 1011 of the determined bank region 1 in order of addresses. In the determined bank region 1, there is no entry region 1011 in which "AA" is registered as a symbol sequence to be compressed (i.e., no hit on an entry of the bank region 1) as illustrated in FIG. 7. Thus, the processing unit 103 outputs the symbol pair "AA" without conversion. In addition, the processing unit 103 adds, to the bank region 1 of the conversion table 101, an entry in which the symbol pair "AA" is set for the symbol sequence to be compressed. Further, a value that does not overlap with that of other compressed symbols is allocated to the record of the entry region 1011 as a compressed symbol. The compressed symbol may be, for example, an index given to an entry. In the example of FIG. 8, "0" is registered as a compressed symbol. Furthermore, as a reference frequency of the entry, "1" indicating the number of appearances of the symbol pair is registered.

The determination unit 102 determines the bank region 1012 to be used for compression of each symbol pair of the input stream and retrieves the bank regions 1012 determined by the processing unit 103 in order of addresses as described above. In a case that there is no entry region 1011 in which a symbol pair is registered in the determined bank region 1012, the processing unit 103 outputs the symbol pair without conversion as described above. In addition, the processing unit 103 adds, to the bank region 1 of the conversion table 101, a record in which the symbol pair "AA" is set for the symbol sequence to be compressed.

In addition, in a case that there is an entry region 1011 in which a symbol pair is registered in the determined bank region 1012, the processing unit 103 outputs the compressed symbol associated with the symbol pair in the entry region 1011 and adds "1" to the reference frequency of the entry region 1011.

Because the number of entry regions 1011 included in the bank region 1012 is finite, if the process continues as described above, vacant entry regions 1011 may be depleted in any of the bank regions 1012. FIG. 9 is a diagram illustrating an example of a state in which vacant entry regions 1011 are depleted in the bank region 1. In this state, a case where the compression process of the symbol pair "AC" is performed is considered. The symbol pair "AC" is associated with the bank region 1 by the hash function 1021, but the symbol pair "AC" is not registered in any entry region 1011 of the bank region 1. For this reason, the processing unit 103 outputs the symbol pair "AC" without conversion and attempts to register the symbol pair "AC" in the bank region 1. However, because there is no vacant entry region 1011 in the bank region 1, it is not possible to register the symbol pair "AC" in that state.

In such a case, the processing unit 103 subtracts "1" from the reference frequency of each of the entry regions 1011 of the bank region 1. The processing unit 103 reserves vacant entry regions 1011 by deleting the record for which the subtraction result of the reference frequency is "0". Here, if "1" is subtracted from the reference frequency, the reference frequency becomes 0 in the record for the symbol pair "AB" as the symbol sequence to be compressed. Thus, the record for the symbol pair "AB" is deleted as the symbol sequence to be compressed, and the entry region 1011 storing the record becomes a vacant region.

Such a process allows the processing unit 103 to cause the entry region 1011, which is a vacant region, to store a record indicating the symbol pair "AC" as a symbol to be compressed in the entry region 1011 serving as a vacant region. FIG. 10 is a diagram illustrating an example of a state in which a record indicating the symbol pair "AC" as a symbol to be compressed is stored in an entry region serving as a vacant region.

FIG. 11 is a diagram illustrating an example of the conversion table when compression of stream data is completed. The process described above is continued, thereby allowing the data compressor 10 to output stream data "AABB0ABADAC4" obtained by compressing stream data "AABBAAABADACBB".

According to the data compressor 10 as described above, the amount of data flowing through the transmission line 800 can be reduced by the amount obtained by replacing the symbol pair with one compressed symbol. Furthermore, the time taken by the process can be kept to a certain time or shorter by, for example, setting the unit of process to a symbol having a fixed length. Furthermore, the conversion table is not prepared in advance because entries are added to the conversion table based on the trend of appearance of the symbols included in the input data. In this way, in a case that stream data is compressed in real time, the conversion rules following the trend of the stream data can be generated and applied.

Furthermore, the data compressor 10 can narrow a retrieval range in which the conversion table 101 is retrieved by dividing the conversion table 101 having a predetermined number of entry regions 1011 into a plurality of bank regions with a smaller number of entries than the predetermined number. As a result, a retrieval time in which compressed symbols corresponding to symbols to be compressed are searched one by one can be shortened.

When the data compressor 10 performs lossless compression, an additional bit indicating whether a symbol to be compressed has been compressed to a compressed symbol and output may be output. An additional bit is, for example, "1" when the symbol to be output is a converted symbol, and "0" when the symbol to be output is not a converted symbol. In other words, the data compressor adds "1" as an additional bit to a compressed symbol when a symbol to be compressed is compressed to the compressed symbol and output, and adds "0" as an additional bit when a symbol to be compressed is output without being compressed.

[Data Decompressor]

Figure 12:
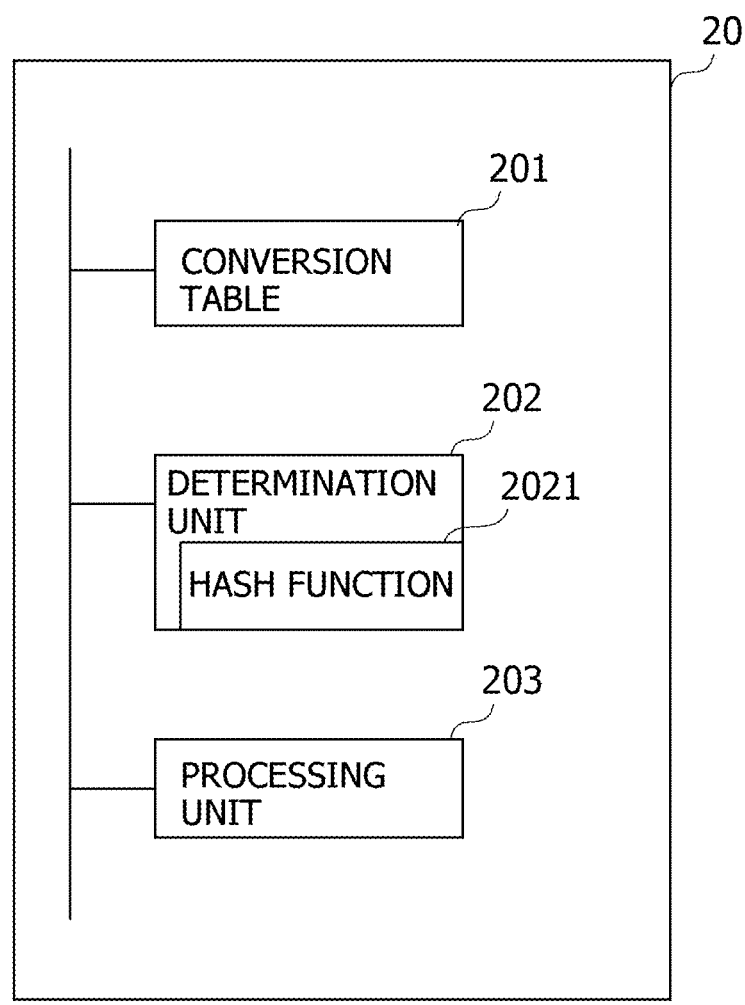
FIG. 12 is a logical block diagram illustrating an example of a data decompressor.

When the data compressor 10 outputs losslessly compressed stream data, the receiver 20 illustrated in FIG. 1 functions as a data decompressor 20 that decompresses the received stream data. The data decompressor 20 is, for example, an information processing device having a hardware configuration similar to the data compressor 10 illustrated in FIG. 1. FIG. 12 is a logical block diagram illustrating an example of the data decompressor. The data decompressor 20 includes a conversion table 201, a determination unit 202, and a processing unit 203. The data decompressor 20 decompresses stream data that has been losslessly compressed by the data compressor 10.

The data decompressor 20 includes the conversion table 201, the determination unit 202, and the processing unit 203. In the data decompressor 20, a CPU 701 of the data decompressor 20 loads a data decompression program stored in an auxiliary storage unit 703 into a main storage unit 702 and execute the data decompression program to implement the conversion table 201, the determination unit 202, and the processing unit 203.

Figure 13:
FIG. 13 is a diagram illustrating an example of a conversion table of the data decompressor.

The conversion table 201 has a plurality of entry regions in which a mapping between data not being decompressed and decompressed data can be stored. The conversion table 201 is stored in the auxiliary storage unit 703, for example. FIG. 13 is a diagram illustrating an example of the conversion table of the data decompressor. The conversion table 201 illustrated in FIG. 13 has 16 entry regions 2011 in which a mapping between data not being decompressed and decompressed data can be stored. The entry regions 2011 are consecutively allocated in order of addresses. The 16 entry regions 2011 of the conversion table 201 are divided into four bank regions 2012. Each of the bank regions 2012 has four entry regions 2011. Hereinafter, in a case that the bank regions 2012 are distinguished from each other in the present specification, the bank regions will also be referred to as a decompression bank region 1, a decompression bank region 2, a decompression bank region 3, and a decompression bank region 4 in order of addresses. The conversion table 201 is an example of a "decompression conversion table". The entry regions 2011 are an example of "decompression entry regions".

Figure 14:
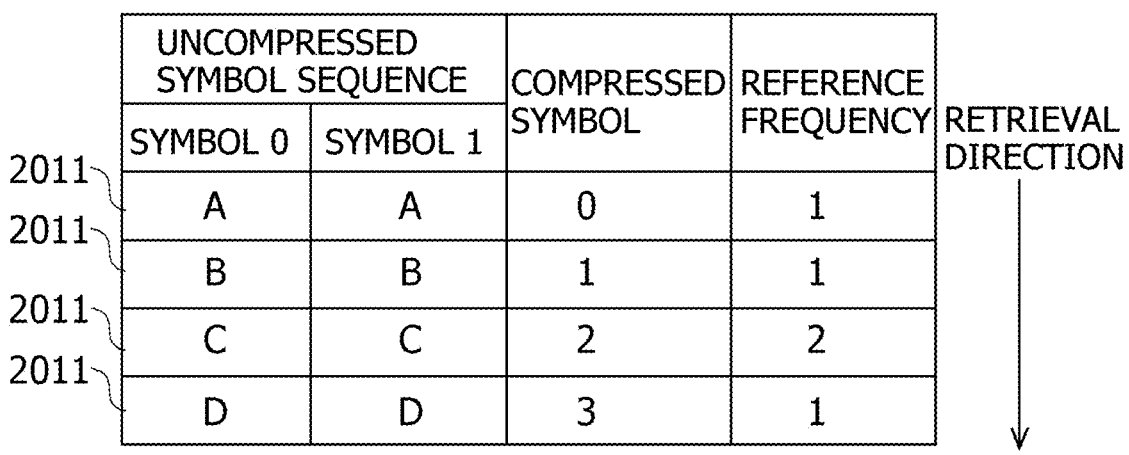
FIG. 14 is a diagram illustrating an example of a decompression bank region.

FIG. 14 is a diagram illustrating an example of a decompression bank region. The decompression bank region is a table in which one symbol to be decompressed "symbol sequence to be decompressed" (i.e., a symbol sequence not being decompressed), two symbols converted through a decompression process "decompressed symbol" (i.e., symbol already decompressed), and "reference frequency" representing the number of accesses to the symbol to be decompressed are associated with each other and managed for each entry region 2011. Information registered in the entry region 2011 is also referred to as a record. Further, the two symbols included in the input symbol sequence will be referred to as "symbol 0" and "symbol 1" for convenience. In the first embodiment, although a record of the entry region 2011 is dynamically added and deleted, some record may be registered in the entry region 1011 in advance at the beginning of a process. In the first embodiment, one alphabet indicated in FIG. 14 is assumed to represent one symbol.

When the data decompressor 20 receives stream data to be decompressed as an input, the determination unit 202 extracts symbols, and checks an additional bit added to the symbol. In a case that "0" is added as an additional bit, that is, in a case that an extracted symbol has not been compressed, the determination unit 102 determines a bank region 2012 to be used for a decompression process of a pair of two symbols in which the extracted symbol is combined with the next symbol to the extracted symbol. In a case that "1" is added as an additional bit, that is, in a case that an extracted symbol has been compressed, the determination unit 202 determines a bank region 2012 to be used for a decompression process of the extracted symbol.

For the determination of the bank region 2012, the determination unit 202 uses a hash function 2021. The hash function 2021 outputs a calculation result associated with any one of the decompression bank regions and outputs a calculation result uniquely determined from the same input value. In a case that the extracted symbol has been compressed, the determination unit 202 performs calculation on some data of the extracted symbol using the hash function 2021 to acquire the calculation result. In addition, in a case that the extracted symbol has not been compressed, the determination unit 202 performs calculation on some data of a symbol pair in which the extracted symbol is combined with the next symbol to the extracted symbol by using the hash function 2021 to acquire the calculation result. The bank region 2012 corresponding to the acquired calculation result is determined as a bank region 2012 to be used for the decompression process of the symbol.

The processing unit 203 uses the bank region 2012 determined by the determination unit 202 to perform the decompression process. In the decompression process, the processing unit 203 searches each entry region 2011 of the bank region 2012 one by one. In a case that "0" is added as an additional bit, the processing unit 203 registers, in the determined bank region 2012, a record indicating the symbol pair as a decompressed symbol pair in an entry region 2011 that is continuous with another entry region 2011 in which the record is already registered, and outputs the symbol pair.

In a case that "1" is added as an additional bit, the processing unit 203 retrieves the entry regions 2011 of the determined bank region 2012 in order of addresses. In a case that a record indicating the symbol as a symbol not being decompressed is registered, the processing unit 203 outputs a decompressed symbol pair associated with the symbol in the record.

Furthermore, the processing unit 203 adds and deletes a record registered in the entry region 2011 with respect to the bank region 2012 in accordance with the appearance frequency of the symbols included in the stream data.

[Hash Function of Data Decompressor]

FIG. 15 is a diagram schematically illustrating an association of input symbols and decompression bank regions based on a hash function of the data decompressor. The hash function 2021 associates the input symbols with the decompression bank regions as illustrated in FIG. 15. In the hash function 2021 schematically illustrated in FIG. 15, for example, the symbol "0" is associated with a "bank region 1". The hash function 2021 of the data decompressor 20 differs from the hash function 1021 of the data compressor 10 in that any of uncompressed symbol pairs and compressed symbols can be input as input symbols.

[Decompression Process]

Figure 16:
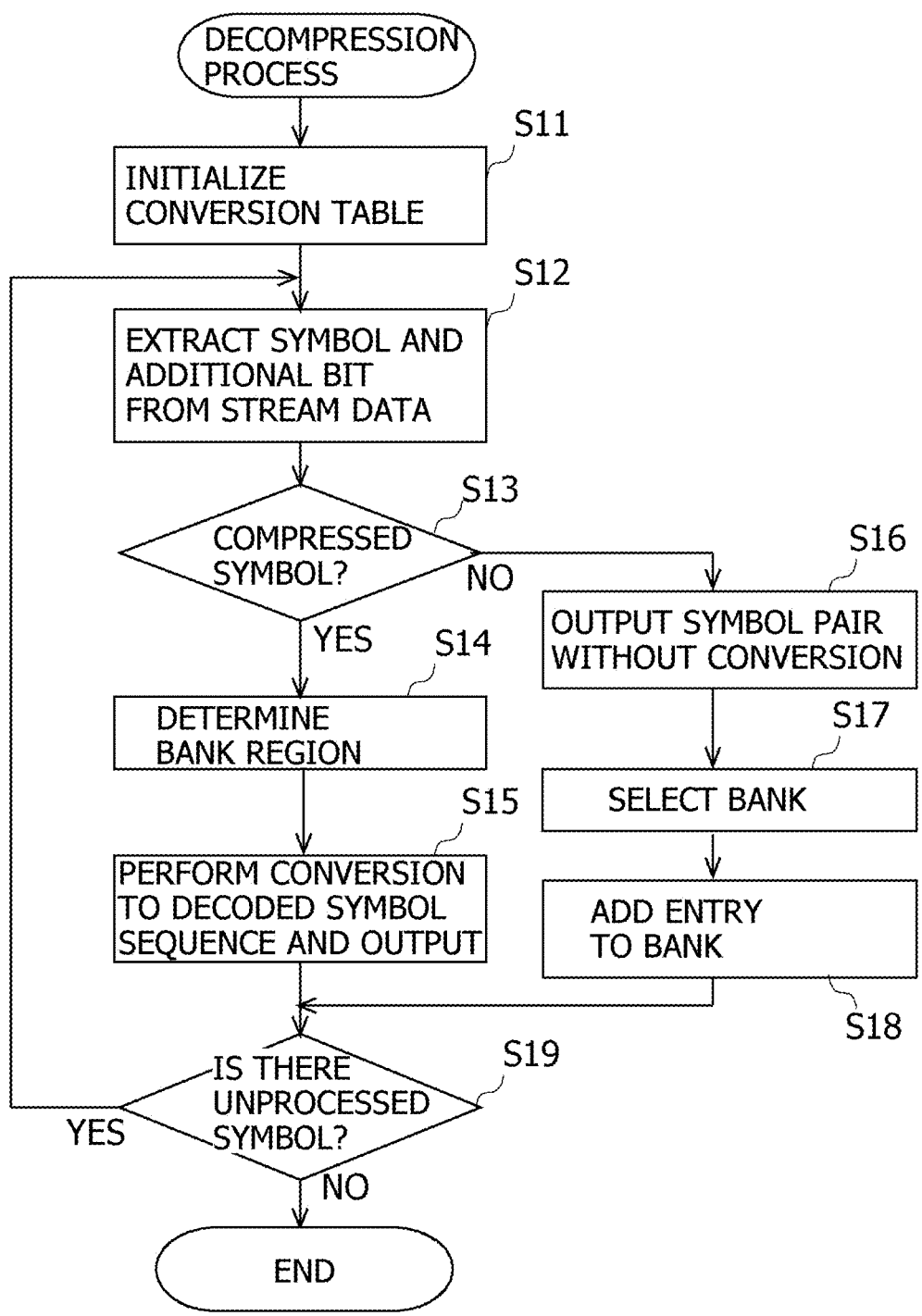
FIG. 16 is a process flow diagram schematically illustrating a decompression processing step performed according to the first embodiment.

FIG. 16 is a process flow diagram schematically illustrating a decompression processing step according to the first embodiment. The process flow illustrated in FIG. 16 is an example of a "data decompression method". In step S11, the determination unit 202 of the data decompressor 20 initializes entries of each bank region 2012 (the decompression bank region 1 to the decompression bank region 4) of the conversion table 201. In this step, for example, all records of each bank region 2012 may be deleted or predetermined records may be registered in advance.

In step S12, the determination unit 202 of the data decompressor 20 extracts a symbol and an additional bit from stream data. If the symbol extracted in step 12 is a compressed symbol, that is, if the additional bit is 1 (YES in step S13), the determination unit 202 selects the bank corresponding to the compressed symbol using the hash function 2021 (step S14). The decoded symbol sequence is output from the selected bank (step S15).

On the other hand, in a case that the symbol extracted in step 12 is not a compressed symbol, that is, if the additional bit is 0 (NO in step S13), the determination unit 202 outputs the extracted symbol to the processing unit 203 and notifies the processing unit 203 of the fact that the symbol is not a compressed symbol. The processing unit 203 outputs two symbols (a symbol pair) in which the symbol received from the determination unit 202 is combined with the symbol next to the received symbol (step S16). In addition, in step S17, the determination unit 202 uses the hash function 2021 to select the bank corresponding to the symbol pair of step S16. In addition, the processing unit 203 registers an entry in which the symbol pair is set as a decoded symbol sequence in the bank selected in step S17 (step S18). Further, the processes of steps S16, S17, and S18 may be executed in parallel or the order of the processes may be changed.

If there is a subsequent symbol in the stream data after step S15 or S18 (YES in step S19), the process returns to step S12 to repeat the process. On the other hand, if there is no subsequent symbol in the stream data (NO in step S19), the decompression process ends.

[Generation and Updating of Conversion Table]

Figure 18:
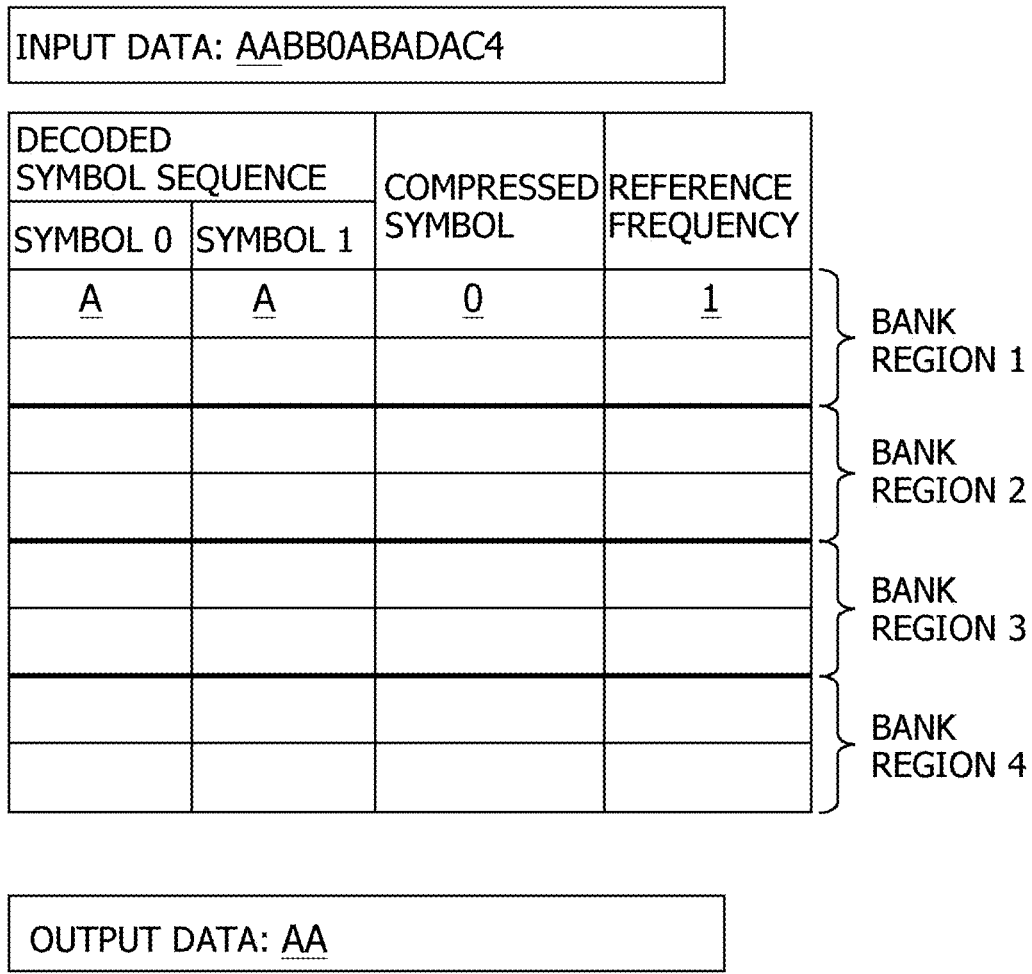
FIG. 18 is a second diagram for describing generation and updating of the conversion table.

Next, a specific example in which entries are added to the conversion table 201 will be described using the hash function 2021 schematically illustrated in FIG. 15 and FIGS. 17 to 19. FIGS. 17 to 19 are diagrams for describing generation and updating of the conversion table. In this example, the stream data "AABB0ABADAC4" (referred to as "input data") is assumed to be sent to the data decompressor 20 via the transmission line 800.

First, it is assumed that records are not registered in any of the decompression bank region 1 to the decompression bank region 4 in the initial conversion table 201 before the process is started as illustrated in FIG. 17. In addition, it is assumed that the maximum number (amounts) of entries of each decompression bank region of the conversion table 201 is 2. In addition, it is assumed that a first symbol "A" of the input data is input, and "0" is input as an additional bit. In other words, because the symbol "A" is not a compressed symbol, a symbol pair "AA" in which the symbol is combined with the next symbol is read, as illustrated in FIG. 18.

The determination unit 202 selects the decompression bank region 1 as a bank region 2012 associated with the symbol pair "AA" by using the hash function 2021. The determination unit 202 sets the symbol pair "AA" for the symbol sequence not being decompressed for the determined decompression bank region 1, and registers "0" as a decompressed symbol. Here, similarly to the data compressor 10, "0" registered as a decompressed symbol is used as an index of the conversion table 201. Furthermore, as a reference frequency of the record, "1" indicating the number of appearances of the symbol is registered. The processing unit 203 outputs the symbol pair "AA" read by the determination unit 202.

Next, the next symbol "B" of the input data is determined to not be a compressed symbol, a symbol pair "BB" is read, and the read symbol pair "BB" is output. Furthermore, the determination unit 202 uses the hash function 2021 to determine the bank region associated with the symbol pair "BB" as a bank region 3. The processing unit 203 sets the symbol pair "BB" as a decoded symbol sequence in the determined bank region 3, and registers "4" that is the index of the conversion table 201 as a compressed symbol as described above. Furthermore, as a reference frequency of the entry, "1" indicating the number of appearances of the symbol is registered.

Thereafter, when the determination unit 202 extracts the next symbol "0", "1" is input as an additional bit. The determination unit 202 uses the hash function 2021 to determine the decompression bank region 1 as a bank region 2012 to be used in the decompression process of the symbol "0". The processing unit 203 outputs a decompressed symbol pair associated with the symbol not being decompressed "0" in the determined decompression bank region 1, and adds "1" to the reference frequency of the record.

If the decompression process continues while the above-described process is repeated, vacant entry regions 2011 could be depleted in any bank region 2012. In such a case, the processing unit 203 subtracts "1" from the reference frequency of each record registered in the bank region 2012 determined based on the hash function 2021, and deletes the record in which the reference frequency is "0" from the bank region 2012, similarly to the processing unit 103 of the data compressor 10, and thus vacant entry regions 2011 may be reserved, and new records may be added to the secured entry regions 2011.

By performing the decompression process as described above, the data decompressor 20 outputs a stream "AAB- BAAABADACBB" obtained by decompressing the input stream "AABB0ABADAC4" as illustrated in FIG. 19.

According to the data decompressor 20 as described above, the data decompressor can decode the stream data losslessly compressed by the data compressor 10. Furthermore, the time taken by the process can be kept to a certain time or shorter by, for example, setting the unit of process to a symbol having a fixed length. Furthermore, the conversion table is not prepared in advance because entries are added to the conversion table according to rules similar to those of the data compressor 10 based on the trend of appearance of the symbols included in the stream data. In this way, in a case that stream data is decompressed in real time, the conversion rules following the trend of the stream data can be generated and applied.

Furthermore, the data decompressor 20 can narrow a retrieval range in which the conversion table 201 is retrieved by dividing the conversion table 201 having a predetermined number of entry regions 2011 into a plurality of bank regions with a smaller number of entries than the predetermined number. As such, the data decompressor 20 can shorten the processing time for retrieving the conversion table and thus reduce the processing time for data decompression.

[Verification]

As for the data compressor 10 described above, a processing time and compression rate were verified with different numbers of banks obtained by dividing the conversion table, which will be described with reference to the drawings. In the present verification, data compressors 10 each having the conversion table 101 with 256 entries were coupled with four-stage configuration, and the processing time and compression rate of the compression process were measured in each of cases in which the number of banks is 1, 2, 4, 8, and 16.

Figure 20:
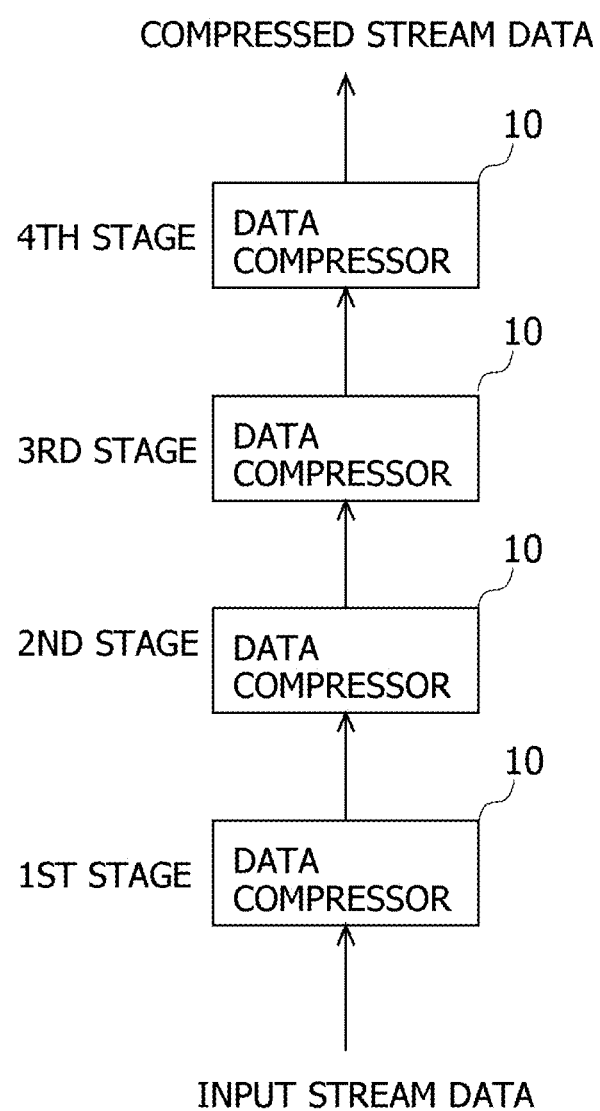
FIG. 20 is a diagram illustrating an example of a configuration in which the data compressors according to the first embodiment are coupled with four-stage configuration.

FIG. 20 is a diagram illustrating an example of a configuration in which the data compressors according to the first embodiment are coupled with four-stage configuration. As illustrated in FIG. 20, when input stream data is input to the first-stage data compressor 10, the first-stage data compressor 10 outputs compressed data obtained by compressing the input stream data to the second-stage data compressor 10. The second-stage data compressor 10 outputs the compressed data obtained by compressing the compressed data that had been compressed by the first-stage data compressor 10 to the third-stage data compressor 10. This process is continued up to the fourth-stage data compressor 10.

Because the data compressor 10 according to the first embodiment converts a symbol pair to one symbol, a compression rate, which is a ratio of a size of compressed data to a size of uncompressed data is at most 50%. The compression process on the compressed data can be further performed by coupling a plurality of data compressors 10 as illustrated in FIG. 20, and thus the compression rate can be increased.

Figure 21:
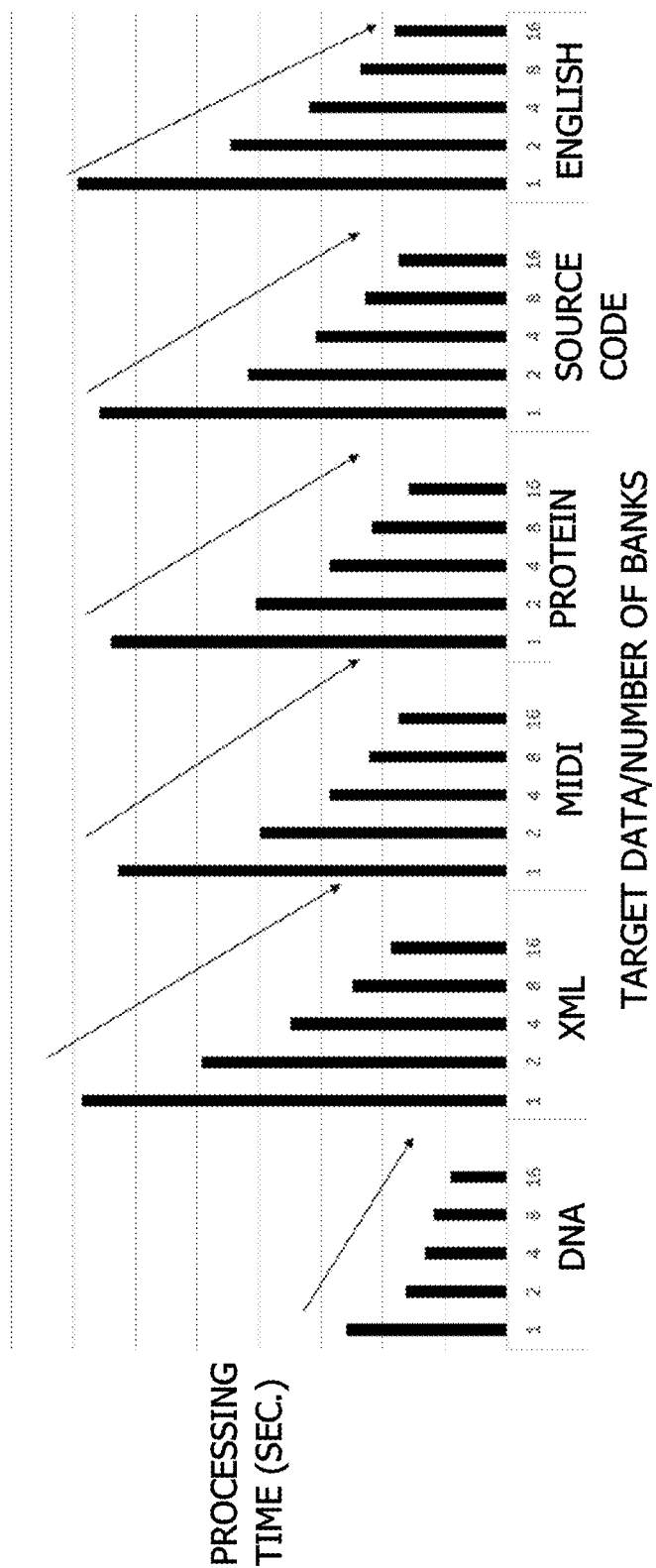
FIG. 21 is a diagram illustrating a relationship between the number of banks obtained by dividing a conversion table and a processing time in accordance with compression.

FIG. 21 is a diagram illustrating a relationship between the number of banks obtained by dividing a conversion table and a processing time in accordance with compression. In FIG. 21, the vertical axis represents processing time and the horizontal axis represents the number of banks. In addition, in the verification indicated in FIG. 21, text data having a file size of 10 MB was used, and six types of data content (Deoxyribonucleic Acid (DNA) structure data, eXtensible Markup Language (XML) data, Musical Instrument Digital Interface (MIDI) data, protein structure data, program source codes, and English text data) were prepared, and the verification was performed for each type of the data. In FIG. 21, the number of bank regions being "1" indicates a case in which the compression process is performed without dividing the conversion table into a plurality of bank regions.

With reference to FIG. 21, it can be understood that if the number of bank regions obtained by dividing the conversion table increases, a processing time can be shortened. The reason for this is that a range in which a symbol to be compressed is retrieved becomes narrower (that is, the number of entry regions to be retrieved decreases) as the number of bank regions increases, and thus the process to retrieve a compressed symbol corresponding to the symbol to be compressed is accelerated.

Figure 22:
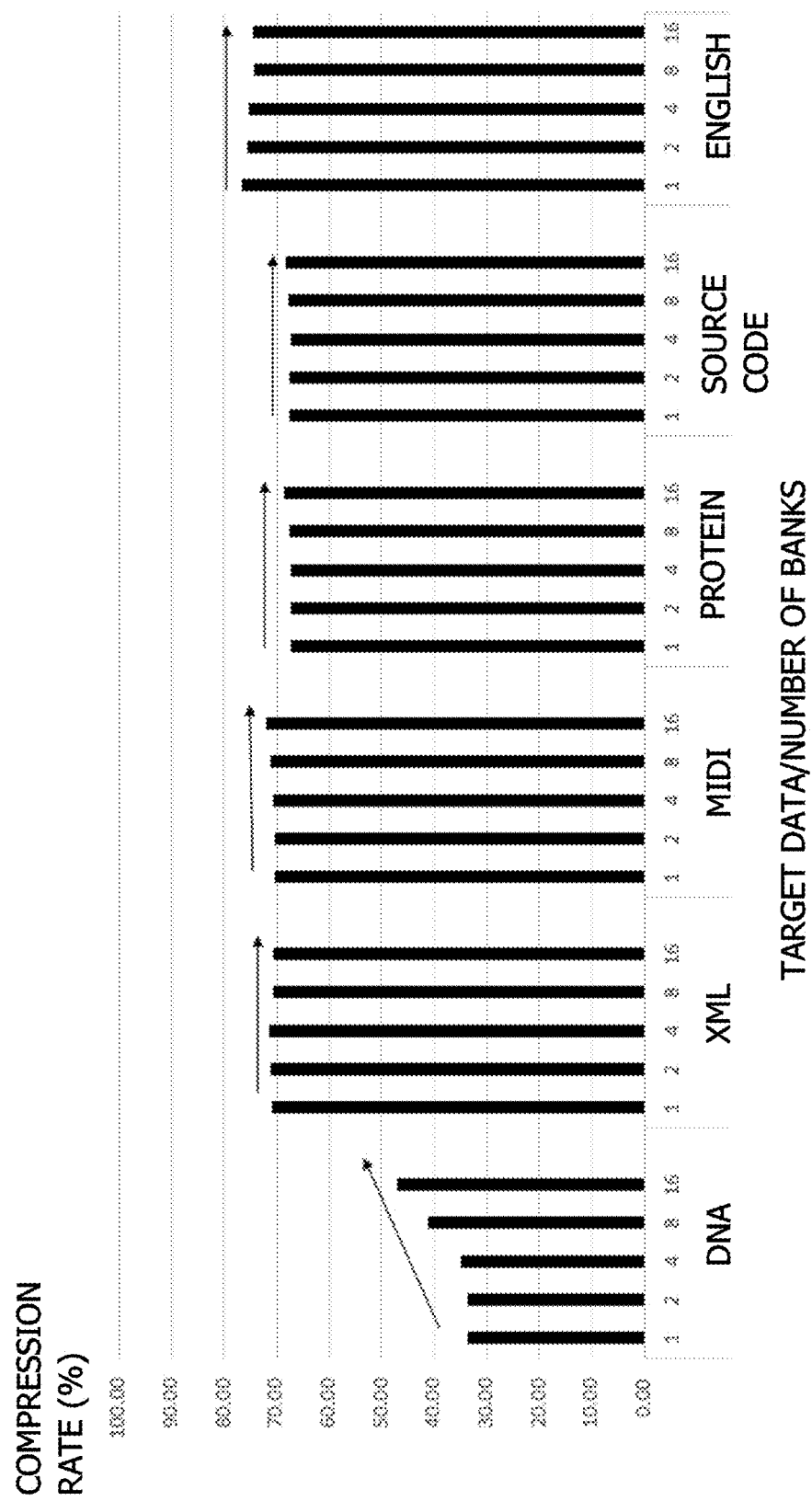
FIG. 22 is a diagram illustrating a relationship between the number of bank regions obtained by dividing a conversion table and a compression rate.

FIG. 22 is a diagram illustrating a relationship between the number of bank regions obtained by dividing a conversion table and a compression rate. In FIG. 22, the vertical axis represents compression rate and the horizontal axis represents the number of banks. In the verification illustrated in FIG. 22, text data similar to that for the verification illustrated in FIG. 21 was used. In FIG. 22, that the number of bank regions is "1" indicates a case in which the compression process is performed without dividing the conversion table into a plurality of bank regions, as in the case of FIG. 21.

As can be seen with reference to FIG. 22, no deterioration in compression rates was seen in the five types of data excluding DNA structure data. As for the DNA structure data, if the number of bank regions is up to four, a reduction in the compression rate is not observed. It can be seen that the compression processing speed can be improved by dividing the conversion table into a plurality of bank regions based on the verification results illustrated in FIGS. 21 and 22. Such an improvement is similarly obtained in the decompression of the compressed data.

Examination of First Embodiment

As described above, according to the first embodiment, the compression processing speed can be improved. On the other hand, the compression rate may decrease depending on a type of data. Thus, the DNA structure data which may have a slight deterioration in the compression rate and the protein structure data which has nearly no deterioration in the compression rate are compared, and a difference between the data will be examined.

Figure 23:
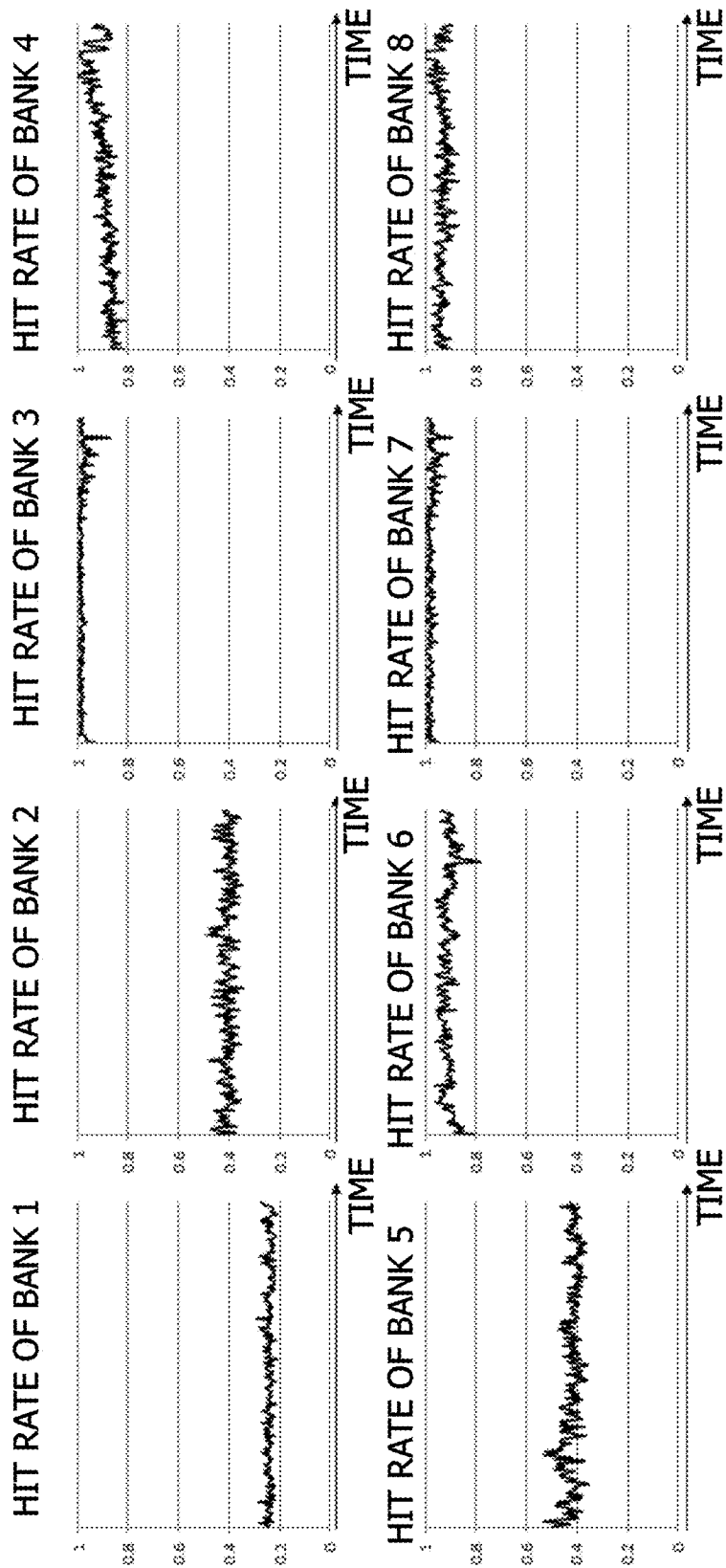
FIG. 23 is a diagram illustrating hit rates of respective bank regions in a case that the data compressor compresses DNA structure data.

FIG. 23 is a diagram illustrating hit rates of respective bank regions in a case that the data compressor compresses DNA structure data. In FIG. 23, the vertical axis represents hit rate and the horizontal axis represents time. In FIG. 23, the verification results in a case that the conversion table is divided into eight bank regions are illustrated. A hit rate is a ratio of the number of times by which the registration of a symbol sequence as an uncompressed symbol sequence is detected to the number of times by which a bank is retrieved using a symbol sequence as a key.

With reference to FIG. 23, it can be seen that, in a case that DNA structure data is compressed, the hit rate greatly varies depending on the bank regions. In particular, it can be seen that in the bank region 1, the bank region 2, and the bank region 5, the hit rates transition with lower levels than those of the other bank regions. Thus, it can be seen that, in a case that the DNA structure data is compressed, there is a large amount of data that is output without being compressed.

Figure 24:
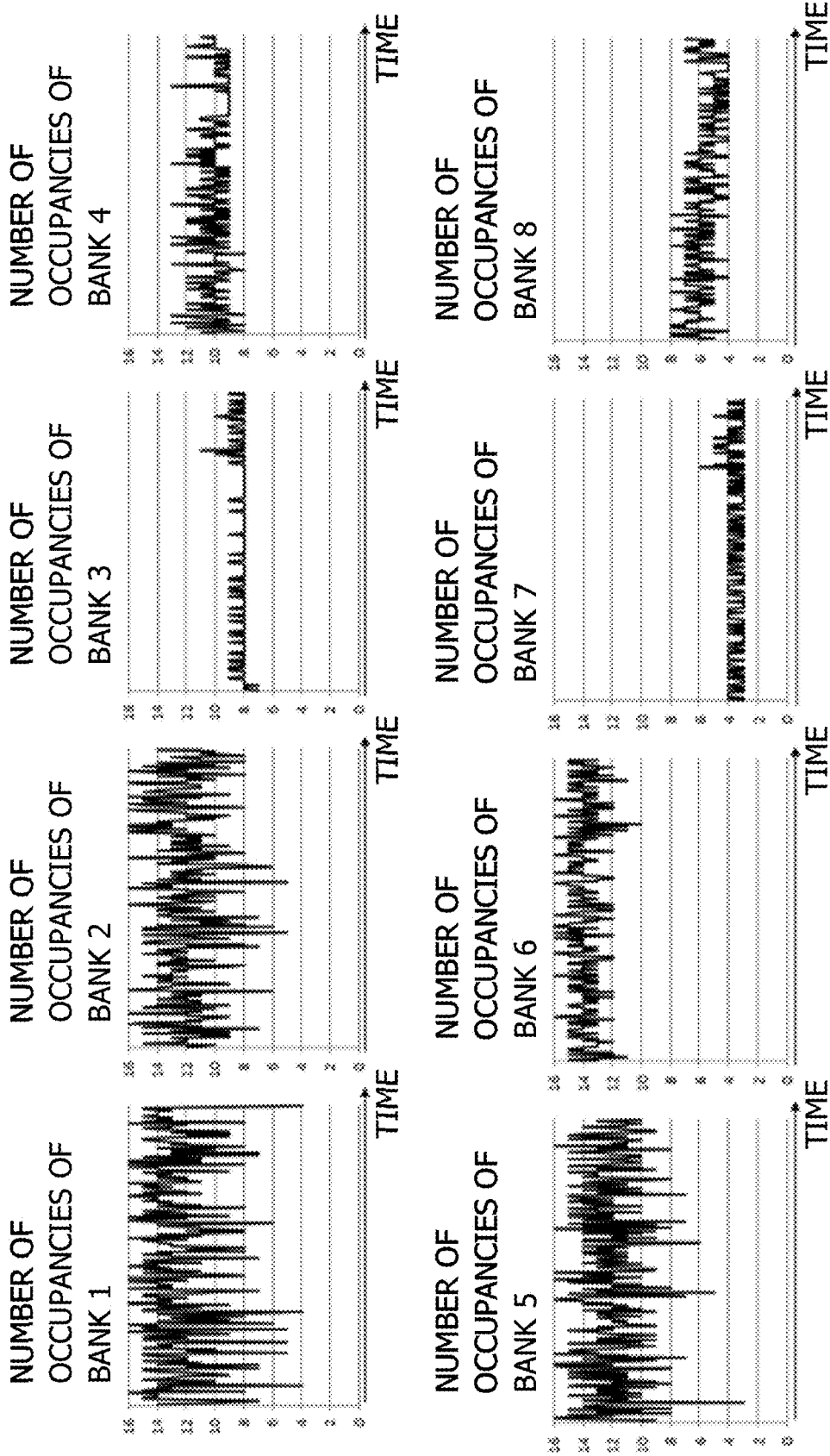
FIG. 24 is a diagram illustrating the number of occupancies of each bank in a case that the data compressor compresses the DNA structure data.

FIG. 24 is a diagram illustrating the number of occupancies of each bank in a case that the data compressor compresses the DNA structure data. The number of occupancies is the number of entry regions in which a record is registered, among the entry regions of each bank region. In FIG. 24, the vertical axis represents the number of occupancies and the horizontal axis represents time. In FIG. 24, the verification results in a case that the conversion table is divided into eight bank regions are illustrated, as in the case of FIG. 23.

With reference to FIG. 24, it can be seen that, in a case that the DNA structure data is compressed, the number of occupancies greatly varies depending on the bank regions. In particular, it can be seen that the number of occupancies of the bank region 7 transitions with a lower level than those of the other bank regions. That is, it can be seen that, in a case that the DNA structure data is compressed, there are many banks that are not effectively utilized.

Because the DNA structure is represented by four kinds of characters of adenine (A), thymine (T), guanine (G), and cytosine (C), the number of patterns of the data is smaller compared to other types of data. As a result, the number of banks which are used less frequently tends to increase. Thus, the number of records that can be registered in the conversion table 101 may substantially decrease. The utilization of bank is concentrated on some bank regions 1012, and thus the hit rate is likely to become lower because the number of entries once registered reaches a maximum number of records in the bank regions 1012 and the entries are likely to be deleted.

Second Embodiment

In the first embodiment, the processing speed of compression is improved by dividing the conversion table into a plurality of banks. However, according to the above examination, a compression rate may deteriorate depending on the type of data. Thus, in the second embodiment, a configuration which curbs deterioration in a compression rate while improving a processing speed by using a conversion table divided into a plurality of bank regions will be described.

In the second embodiment, a hit rate and the number of occupancies after compression is performed are fed back to the control unit, and the control unit determines a bank region so that the bank regions can be more evenly used based on the hit rate and the number of occupancies that have been fed back.

Figure 25:
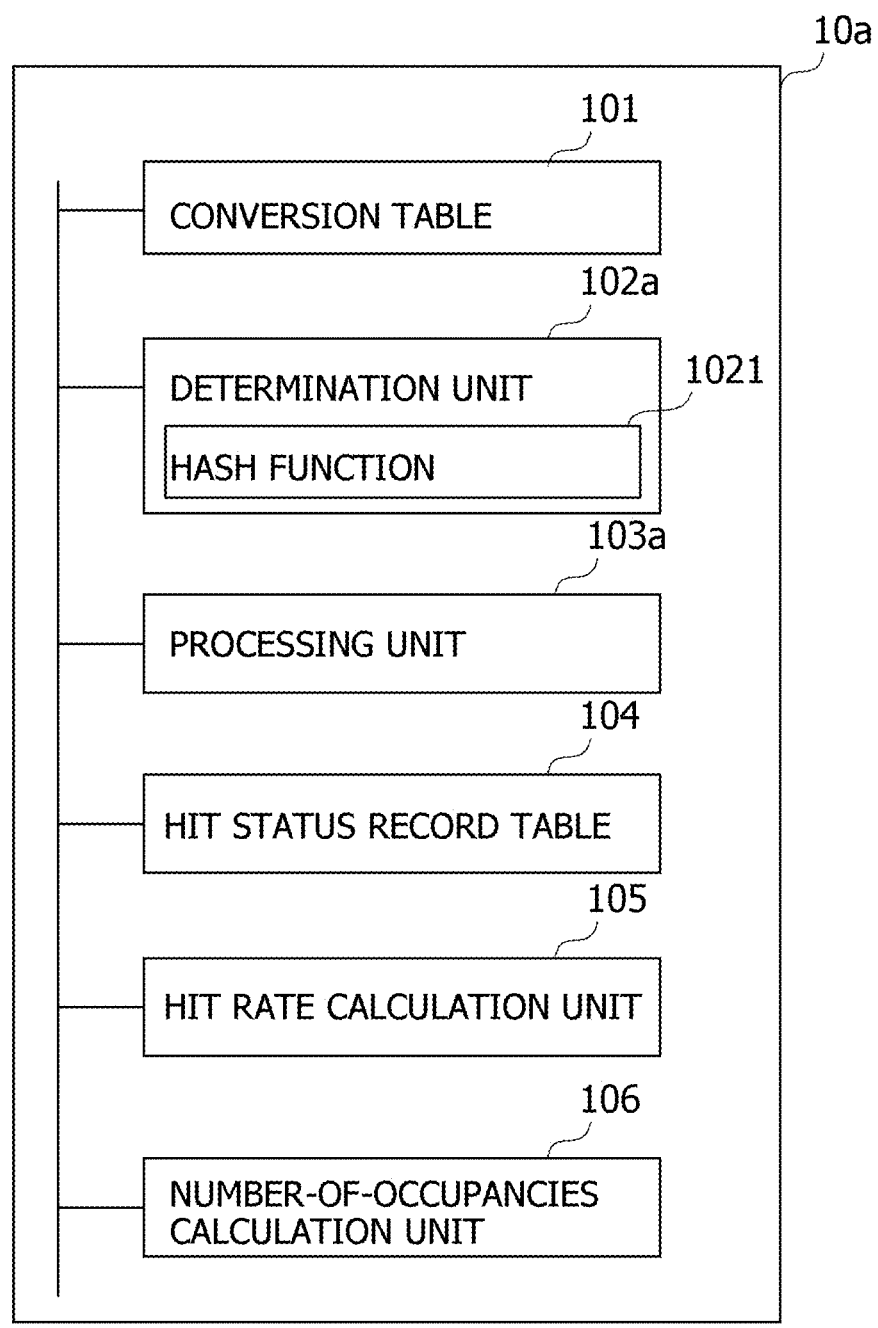
FIG. 25 is a diagram illustrating an example of a data compressor according to a second embodiment.

FIG. 25 is a diagram illustrating an example of a data compressor according to the second embodiment. In FIG. 25, the same components as those in the first embodiment are given the same reference numerals, and descriptions thereof will be omitted. The data compressor 10a according to the second embodiment differs from the data compressor 10 according to the first embodiment in that the data compressor 10a includes a determination unit 102a, a processing unit 103a, a hit status record table 104, a hit rate calculation unit 105, and a number-of-occupancies calculation unit 106.

The hit status record table 104 is a table that manages an association of bank regions 1012, and the number of retrievals and the number of hits of the bank regions 1012 as illustrated in FIG. 26. The hit status record table 104 is stored, for example, in the auxiliary storage unit 703. It can be seen that, in the hit status record table 104 illustrated in FIG. 26, for example, a "bank region 4" has been retrieved "three times" and hit "three times".

The processing unit 103a differs from the processing unit 103 according to the first embodiment in that the processing unit 103a adds "1" to the number of retrievals for the bank regions 1012 retrieved from the hit status record table 104 each time the bank regions 1012 are retrieved, and adds "1" to the number of hits in the bank regions 1012 when the retrieval is hit. In addition, when the processing unit 103a is requested to reset the hit status record table 104 from the determination unit 102a, the processing unit 103a resets the number of retrievals and the number of hits of the hit status record table 104 to "0".

The determination unit 102a differs from the determination unit 102 according to the first embodiment in that, for a predetermined number of retrieval operations (e.g., 100 times), the determination unit changes the number of bank regions to be used in compression based on a result of comparing the hit rate and the number of occupancies with a threshold of the hit rate and a threshold of the number of occupancies respectively. The threshold of the hit rate and the threshold of the number of occupancies are determined to have preferable values through an experiment by a user, and are stored in the auxiliary storage unit 703. In addition, the determination unit 102a requests the hit rate calculation unit 105 to calculate the hit rate of the bank region 1012 determined using the hash function 1021, or requests the number-of-occupancies calculation unit 106 to the calculate the number of occupancies of each of the bank regions 1012 included in the conversion table 101. After calculating the hit rate and the number of occupancies, the determination unit 102a requests the processing unit 103a to reset the hit status record table 104. The threshold of hit rate is an example of "a first threshold of hit rate".

In response to the request from the determination unit 102a, the hit rate calculation unit 105 calculates the hit rate of the bank region 1012 with reference to the hit status record table 104. When the determination unit 102a specifies the bank region 1012, the hit rate calculation unit 105 calculates the hit rate of the specified bank region 1012. The hit rate can be calculated by dividing the number of hits recorded in the hit status record table 104 by the number of retrievals.

The number-of-occupancies calculation unit 106 calculates the number of occupancies in each of the bank regions 1012 in response to the request from the determination unit 102a. The number of occupancies is the number of entry regions 1011 in which records are stored in the bank region 1012. When the number-of-occupancies calculation unit receives the request to calculate the number of occupancies from the determination unit 102a, the number-of-occupancies calculation unit accesses the conversion table 101 to calculate, for each bank region 1012, the number of entry regions 1011 in which the record is stored.

[Updating of Hit Status Record Table]

Figure 27:
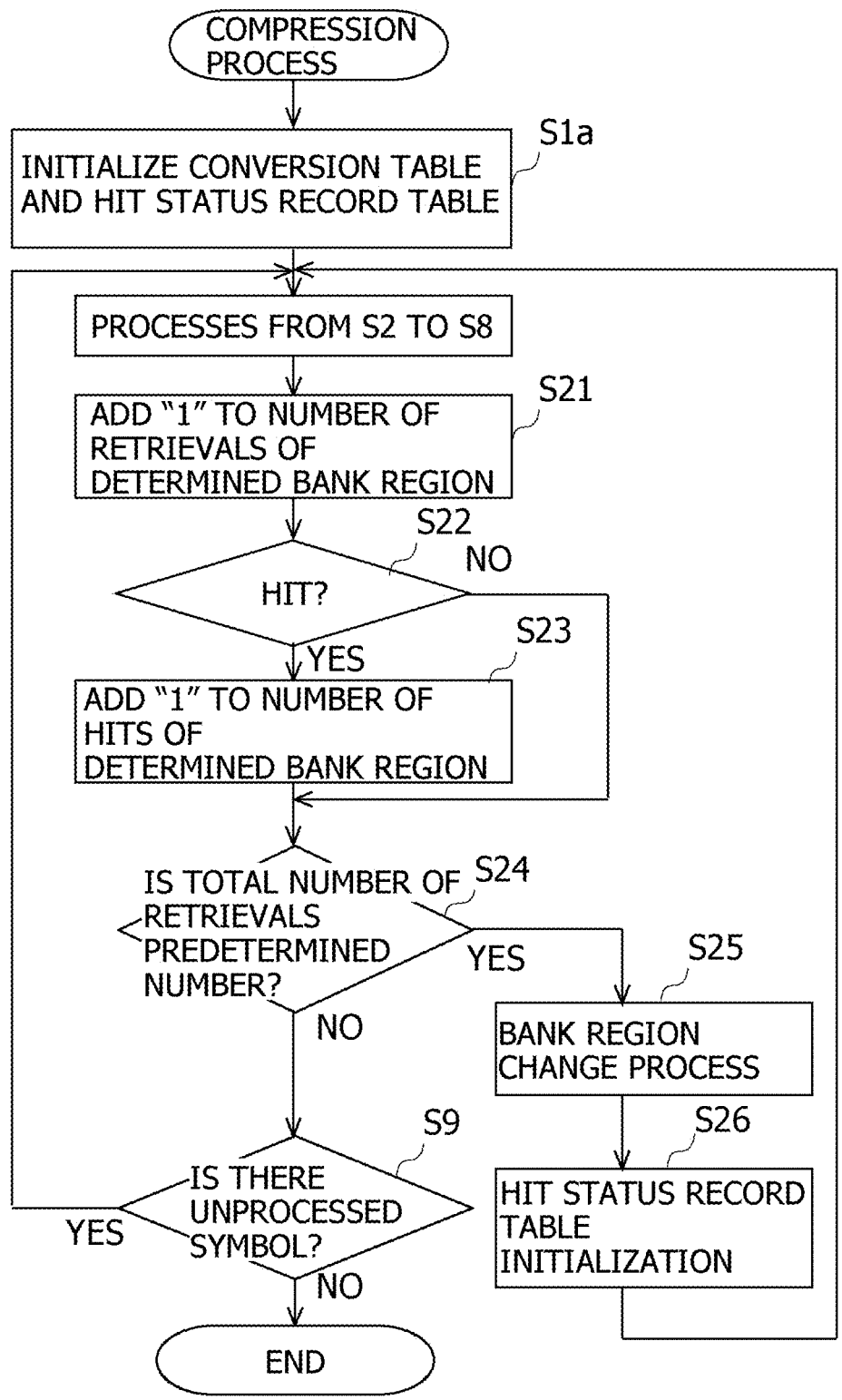
FIG. 27 is a diagram schematically illustrating a compression process in which an updating process of the hit status record table is incorporated in the second embodiment.

FIG. 27 is a diagram schematically illustrating a compression process in which an updating process of the hit status record table is incorporated in the second embodiment. The same processes as those in the first embodiment are given the same reference numerals, and descriptions thereof will be omitted. A compression process in which the updating process for the hit status record table is incorporated in the second embodiment will be described with reference to FIG. 27.

In step S1a, the hit status record table 104 together with the conversion table 101 is initialized. In the initialization of the hit status record table 104, for example, the number of retrievals and the number of hits in the hit status record table 104 are set to "0".

After step S1a ends, the processes from step S2 to step S8 of FIG. 6 are performed. Then, in step S21, the processing unit 103 adds "1" to the number of retrievals for the bank region determined in step S3 in the hit status record table 104. In step S22, the processing unit 103 adds "1" to the number of hits in the bank region determined in step S3 in the hit status record table 104 when a hit is obtained, that is, when step S5 branches to "YES".

In step S24, the processing unit 103 determines whether the total number of retrievals in each bank region recorded in the hit status record table 104 is a predetermined number (100 times in the present embodiment). If the total number of retrievals is the predetermined number, the process proceeds to S25 to perform a bank region change process (which will be described below with reference to FIG. 28). In step S26, the processing unit 103a initializes the hit status record table 104 in response to a request from the determination unit 102a after the bank region change process is executed. The process is then returned to S2. If the total number of retrievals is not the predetermined number, the process of step S9 is performed.

The number of retrievals and the number of hits of the bank region 1012 in the hit status record table 104 are updated by performing the process of FIG. 27 each time the compression process for a symbol pair is performed.

Figure 28:
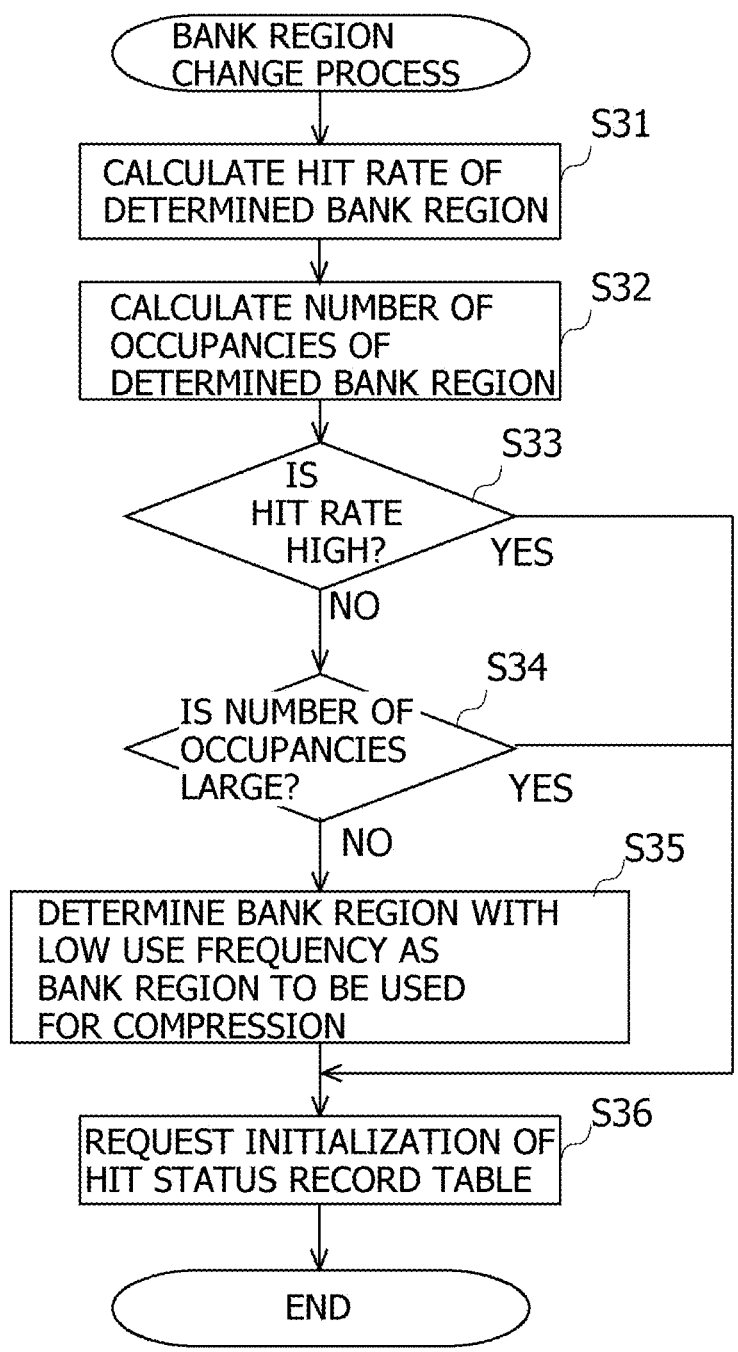
FIG. 28 is a diagram schematically illustrating a modification process of a bank region according to the second embodiment.

If the total number of retrievals in each of the bank regions recorded in the hit status record table 104 becomes the predetermined number of times (e.g., 100 times), the determination unit 102a executes a process to change the bank region 1012 determined using the hash function 1021. FIG. 28 is a diagram schematically illustrating a bank region change process according to the second embodiment. That is, FIG. 28 illustrates an example of the detailed process of step S25 in FIG. 27. The bank region change process will be described below with reference to FIG. 28.

In step S31, the determination unit 102a requests the hit rate calculation unit 105 to calculate the hit rate of the bank region 1012 determined in step S3. With reference to the hit status record table 104, the hit rate calculation unit 105 acquires the number of retrievals and the number of hits of the bank region 1012 determined in step S3. The hit rate calculation unit 105 calculates the hit rate of the bank region 1012 by dividing the number of hits by the acquired number of retrievals.

Next, in step S32, the determination unit 102a requests the number-of-occupancies calculation unit 106 to calculate the number of occupancies in each bank region 1012 in the conversion table 101 including the bank region 1012 determined in step S3. With reference to the conversion table 101, the number-of-occupancies calculation unit 106 calculates, for each bank region 1012, the number of entry regions 1011 in which a record is recorded as the number of occupancies of the bank region 1012.

In step S33, the determination unit 102a compares the hit rate calculated in step S31 with the threshold of hit rate. If the calculated hit rate is higher than the threshold of hit rate (YES in step S33), the process proceeds to S21. If the calculated hit rate is lower than the threshold of hit rate (NO in step S33), the process proceeds to S34. Further, the threshold of hit rate is specified by a user of the data compressor 10, for example, and is stored in the auxiliary storage unit 703.

In step S34, the determination unit 102a compares the number of occupancies calculated in step S32 with the threshold of the number of occupancies. If the calculated number of occupancies is higher than the threshold of the number of occupancies (YES in step S34), the process proceeds to S21. If the calculated number of occupancies is lower than the threshold of the number of occupancies (NO in step S34), the process proceeds to S35. Further, the order of the processes of step S33 and step S34 may be switched. The case in which the processes of both step S33 and step S34 branches to "NO" is an example of "a case in which a predetermined change condition is satisfied".

In step S35, the determination unit 102a determines the bank region 1012 having the lowest number of occupancies calculated in step S32 as a bank region 1012 to be used for the compression process, instead of the bank region 1012 determined in step S3. Furthermore, the determination unit 102a updates the mapping between the calculation result of the hash function 1021 and the bank region 1012 so that the same bank region 1012 is selected when the same data is compressed in the future. In other words, the bank region 1012 is changed for a symbol pair in step S35, and the update is performed such that the calculation result of the hash function 1021 indicates the changed bank region 1012 in step S35 when the symbol pair is input to the hash function 1021. Then, the processes from S21 to S23 are performed. In step S36, the determination unit 102a requests the processing unit 103a to initialize the hit status record table 104. Then, the process proceeds to step S26 of FIG. 27 described above.

Effects of Second Embodiment

According to the second embodiment, a bank region which is less frequently used is also selected, and thus the utilization of the conversion table 101 can be increased. A substantial decrease in the number of records that can be registered in the conversion table 101 can be avoided. Therefore, according to the second embodiment, deterioration in a compression rate can be avoided by using the conversion table 101 divided into a plurality of bank regions.

[Verification]

Figure 29:
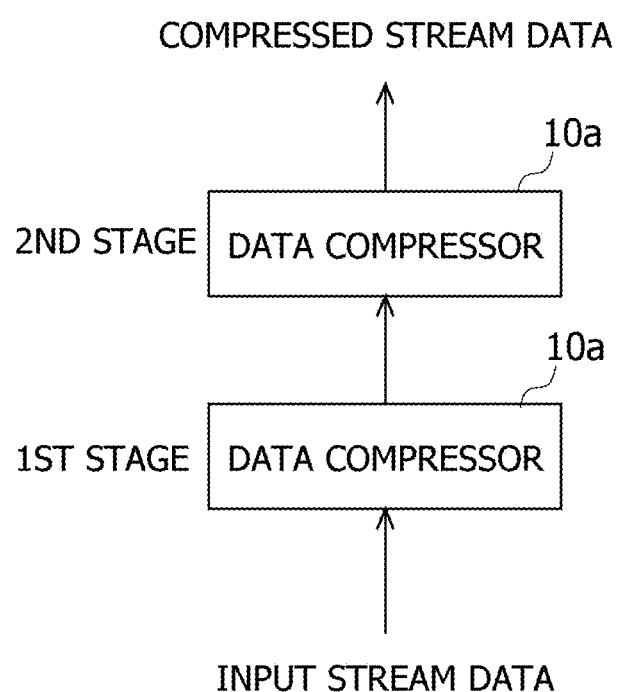
FIG. 29 is a diagram illustrating an example of a configuration in which the data compressors according to the second embodiment are coupled with two-stage configuration.

The effects of the second embodiment were verified, which will be described with reference to the drawings. In the present verification, data compressors 10a having a conversion table 101 with 256 entries in the conversion table and 16 banks (i.e., the number of entries in each bank is 16) were coupled together with two-stage configuration as illustrated in FIG. 29 to perform a compression process.

Figure 30:
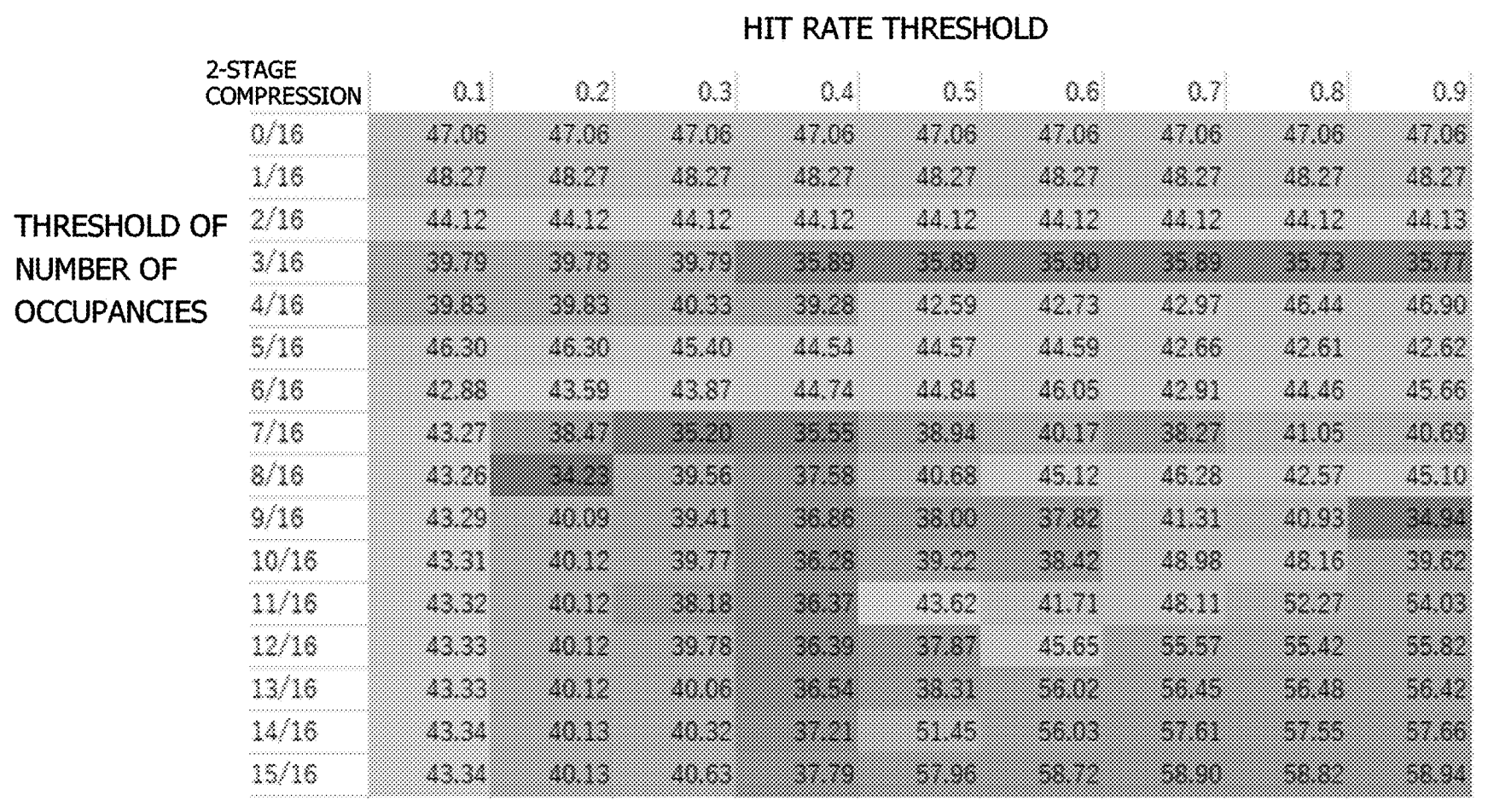

FIG. 30 is a diagram in which compression rates of the data compressor according to the second embodiment are verified while changing a threshold of the hit rate and a threshold of the number of occupancies. In FIG. 30, the vertical axis represents the threshold of the number of occupancies, and the horizontal axis represents the threshold of the hit rate. FIG. 30 illustrates compression rates when DNA structure data having a reduced compression rate in the first embodiment is compressed by the data compressor 10a.

In FIG. 30, it can be seen that, when the threshold of the hit rate and the threshold of the number of occupancies are properly selected, the compression rate of the DNA structure data is approximately 34%, which is improved from the compression rate of approximately 47% of the DNA structure data of the first embodiment (see FIG. 22). In other words, according to the second embodiment, by setting the threshold of the hit rate and the threshold of the number of occupancies to appropriate values, it is possible to increase the compression rate of the data of the type whose compression rate is low in the first embodiment.

In the second embodiment, although the number-of-occupancies calculation unit 106 calculates the number of occupancies in each of the bank regions 1012, the number-of-occupancies calculation unit 106 may calculate an occupancy rate which is the rate of the number of entry regions 1011 in which records are stored to the number of entry regions 1011 of the bank region 1012, instead of calculating the number of occupancies. Even when the bank regions 1012 have different numbers of entry regions, using an occupancy rate makes it easy to compare the utilizations of the entry regions 1011 between the bank regions 1012. When the occupancy rate is calculated, a threshold of occupancy rate may be employed instead of the threshold of the number of occupancies. The threshold of the number of occupancies and the threshold of occupancy rate are an example of "a first threshold of occupancy rate".

Third Embodiment

In the first embodiment and the second embodiment, the maximum number of entries that can be registered in each bank of the conversion table is not changed. In the third embodiment, a configuration in which the maximum number of entries in the bank region is changed based on an occupancy rate, which is the rate of the number of entries actually used to a hit rate and a maximum number of entries used in the second embodiment will be described.

Figure 31:
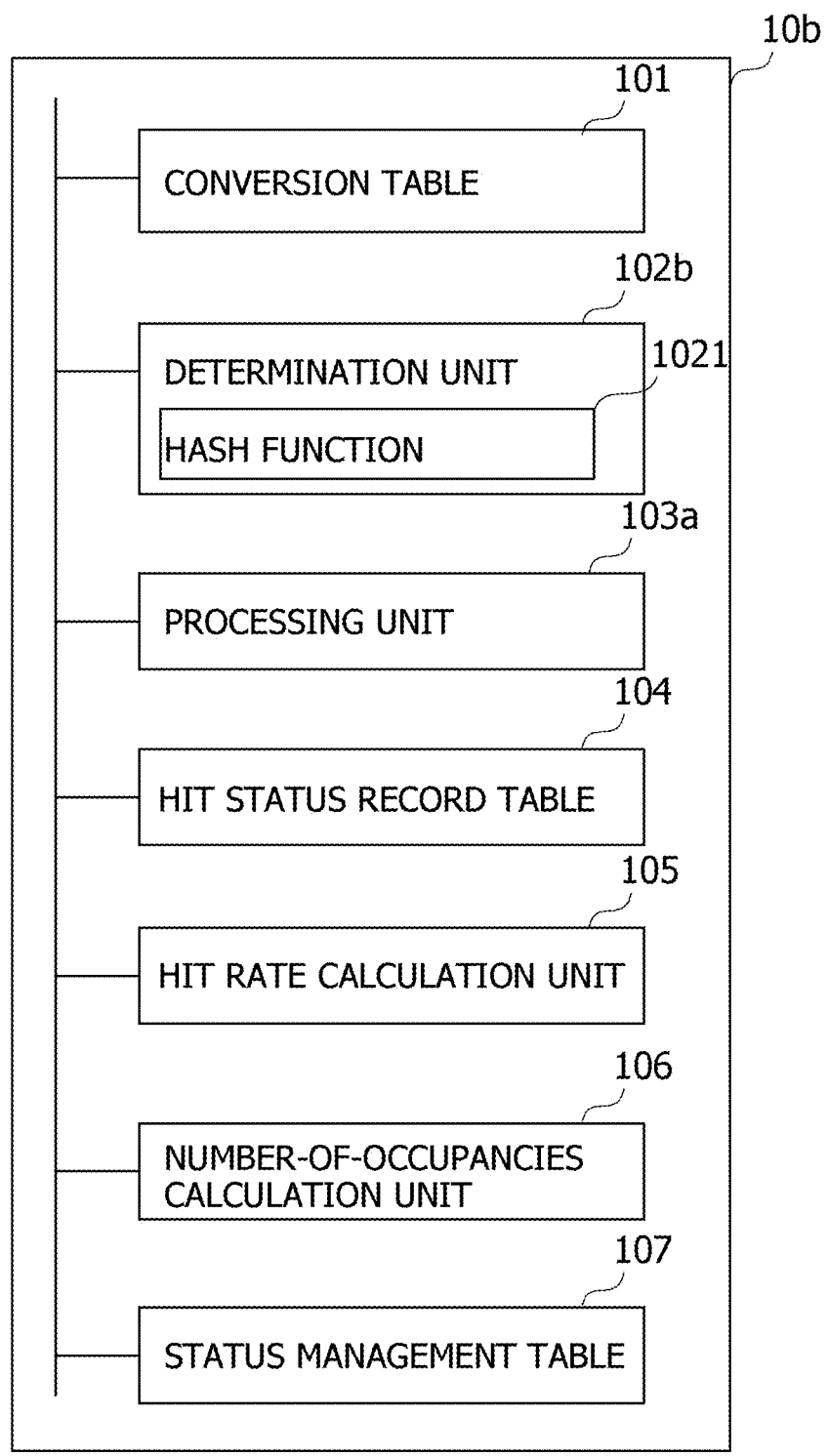
FIG. 31 is a diagram illustrating an example of a data compressor according to a third embodiment.

FIG. 31 is a diagram illustrating an example of a data compressor according to a third embodiment. A data compressor 10b according to the third embodiment differs from the data compressor 10a according to the second embodiment in that the data compressor 10b includes a determination unit 102b and a status management table 107.

The status management table 107 stores information indicating whether the determination unit 102b is in a state of dividing or integrating bank regions 1012 as illustrated in FIG. 32. The status management table 107 further stores a division/integration threshold which is a threshold for transitioning between a state of division and a state of integration. The division/integration threshold can be specified, for example, when a user inputs a value using a keyboard, or the like. The status management table 107 is provided, for example, in the auxiliary storage unit 703.

Although details will be described below, the determination unit 102b further performs a process of reducing the maximum number of entries of a bank region 1012 by dividing one bank region 1012 into two or increasing the maximum number of entries of a bank region 1012 by integrating two bank regions 1012 into one based on a hit rate and an occupancy rate of the bank region 1012 and further whether the "status" stored in the status management table 107 is division or integration.

FIG. 33 is a diagram schematically illustrating division of a bank region according to the third embodiment. In FIG. 33, the records registered in entry regions 1011 are schematically expressed as "AA" and "BB". In FIG. 33, the bank region 1012 having six entry regions 1011 is divided into bank regions 1012 each having three entry regions 1011. Each of the records "AA" and "BB" that are registered before the division are registered, for example, in the first entry region 1011 of each of the divided bank regions 1012.

On the other hand, FIG. 34 is a diagram schematically illustrating integration of bank regions according to the third embodiment. In FIG. 34, the records registered in the entry regions 1011 are schematically expressed as "AA", "BB", "CC", and "DD". In FIG. 34, the two bank regions 1012 each having three entry regions 1011 are integrated to one bank region 1012 having six entry regions 1011. The records that are registered before the integration are registered in the consecutive entry regions 1011 starting from the first entry region 1011 of the integrated bank region 1012.

If a bank region 1012 is divided to reduce the maximum number of entries of the bank region 1012, the time for searching the bank regions 1012 one by one can be shortened, and thus it is possible to prevent a retrieving process from taking a longer time. Furthermore, if the maximum number of entries of a bank region 1012 is increased by integrating two bank regions 1012, the number of entries that can be registered in the bank region 1012 increases, which raises a probability of hits, and thus a compression rate can be increased. In other words, for such division and integration of the bank regions 1012, in a case that it is desired to increase a processing speed, a condition for accelerating division of a bank region 1012 is set, and in a case that it is desired to increase a compression rate, a condition for accelerating integration of bank regions 1012 is set. To control such a condition, the determination unit 102b performs division and integration of the bank regions 1012 in accordance with a status transition model which will be described below.

Figure 35:
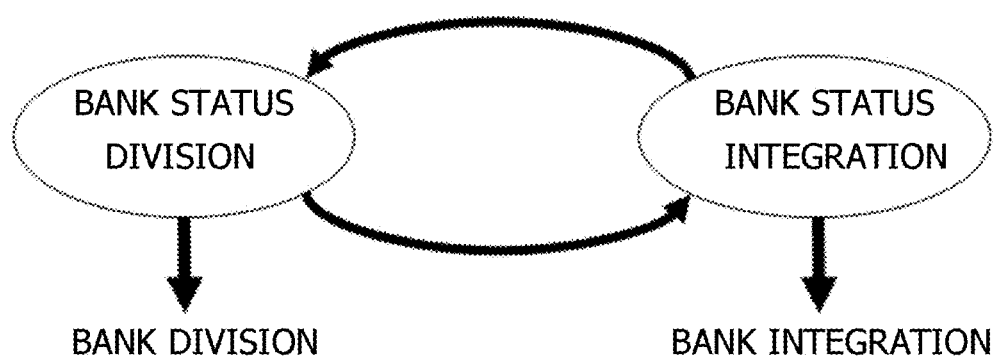
FIG. 35 is a diagram schematically illustrating a status transition model.

FIG. 35 is a diagram schematically illustrating a status transition model. The status transition model illustrated in FIG. 35 has a "divided" state and an "integrated" state. Based on an amount of change in the hit rate, the determination unit 102b transitions to either the "divided" or "integrated" state and causes the current state to be stored in the status management table 107. The determination unit 102b divides the bank regions 1012 if the current state is "divided" and the condition for dividing the bank regions 1012 is satisfied, and integrates the bank regions 1012 if the current state is "integrated" and the condition for integrating the bank regions 1012 is satisfied.

Figure 36:
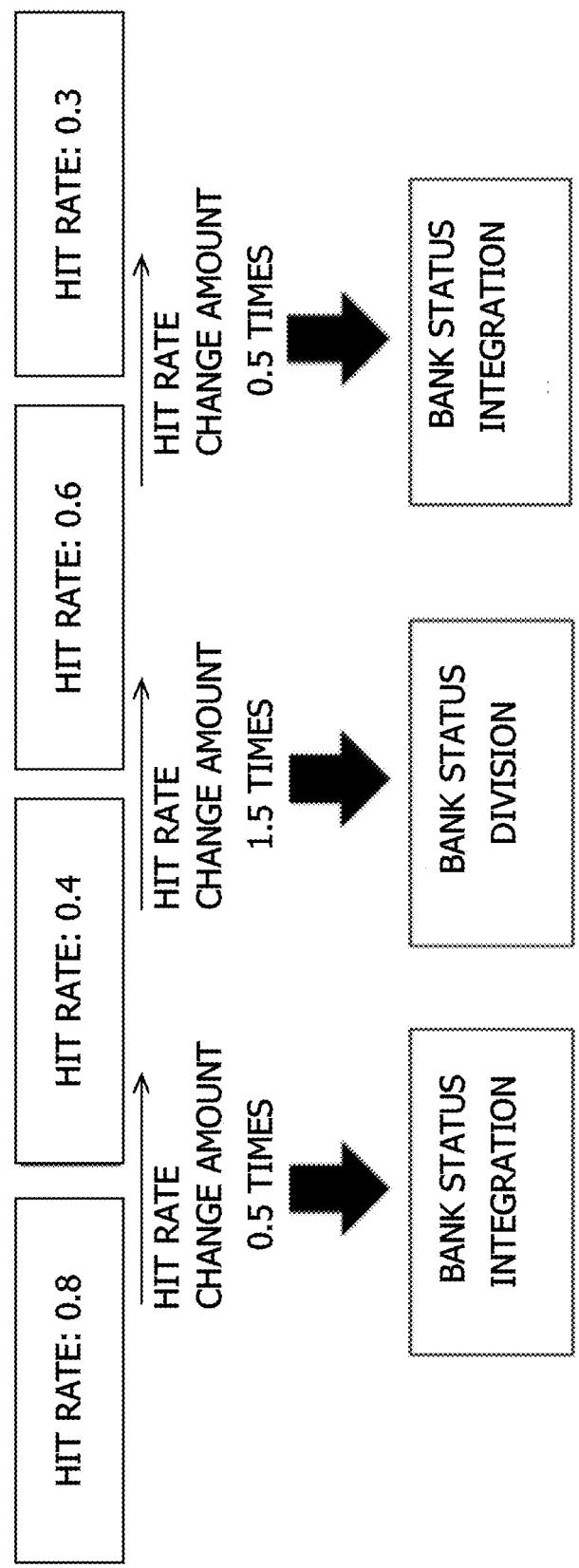
FIG. 36 is a diagram illustrating an example of the flow of change in hit rate and division and integration of bank regions.

Specifically, the determination unit 102b transitions to the "divided" state if the amount of change in the hit rate is equal to or greater than the division/integration threshold stored in the status management table 107, and transitions to the "integrated" state if the amount of change in the hit rate is less than the division/integration threshold. FIG. 36 is a diagram illustrating an example of the flow of changes in hit rates and division and integration of bank regions. In FIG. 36, a transition of hit rates and integration and division states of bank regions 1012 for a bank region 1 are illustrated, for example. In FIG. 36, it is assumed that "1.0" is given as a division/integration threshold. With reference to FIG. 36, first, the hit rate of the bank region 1 changes from "0.8" to "0.4". Because the amount of change in the hit rates is "0.5" times, the amount of change in the hit rates is less than the division/integration threshold. Thus, the determination unit 102b transitions to the "integrated" state and stores the "integrated" state as the current state in the status management table 107. Subsequently, the hit rate of the bank region 1 changes from "0.4" to "0.6". Because the amount of change in the hit rates is "1.5" times, the amount of change in the hit rates is equal to or greater than the division/integration threshold. Thus, the determination unit 102b switches the state to "divided" and stores the "divided" state as the current state in the status management table 107. Subsequently, the hit rate of the bank region 1 changes from "0.6" to "0.3". Because the amount of change in the hit rates is "0.5" times, the amount of change in the hit rates is less than the division/integration threshold. Thus, the determination unit 102b transitions to the "integrated" state and stores the "integrated" state as the current state in the status management table 107.

Figure 37:
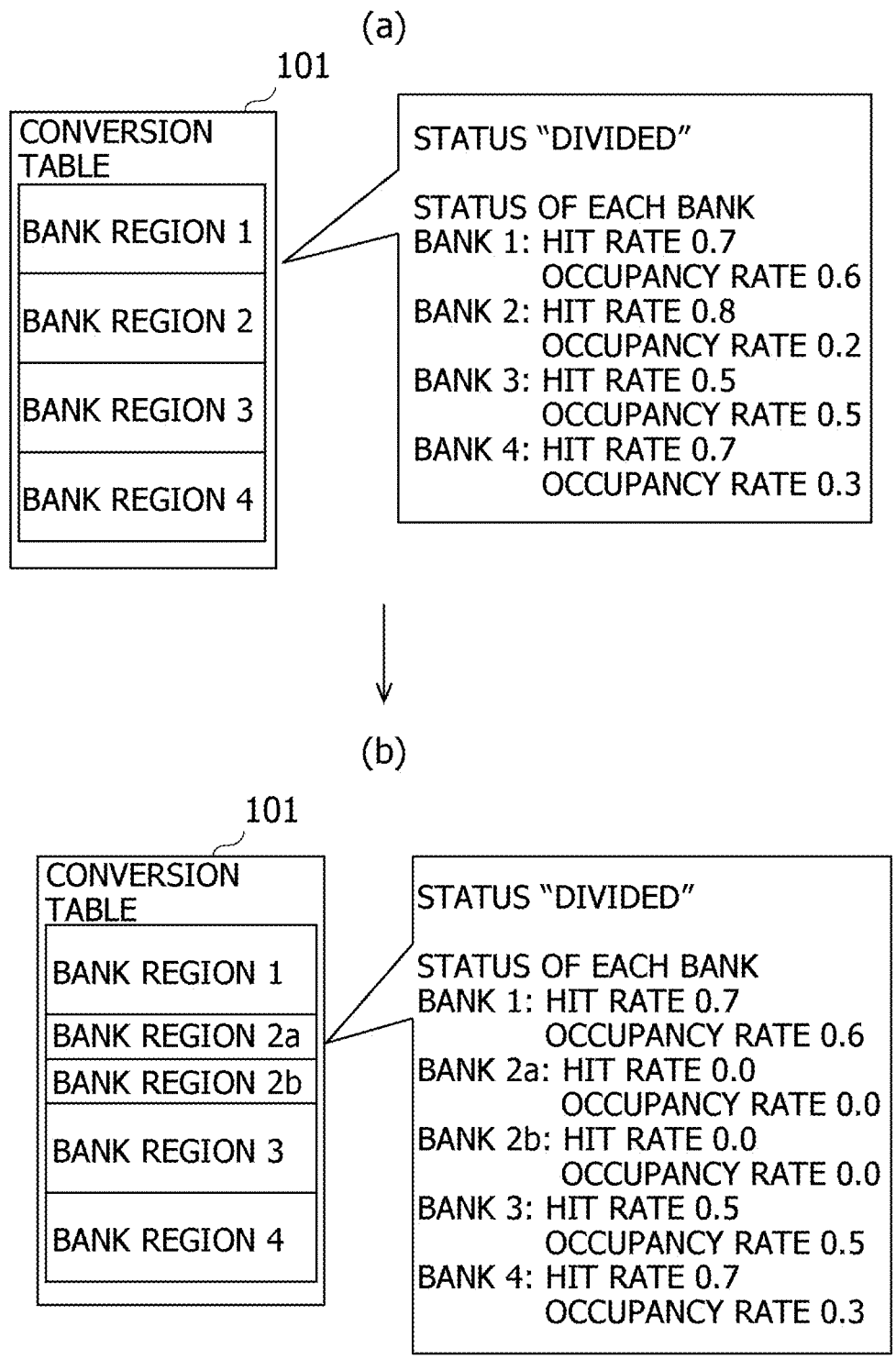
FIG. 37 is a first diagram schematically illustrating division and integration of bank regions according to the third embodiment.

The process of dividing the bank regions 1012 and integrating the bank regions 1012 by employing the status transition model described above will be further described. FIGS. 37 and 38 are diagrams schematically illustrating the division the bank region 1012 and the integration of the bank regions 1012 according to the third embodiment. In FIGS. 37 and 38, the division condition for dividing the bank region 1012 is a hit rate of "0.4" or higher and an occupancy rate of "0.6" or higher. The integration condition for integrating the bank regions 1012 is an occupancy rate of "1.0" and an occupancy rate of a bank allocated next to the bank is "0.6" or lower. In the division condition, the hit rate "0.4" is an example of a second threshold of hit rate, and the occupancy rate "0.6" is an example of a second threshold of occupancy rate. In the integration condition, the occupancy rate "1.0" is an example of a third threshold of occupancy rate, and the occupancy rate "0.6" is an example of a fourth threshold of occupancy rate.

FIG. 37 is a diagram illustrating an example of a process of dividing, by the determination unit, the bank region in a case that the state is "divided". FIG. 37(a) illustrates a state before the bank region 1012 is divided, and FIG. 37(b) illustrates a state after the bank region 1012 is divided. Because the state is "divided", the determination unit 102b divides the bank region 1012 if the above-described division condition is satisfied. In FIG. 37(a), the hit rate of the bank region 2 is "0.8", the occupancy rate is "0.2", and thus the division condition described above is satisfied. Thus, when the determination unit 102b selects the bank region 2 using the hash function 1021 in the compression processing, the determination unit 102b divides the bank region 2, and the conversion table 101 transitions to the state illustrated in FIG. 37(b). In FIG. 37(b), the bank region 2 is divided into a bank region 2a and a bank region 2b. Both the bank region 2a and the bank region 2b obtained by dividing the bank region 2 may be in a state in which no entry is registered, and the hit rate and the occupancy rate of the bank region 2a and the bank region 3b may be initialized to "0".

FIG. 38 is a diagram illustrating an example of a process of the determination unit to integrate the bank regions in a case that the state is "integrated". FIG. 38(a) illustrates a state before the bank regions 1012 are integrated, and FIG. 38(b) illustrates a state after the bank regions 1012 are integrated. Because the state is "integrated", the determination unit 102b integrates the banks if the above-described integration condition is satisfied. In FIG. 38(a), the occupancy rate of the bank region 3 is "1.0", the occupancy rate of the bank region 4 that is a neighboring bank region of the bank region 3 is "0.3", and thus the integration condition described above is satisfied. Thus, when the determination unit 102b selects the bank region 3 using the hash function 1021 in the compression processing, the determination unit 102b integrates the bank region 3 with the bank region 4, and the conversion table 101 transitions to the state illustrated in FIG. 38(b). In FIG. 38(b), the bank region 3 and the bank region 4 are integrated to form a bank region 3a. The bank region 3a generated by the integration of the bank region 3 and the bank region 4 may be in a state in which no entry is registered, and a hit rate and an occupancy rate of the bank region 3a may be initialized to "0".

Figure 39:
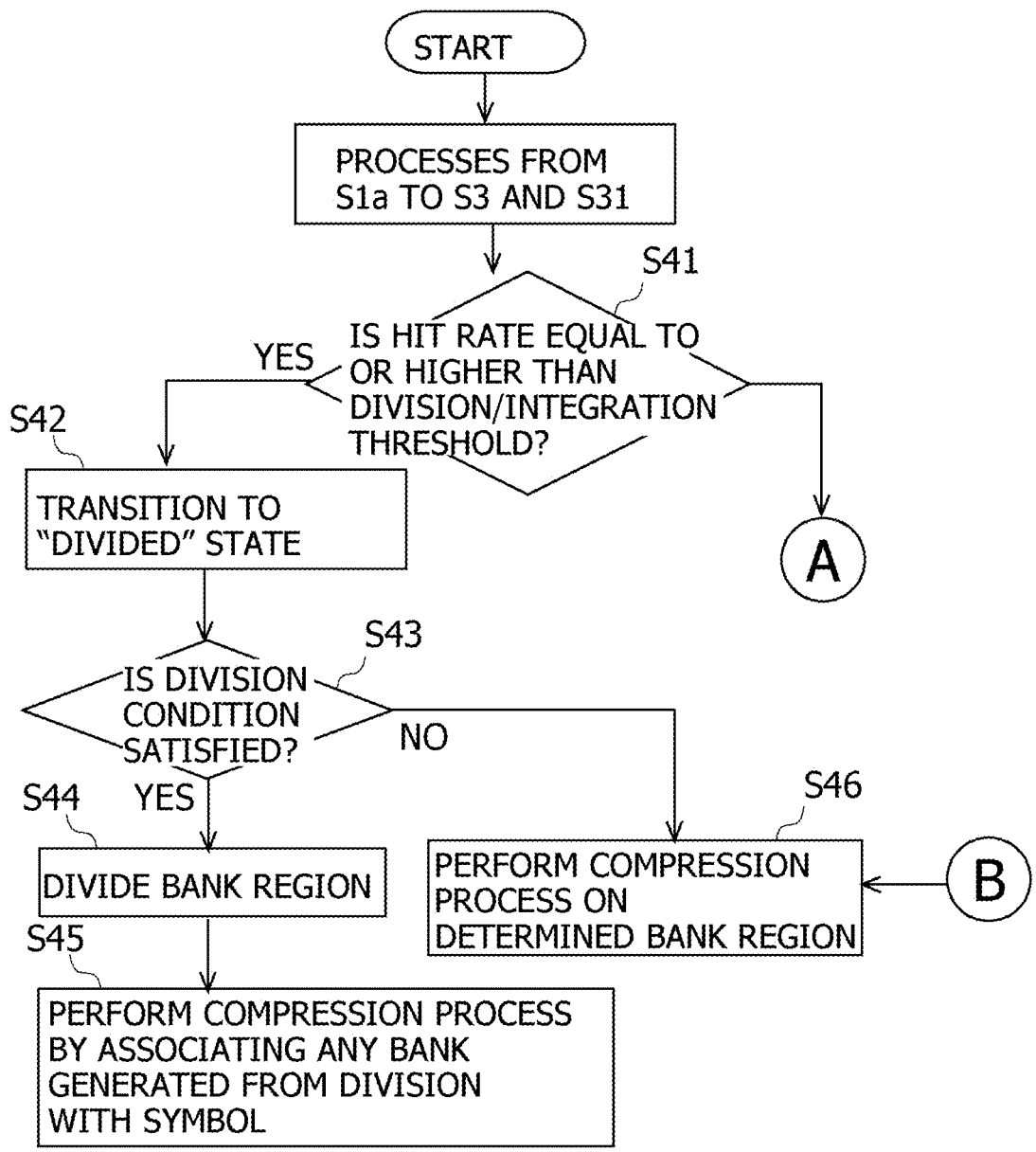
FIG. 39 is a first diagram schematically illustrating a process flow of the third embodiment.
Figure 40:
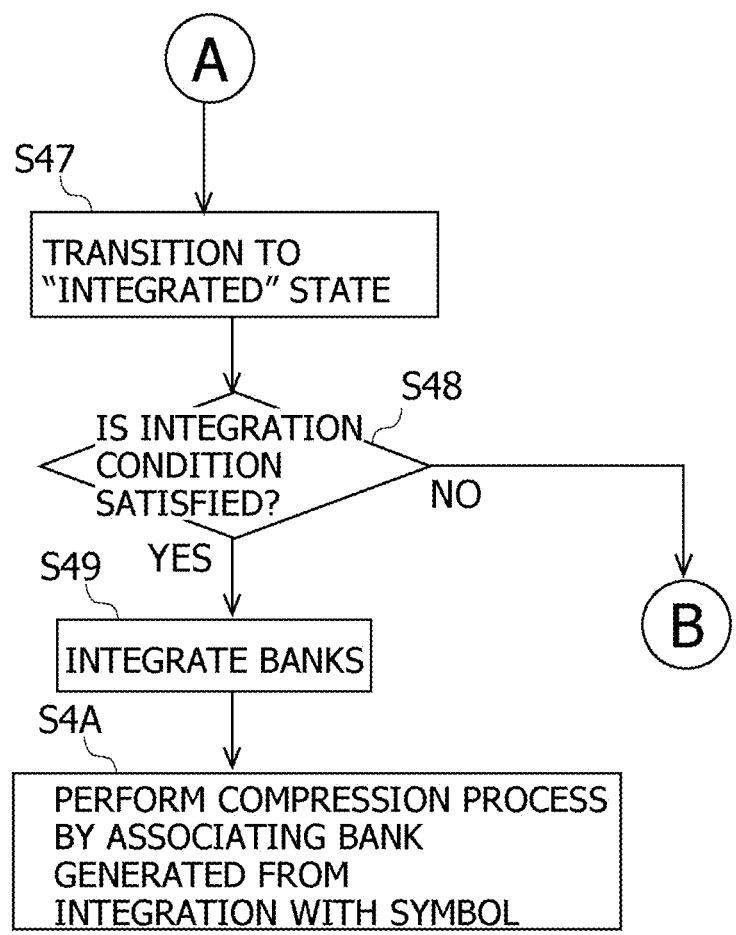
FIG. 40 is a second diagram schematically illustrating a process flow of the third embodiment.

FIGS. 39 and 40 are diagrams schematically illustrating a process flow of the third embodiment. The "A" of FIG. 39 proceeds to "A" of FIG. 40, and "B" of FIG. 40 proceeds to "B" of FIG. 39. The same processes as those in the first and second embodiments are given the same reference numerals, and descriptions thereof will be omitted. The process flow of the third embodiment will be described below with reference to FIGS. 39 and 40.

In step S41, if the determination unit 102b determines that the hit rate calculated in step S31 is equal to or higher than the division/integration threshold (YES in step S41), the process proceeds to step S42. On the other hand, if the calculated hit rate is less than the division/integration threshold (NO in step S41), the process proceeds to step S47.

In step S42, the determination unit 102b switches the state to "divided" and stores the "divided" state as the current state in the status management table 107. If the bank region 1012 determined in step S3 satisfies the division conditions (YES in step S43), the process proceeds to step S44 to divide the bank region 1012. On the other hand, if the bank region 1012 determined in step S3 does not satisfy the division conditions (NO in step S43), the process proceeds to step S46. In step 42, because the state stored in the status management table 107 is "divided", integration of the bank region 1012 will not be performed even if the bank region 1012 determined in step S3 satisfies the integration conditions.

In step S44, the determination unit 102b divides the bank region 1012 determined in step S3, as illustrated in FIG. 33. In step S45, the determination unit 102b associates any bank region 1012 generated from the division with part of the data input in step S3 in the hash function 1021. The determination unit 102b performs a compression process using the associated bank region 1012.

In step S46, the determination unit 102b performs the compression processing using the bank determined in step S3.

In step S47, the determination unit 102b switches the state to "integrated" and stores the "integrated" state as the current state in the status management table 107. In step S48, the determination unit 102b determines whether the bank region 1012 determined in step S3 satisfies the integration conditions. If the integration condition is satisfied (YES in step S48), the process proceeds to S49 to integrate the bank region 1012. On the other hand, if the integration condition is not satisfied (NO in step S48), the process proceeds to S34. In step 48, because the state stored in the status management table 107 is "integrated", division of the bank region 1012 will not be performed even if the bank region 1012 determined in step S3 satisfies the division condition.

In step S49, the determination unit 102b integrates the bank region 1012 that satisfies the integration condition. In step S4A, the determination unit 102b associates the bank region 1012 generated from the integration with part of the data input in step S3 in the hash function 1021. The determination unit 102b performs a compression process using the associated bank region 1012.

The verified effects of the third embodiment will be described with reference to the drawings. In the present verification, the data compressors 10b having the conversion table 101 with 256 entries in the conversion table were coupled with two-stage configuration as illustrated in FIG. 29, and the division/integration threshold given to the data compressors 10b was changed from "1.5" to "0.5" to verify the processing speed and compression rate of the compression process. In addition, in the verification, six types of data including DNA structure data, XML data, MIDI data, protein structure data, source codes, and English text data were verified, similarly to the verification in the first embodiment.

Figure 41:
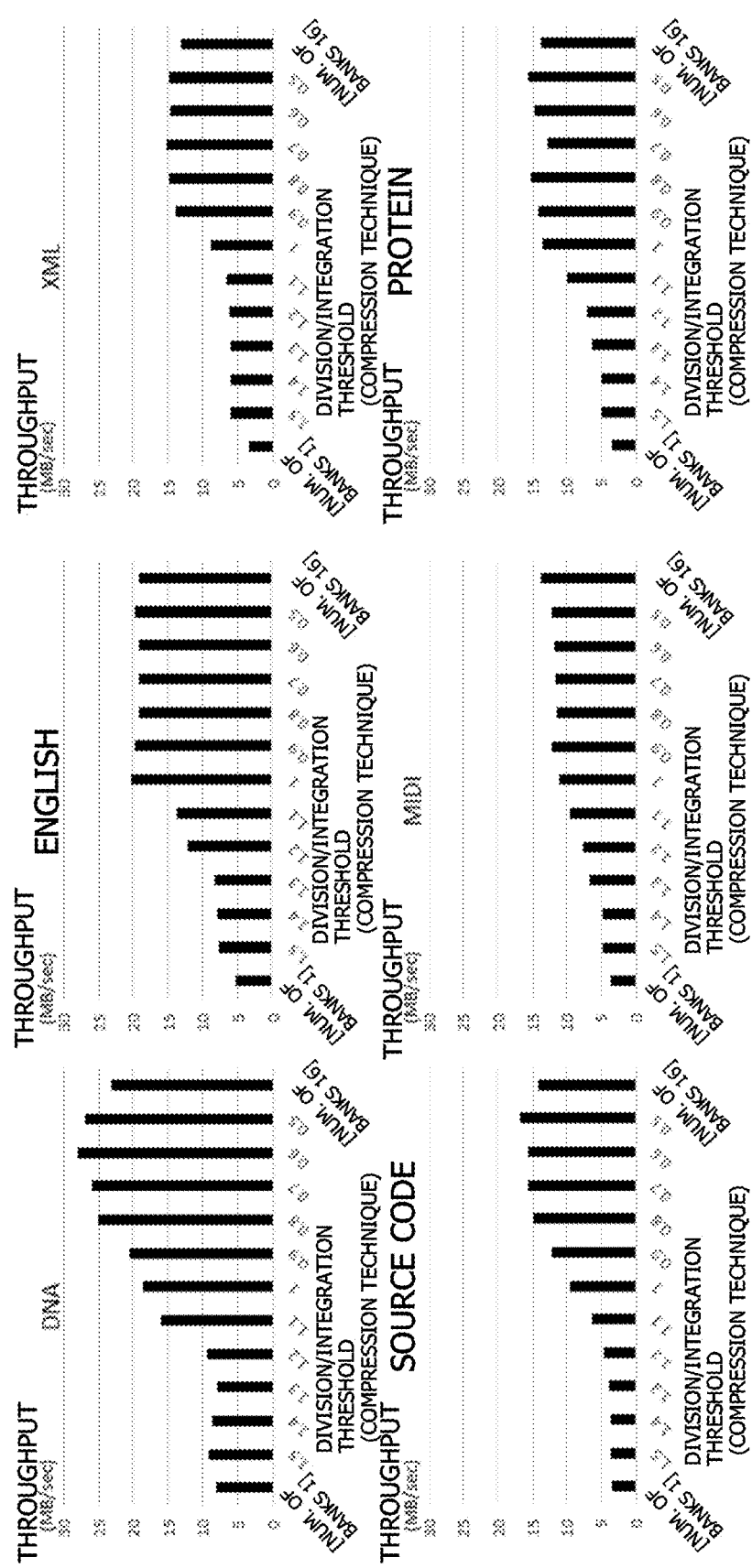
FIG. 41 is a diagram in which processing speeds of the data compressor according to the third embodiment are verified.

FIG. 41 is a diagram in which processing speeds of the data compressor according to the third embodiment are verified. In FIG. 41, the vertical axes represent processing speed (throughput) and the horizontal axes represent division/integration threshold. For comparison, on the horizontal axis, the verification result in a case that the conversion table is not divided is provided at the left end, and the verification result in a case that the number of banks is fixed to 16 is provided at the right end. With reference to FIG. 41, it can be understood that the processing speed improves as the division/integration threshold becomes lower. The reason for this is thought that, if the division/integration threshold is set to a lower value, the state is likely to transition to "divided" and thus the division of each bank is accelerated.

Figure 42:
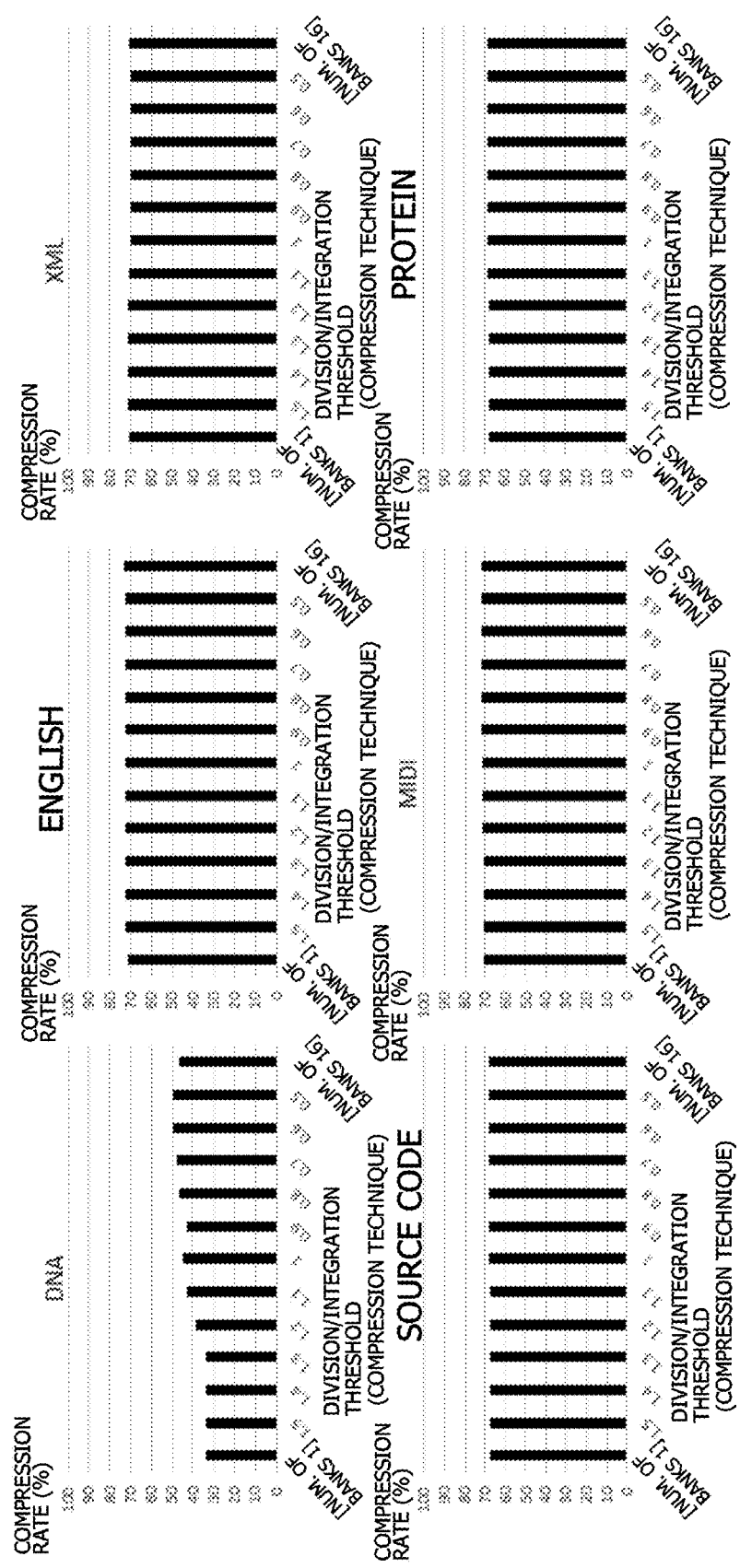
FIG. 42 is a diagram in which compression rates of the data compressor according to the third embodiment are verified.

FIG. 42 is a diagram in which compression rates of the data compressor according to the third embodiment are verified. In FIG. 42, the vertical axes represent compression rate and the horizontal axes represent division/integration threshold. For comparison, on the horizontal axis, the verification result in a case that the conversion table is not divided is provided at the left end, and the verification result in a case that the number of banks is fixed to 16 is provided at the right end. With reference to FIG. 42, it can be understood that the compression rate improves as the division/integration threshold becomes higher. The reason for this is thought that, if the division/integration threshold is set to a high value, the state is likely to transition to "integrated" and thus the division of each bank is accelerated. Also, with reference to FIG. 42, it can be understood that the compression rate of the DNA structure data that has deterioration in the compression rate in the first embodiment does not deteriorate. That is, according to the third embodiment, by specifying the division/integration threshold, it is possible for a user to select one of the processing speed and the compression rate to be prioritized while curbing deterioration in the compression rate.

Figure 43:
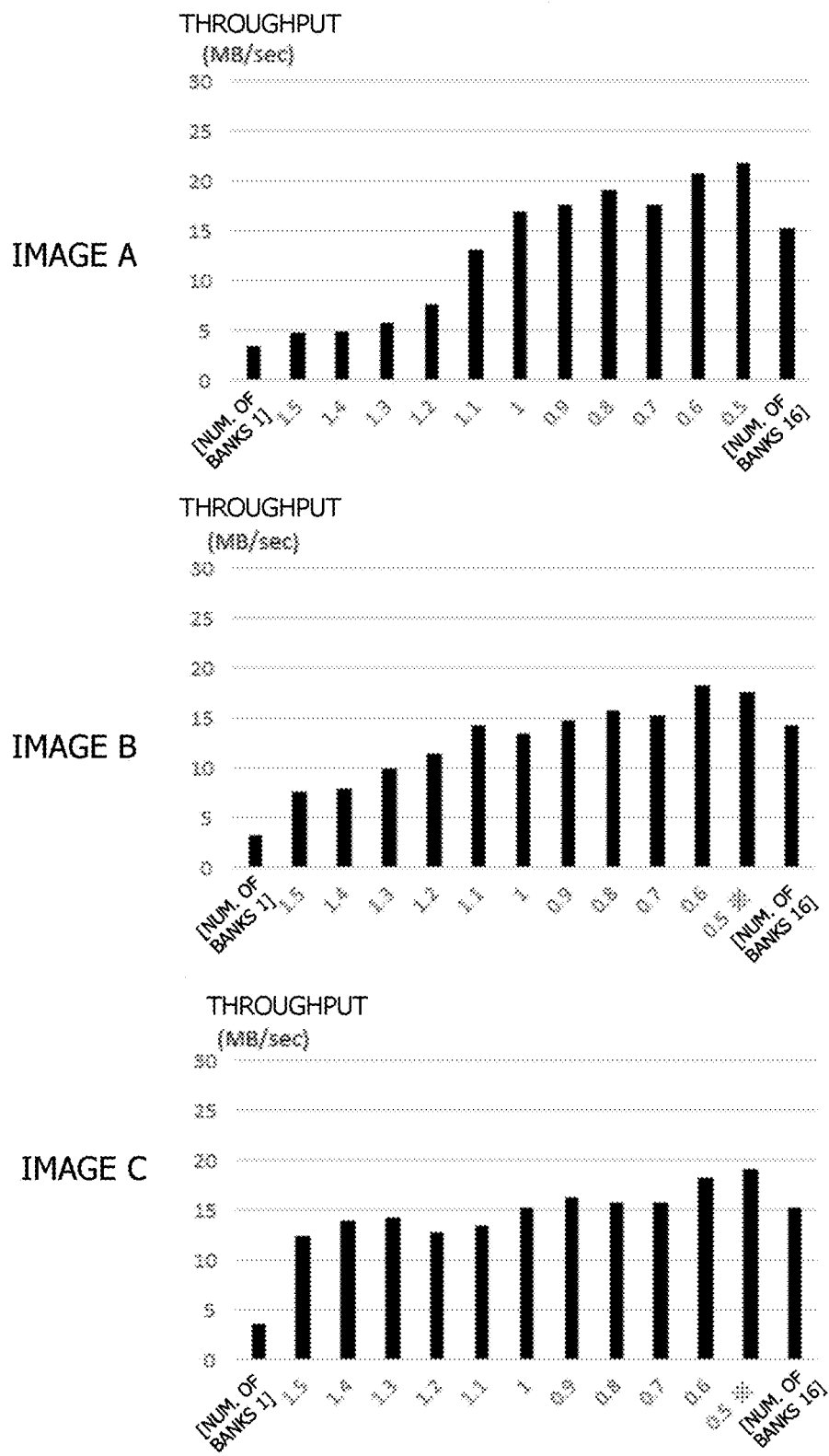
FIG. 43 is a diagram in which processing speeds are verified when the data compressor according to the third embodiment compresses three types of 4K images including an image A, an image B, and an image C.

Furthermore, in the third embodiment, a case in which multimedia data is compressed is verified. FIG. 43 is a diagram in which processing speeds are verified when the data compressor according to the third embodiment compresses three types of 4K images (about 4000 pixels in height and about 2000 pixels in width) including an image A, an image B, and an image C. In FIG. 43, the vertical axes represent processing speed (throughput) and the horizontal axes represent division/integration threshold. For comparison, on the horizontal axis, the verification result in a case that the conversion table is not divided is provided at the left end, and the verification result in a case that the number of banks is fixed to 16 is provided at the right end. With reference to FIG. 43, it can be understood that the processing speed improves as the division/integration threshold becomes lower, similarly to the other six types of data verified above even when the compression process is performed on the 4K image data.

Figure 44:
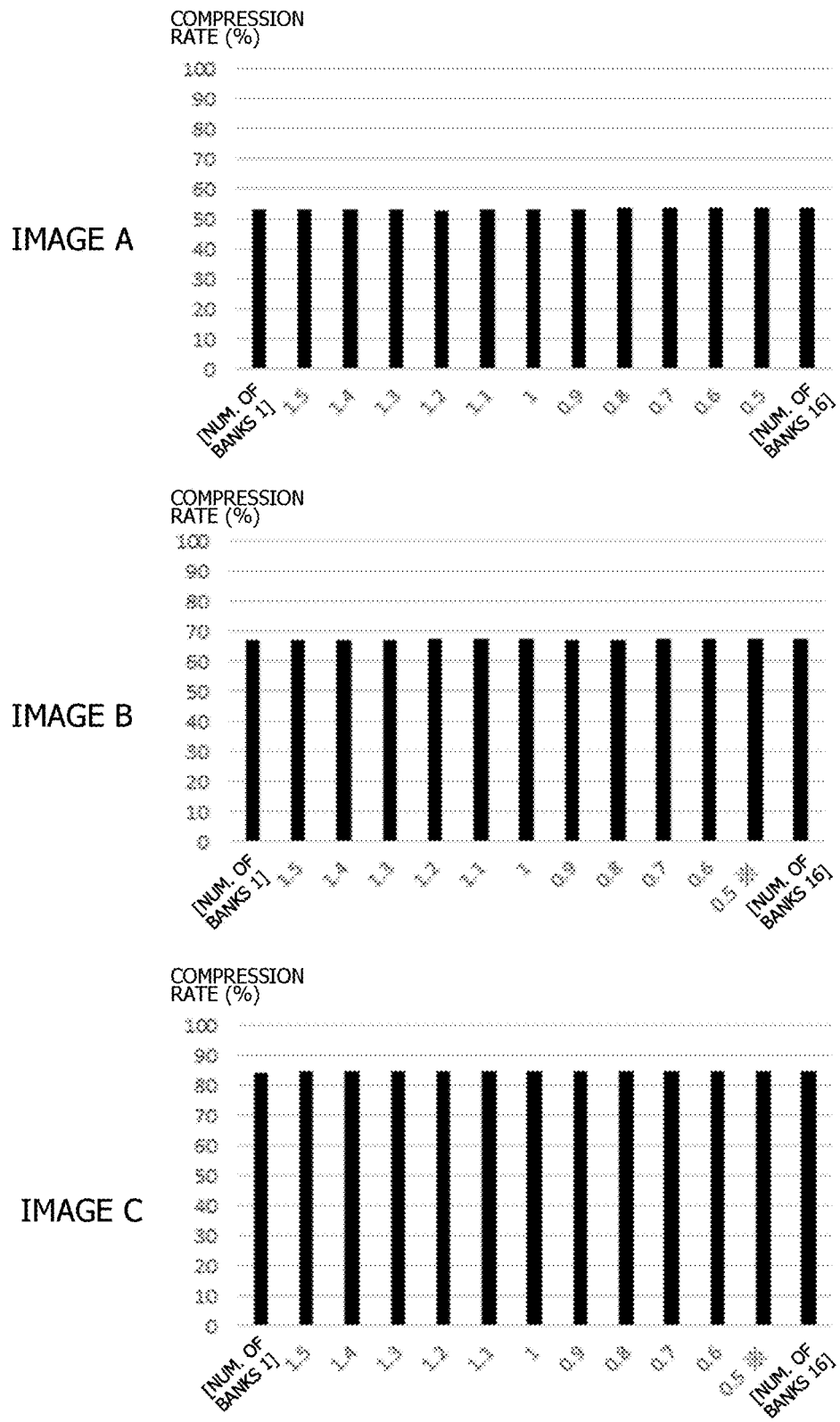
FIG. 44 is a diagram in which compression rates are verified when the data compressor according to the third embodiment compresses the three types of 4K images including the image A, the image B, and the image C.

FIG. 44 is a diagram in which compression rates are verified when the data compressor according to the third embodiment compresses the three types of 4K images (about 4000 pixels in height and about 2000 pixels in width) including the image A, the image B, and the image C. In FIG. 44, the vertical axes represent compression rate and the horizontal axes represent division/integration threshold. For comparison, on the horizontal axis, the verification result in a case that the conversion table is not divided is provided at the left end, and the verification result in a case that the number of banks is fixed to 16 is provided at the right end. With reference to FIG. 44, it can be understood that the processing speed improves as the division/integration threshold becomes higher, similarly to the other six types of data verified above even when the compression process is performed on the 4K image data.

Effects of Third Embodiment

In the third embodiment, the bank region 1012 is divided based on the hit rate and the occupancy rate. By dividing the bank region 1012, the number of entry regions 1011 of the divided bank region 1012 decreases as illustrated in FIG. 33. In other words, the range in which the processing unit 103a searches the entry regions one by one can be narrowed. Thus, according to the third embodiment, it is possible to prevent the retrieval process of searching the entry regions in the conversion table 101 one by one in the compression process from taking a longer time.

In the third embodiment, when the bank region 1012 is divided, the records registered before the division are registered sequentially from the first entry region of the divided bank region 1012 as illustrated in FIG. 33. Thus, for example, according to the example of FIG. 33, "BB" registered in the second entry region 1011 before the division is registered in the first entry region 1011 in the divided bank region 1012. Thus, "BB" can be retrieved in a shorter time than before the division.

In the third embodiment, when two bank regions 1012 are integrated, they are integrated such that one bank region 1012 is allocated and another bank region 1012 is allocated after the one bank region 1012. The reason for this is that the bank regions 1012 are allocated in order of addresses as described above, and thus the addresses of neighboring bank regions 1012 are continuous. Such an integration allows, even after integration, a retrieval of the records registered in the one bank region 1012 (in the example of FIG. 34, "AA", "BB", and "CC") to be prevented from taking a longer time than before integration because no records are registered before the one bank region 1012.

Fourth Embodiment

In the first to third embodiments, the example is described that allows the entry regions 1011 of the bank region 1012 to be searched one by one by implementing the search process of the conversion table in the data compressor 10 by using software. However, implementing the search process for the conversion table 101 in the data compressor 10 by using hardware allows a predetermined number of entry regions 1011 to be collectively searched. In a fourth embodiment, a configuration will be described that allows a predetermined number of entry regions 1011 in a bank region 1012 to be collectively searched by implementing the search process of the conversion table 101 in the data compressor by using hardware.

Figure 45:
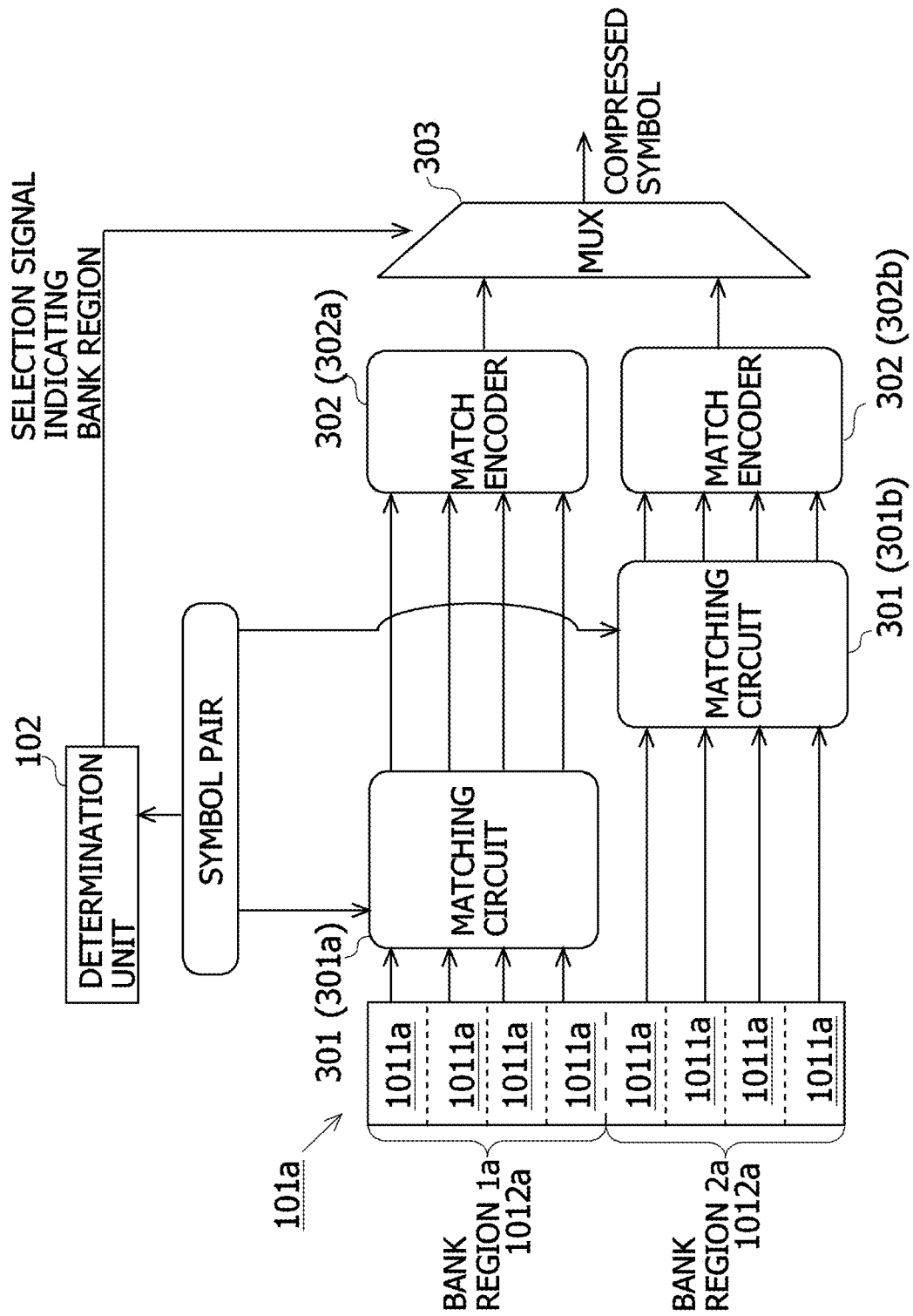
FIG. 45 is a diagram schematically illustrating an entry region search circuit of a data compressor according to a fourth embodiment.

FIG. 45 is a diagram schematically illustrating an entry region search circuit of a data compressor according to the fourth embodiment. The entry region search circuit of the data compressor according to the fourth embodiment includes a conversion table 101a, a matching circuit 301, a match encoder 302, and a multiplexer 303 (denoted by MUX in the diagram). In FIG. 45, a determination unit 102 is also illustrated.

The conversion table 101a is a conversion table implemented by a hardware circuit. In the example of FIG. 45, the conversion table 101a includes two bank regions 1012a. In a case that the bank regions 1012 are distinguished from each other, the bank regions will also be referred to as a bank region 1a and a bank region 2a in order of addresses. Each of the bank regions 1012a has four entry regions 1011a.

The matching circuits 301 (301a and 301b) are circuits provided in association with each bank region 1012a. In FIG. 45, the matching circuit 301a is associated with the bank region 1a, and the matching circuit 301b is associated with the bank region 2a. The matching circuits 301 output a signal indicating 1 for the entry region 1011a that matches the input symbol pair, and output a signal indicating 0 for an entry region 1011a that does not match the input symbol pair.

The match encoders 302 (302a and 302b) are circuits provided in association with the matching circuits 301. In FIG. 45, the match encoder 302a is associated with the matching circuit 301a, and the match encoder 302b is associated with the matching circuit 301b. The match encoders 302 encode signal sequences input from the matching circuits 301 to an output value indicated in binary numbers and output the output value. In the fourth embodiment, the bank region 1012a includes four entry regions 1011a. Thus, the signal sequences output from the matching circuits 301 have four patterns of "0001", "0010", "0100", and "1000". To express the signal sequences of the four patterns in binary numbers, two-digit binary numbers may be used. Thus, the match encoders 302 according to the fourth embodiment have a four-input two-output circuit.

FIG. 46 is a diagram illustrating an example of a correspondence between the input signal sequence input from the matching circuit and the output value output by the match encoders in the fourth embodiment. With reference to FIG. 46, it can be understood that, for example, when a signal sequence "0100" is input from the matching circuits 301, the match encoders 302 convert the sequence to an output value "10" and output the output value.

The multiplexer 303 is a circuit that selects and outputs any of the input signals from the match encoders 302a and 302b based on a selection signal input from the determination unit 102 indicating a bank region to be used for compression. In the fourth embodiment, the output signals of the multiplexer 303 are compressed symbols. When a selection signal indicating the bank region 1a is input from the determination unit 102, for example, the multiplexer 303 selects an input signal from the match encoder 302a and outputs the selected signal. In the fourth embodiment, the output of the multiplexer 303 is the compressed symbol.

In the fourth embodiment in which the configuration is described above, a symbol pair is input to the determination unit 102 and the matching circuits 301a and 301b. The determination unit 102 determines the bank region 1012a to be used for compression based on the input symbol pair, and outputs a selection signal indicating the determined bank region 1012a to the multiplexer 303. The matching circuits 301a and 301b output a signal indicating 1 for the entry region 1011a that matches the symbol pair, and output a signal indicating 0 for an entry region 1011a that does not matches the symbol pair to the match encoders 302a and 302b. The match encoders 302a and 302b encode the input signals to binary numbers and output the binary numbers to the multiplexer 303. The multiplexer 303 selects and outputs any of the input signals from the match encoders 302a and 302b based on the selection signal input from the determination unit 102, and performs the compression process on the symbol pair.

Further, although the determination unit 102 determines the bank region 1012a in FIG. 45, the process for selecting the bank region 1012a according to the fourth embodiment is not limited to the form of execution by the determination unit 102. The process for selecting the bank region 1012a according to the fourth embodiment may be any form of process disclosed in the first to third embodiments.

Comparative Example

Figure 47:
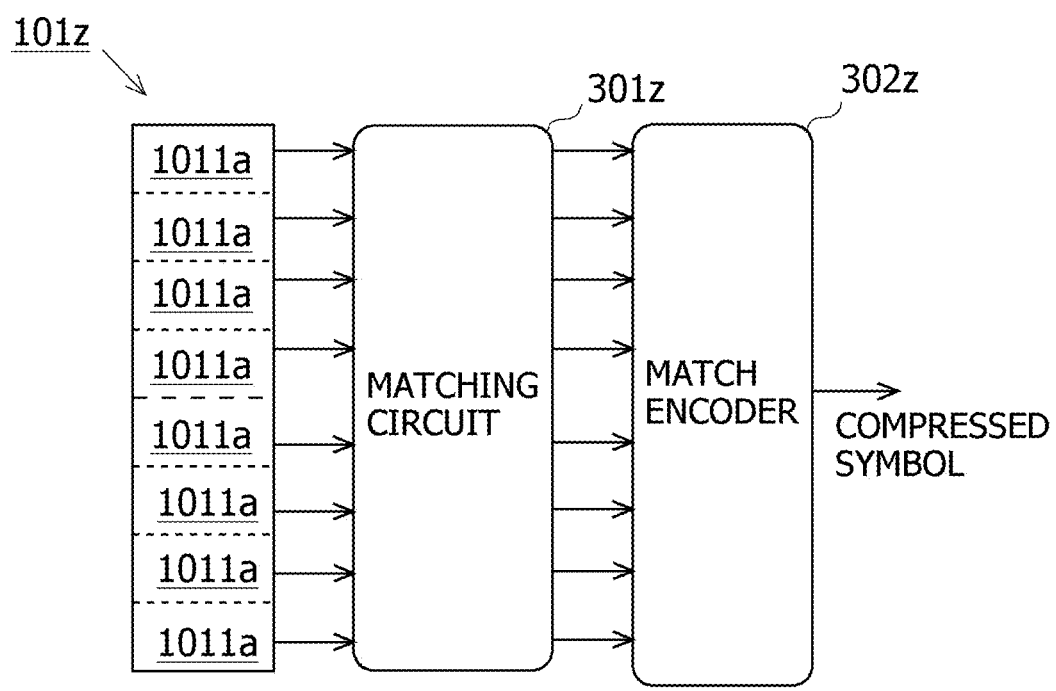
FIG. 47 is a diagram schematically illustrating an entry region search circuit according to a comparative example.

FIG. 47 is a diagram schematically illustrating an entry region retrieving circuit according to a comparative example. The entry region search circuit according to the comparative example includes a conversion table 101z, a matching circuit 301z, and a match encoder 302z.

The conversion table 101z is a conversion table implemented by a hardware circuit. In the example of FIG. 46, the conversion table 101z has eight entry regions 1011a and is not divided into bank regions.

The matching circuit 301z is a circuit provided in association with the conversion table 101z. The matching circuit 301z outputs a signal indicating 1 for the entry region 1011a that matches the input symbol pair, and outputs a signal indicating 0 for an entry region 1011a that does not match the input symbol pair.

The match encoder 302z is a circuit provided in association with the matching circuit 301z. The match encoder 302z encodes a signal sequence input from the matching circuit 301z to an output value indicated in a binary number and outputs the output value. In the comparative example, the conversion table 101z includes eight entry regions 1011a. Thus, the signal sequences output from the matching circuit 301z have eight patterns including "00000001", "00000010", "00000100", "00001000", "00010000", "00100000", "01000000", and "10000000". To express the signal sequences of the eight patterns in binary numbers, three-digit binary numbers may be used. Thus, the match encoder 302z according to the comparative example has an 8-input and 3-output circuit. In the comparative example, the output of the match encoder 302z is the compressed symbol, similar to the fourth embodiment.

FIG. 48 is a diagram illustrating an example of a correspondence between the input signal sequence input from the matching circuit and the output value output by the match encoder in the comparative example. With reference to FIG. 48, it can be understood that, for example, when the signal sequence "00000100" is input from the matching circuit 301a, the match encoder 302a converts the sequence to an output value "010" and outputs the output value.

Comparison of Fourth Embodiment with Comparative Example

In the fourth embodiment, the conversion table 101a is divided into the plurality of bank regions 1012a. The matching circuits 301 are provided in association with each of the plurality of divided bank regions 1012a. The circuit scale of the matching circuits 301 can be reduced and the processing by the matching circuits 301 can be easily accelerated in the fourth embodiment when compared to the comparative example in which the conversion table 101z is not divided into bank regions. Thus, according to the fourth embodiment, the compression process can be performed at a higher speed than in the comparative example. The fourth embodiment is different from the comparison example in that the multiplexer 303 is added, and the multiplexer 303 has a simple circuit configuration in which as many inputs as the bank regions 1012a are selected. Therefore, even if the multiplexer 303 is added, the circuit scale of the fourth embodiment is smaller than that of the comparative example.

Modification of Fourth Embodiment

Although the matching circuit 301 accept the same number of inputs as the number of the entry regions 1011a of the bank region 1012a in the fourth embodiment, the configuration of the matching circuit 301 is not limited to such a configuration. The matching circuit 301 may be, for example, a circuit that accepts less number of inputs than the number of the entry regions 1011a of the bank region 1012a. In such a case, a plurality of matching circuits 301 may be associated with the bank region 1012a.

The conversion table 101a and the matching circuits 301 may be implemented by, for example, a content addressable memory (CAM). The content addressable memory is, for example, a memory that outputs, when data is specified, an index corresponding to the data. In this case, a combination of a bank region 1a with a matching circuit 301a may be implemented in one content addressable memory, and a combination of a bank region 2a and a matching circuit 301b may be implemented in another content addressable memory. The implementation using a content addressable memory may be performed for each bank region 1012a, thereby allowing the circuit scale of the content addressable memory to be reduced compared to the implementation of the entire conversion table 101a in one content addressable memory.

Fifth Embodiment

The data compressor 10 implemented by hardware has been described in the fourth embodiment. In a fifth embodiment, a data decompressor 20 implemented by hardware will be described.

Figure 49:
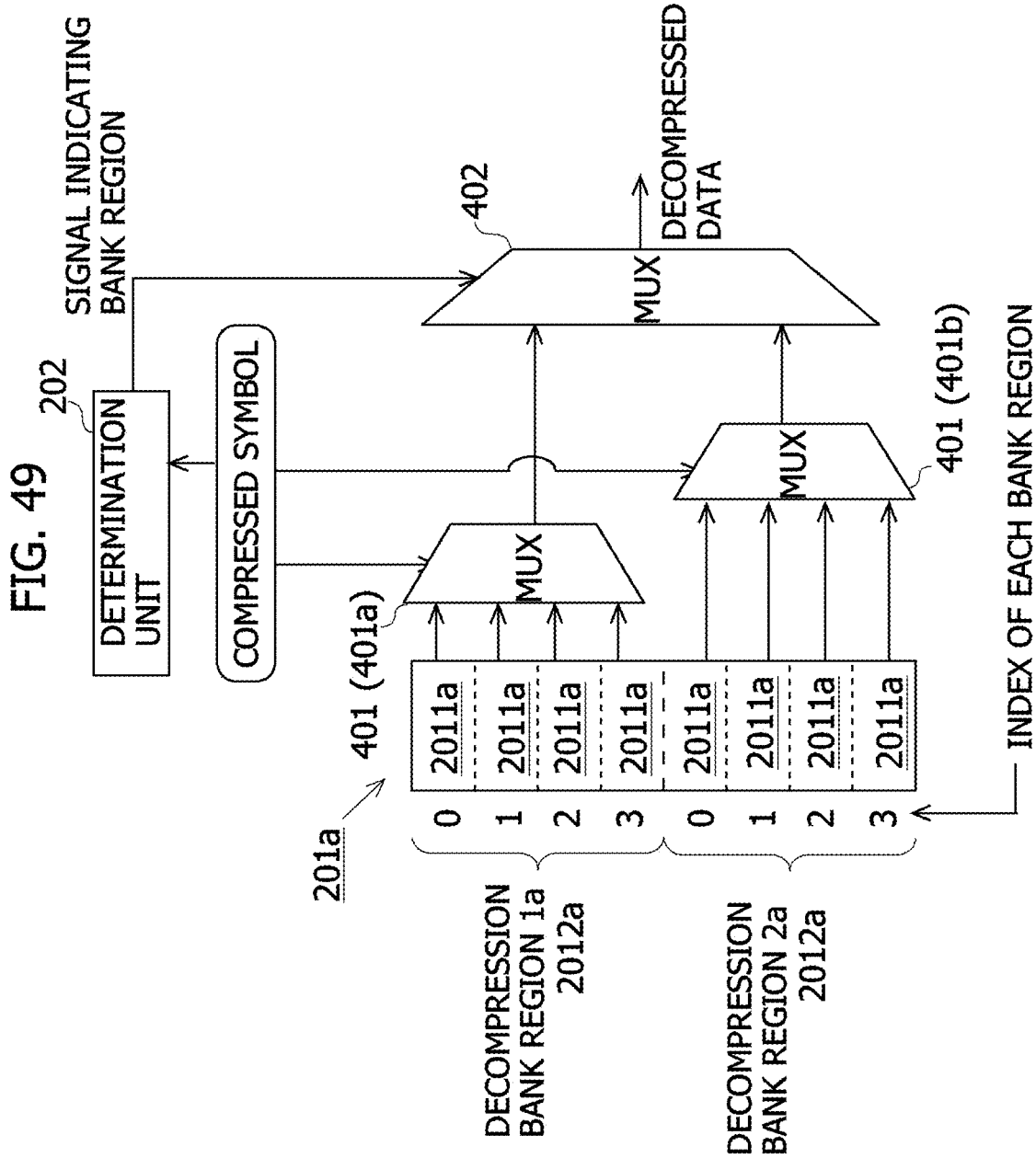
FIG. 49 is a diagram schematically illustrating an entry region search circuit of a data decompressor according to a fifth embodiment.

FIG. 49 is a diagram schematically illustrating an entry region search circuit of a data decompressor according to the fifth embodiment. The entry region search circuit of the data decompressor according to the fifth embodiment includes a conversion table 201a and multiplexers 401 and 402 (denoted by MUX in the diagram). In FIG. 49, a determination unit 202 is further illustrated.

The conversion table 201a is a conversion table implemented by a hardware circuit. In the example of FIG. 49, the conversion table 201a includes two bank regions 2012a. In a case that the bank regions 2012 are distinguished from each other, the bank regions will also be referred to as a decompression bank region 1a and a decompression bank region 2a in order of addresses. Each of the bank regions 2012a has four entry regions 2011a. The conversion table 201a outputs data stored in each of the entry regions 2011a to the multiplexer 401. Further, in FIG. 49, the indexes assigned to the entry regions 2011a in the individual bank regions 2012a are illustrated as "0", "1", "2", and "3", respectively.

The multiplexers 401 (401a and 401b) are circuits provided in association with the bank regions 2012a. In FIG. 49, the multiplexer 401a is associated with the decompression bank region 1a, and the multiplexer 401b is associated with the decompression bank region 2a. A compressed symbol is input to the multiplexers 401 as a selection signal. As in the first embodiment, the compressed symbol according to the fifth embodiment employs indexes assigned to the entries. In other words, the multiplexers 401 output, among the signals input from the conversion table 201a, a signal from an entry region 2011a corresponding to an index indicated by the compressed symbol input as the selection signal to the multiplexer 402.

The multiplexer 402 is a circuit that selects and outputs any of the input signals from multiplexers 401a and 401b based on a selection signal indicating a decompression bank region to be used for decompression input from the determination unit 202. In the fifth embodiment, the output signal of the multiplexer 402 is decompressed data. When a selection signal indicating the decompression bank region 1a is input from the determination unit 202, for example, the multiplexer 402 selects and outputs an input signal from the multiplexer 401a corresponding to the decompression bank region 1a.

In the fifth embodiment, the conversion table 201a is divided into the plurality of bank regions 2012a. The multiplexers 401 are provided in association with each of the plurality of divided bank regions 2012a. As a result, it is possible to curb an increase in the circuit scale of the multiplexers 401 and the selection of the input signal by the multiplexers 401 can be easily accelerated, compared to a case in which one multiplexer is provided in association with the entire conversion table 201a, without dividing the conversion table 201a into a plurality of bank regions.

First Modified Example

Figure 50:
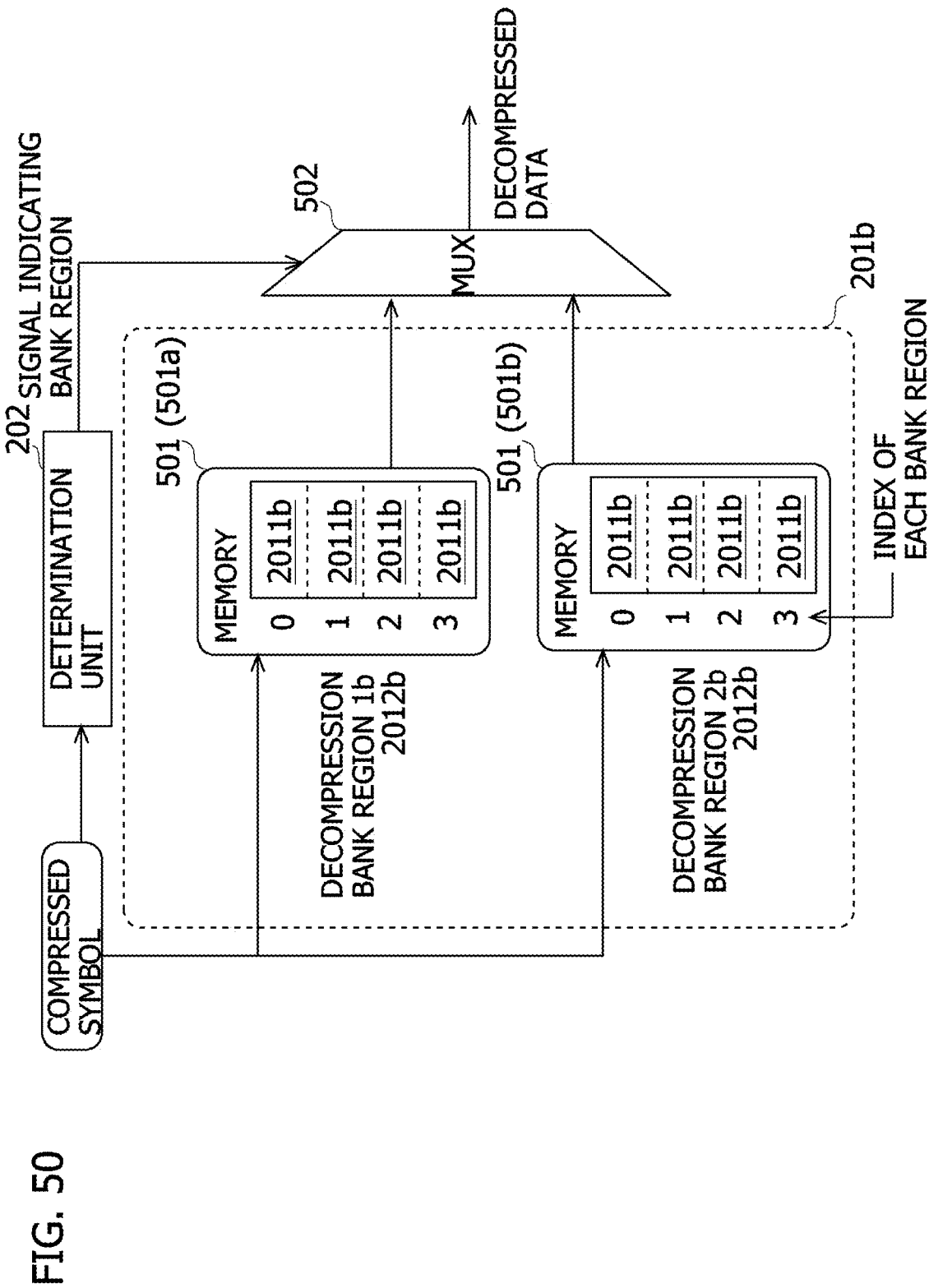
FIG. 50 is a diagram schematically illustrating an entry region search circuit according to a first modified example.

The conversion table 201a according to the fifth embodiment may be constructed on a memory element. In a first modified example, a configuration in which each of bank regions is constructed on different memory elements will be described. FIG. 50 is a diagram schematically illustrating an entry region search circuit according to the first modified example. In FIG. 50, each of bank regions 2012b is constructed on different memory elements 501 from one another.

The memory elements 501 (501a and 501b) are, for example, memories. The memory element 501 outputs data corresponding to the specified index when an index is specified on the memory. The memory element 501a and the memory element 501b are memory elements that are physically different from each other.

A conversion table 201b is a circuit that includes a plurality of bank regions 2012b constructed on the different memory elements 501. In the example of FIG. 50, the conversion table 201b includes the two bank regions 2012b constructed in each of the memory element 501a and the memory element 501b. In a case that the bank regions 2012b are distinguished from each other, one of the bank regions will also be referred to as a decompression bank region 1b and the other one will be referred to as a decompression bank region 2b. In the example of FIG. 50, the decompression bank region 1a is constructed on the memory element 501a, and the decompression bank region 2b is constructed on the memory element 501b. Each of the bank regions 2012b has four entry regions 2011b. Further, in FIG. 50, indexes assigned to each of the entry regions 2011b in each of the bank regions 2012b are denoted by "0", "1", "2", and "3". When a compressed symbol using an index of the entry region 2011b is input, the conversion table 201b outputs data stored in the entry region 2011b indicated by the input compressed symbol to a multiplexer 502.

The multiplexer 502 is a circuit that selects and outputs any input signal from the decompression bank region 1b and the decompression bank region 2b based on a selection signal indicating a decompression bank region input from a determination unit 202 to be used for decompression. In the first modified example, the output signal of the multiplexer 502 is decompressed data. When a selection signal indicating the decompression bank region 1b is input from the determination unit 202, for example, the multiplexer 502 selects and outputs an input signal from the decompression bank region 1b.

In the first modified example, the different memory elements 501 are used for each bank region. Thus, according to the first modified example, a smaller number of entry regions 2011b are constructed on the memory elements 501 compared to a case in which the entire conversion table 201b is constructed on one memory element 501. Therefore, according to the first modified example, it is possible to curb the increase of the circuit scale of the memory elements 501, and the processing speed of decompression can be easily accelerated.

Second Modified Example

Figure 51:
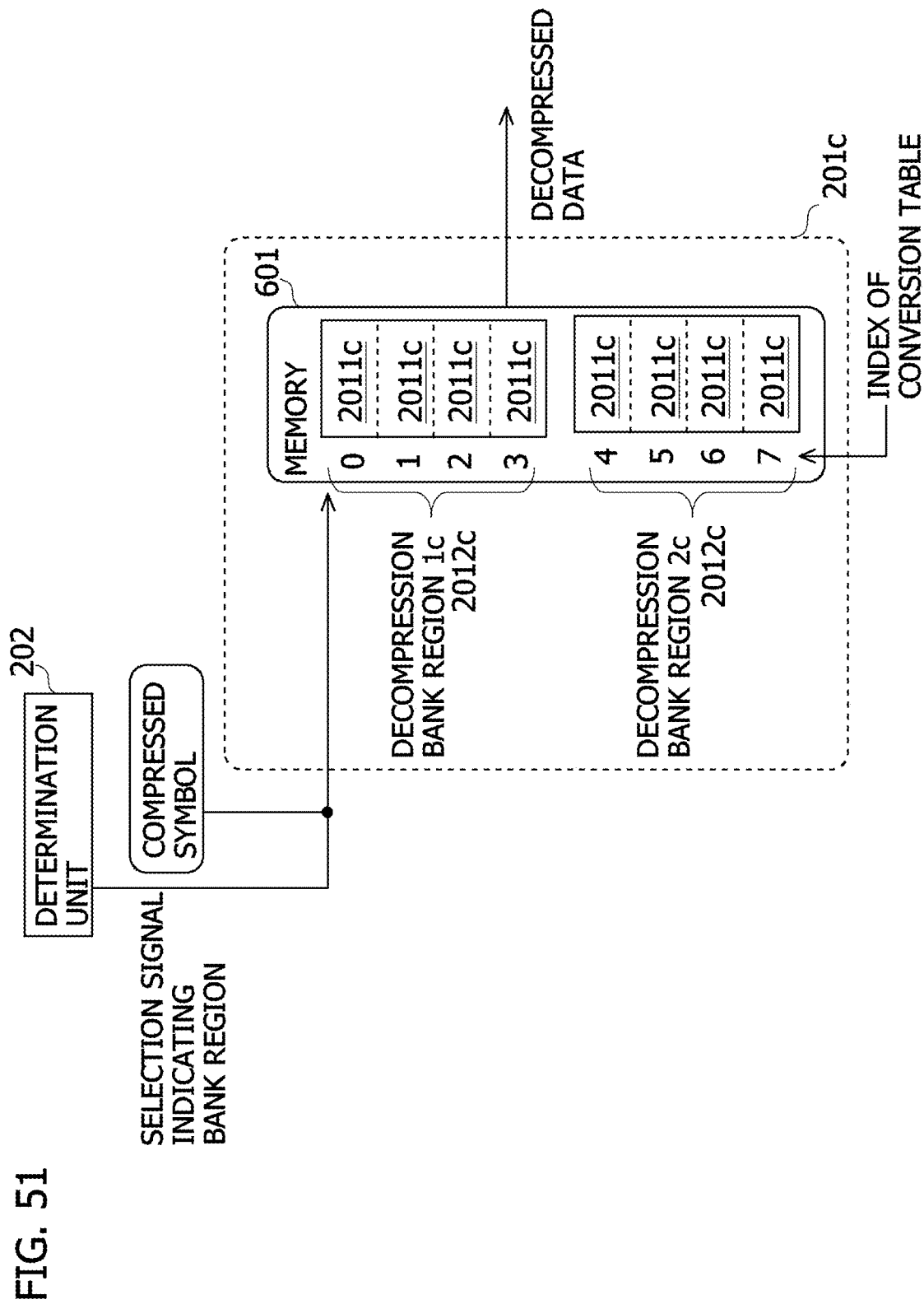
FIG. 51 is a diagram schematically illustrating an entry region search circuit according to a second modified example.

In the first modified example, each of the decompression bank regions is constructed on different memory elements. In a second modified example, a configuration in which a plurality of decompression bank regions are constructed on the same memory element will be described. FIG. 51 is a diagram schematically illustrating an entry region search circuit according to the second modified example. Further, the second modified example will be described on the assumption that indexes of bank regions are used as compressed symbols.

A conversion table 201*c* is a circuit that includes a plurality of bank regions 2012*c* constructed on a memory element 601. The memory element 601 is, for example, a memory. In the example of FIG. 51, the conversion table 201*c* includes two bank regions 2012*c*. In a case that the bank regions 2012*c* are distinguished from each other, one of the bank regions will also be referred to as a decompression bank region 1*c* and the other one will be referred to as a decompression bank region 2*c*. Each of the bank regions 2012*c* has four entry regions 2011*c*. Further, in the example of FIG. 51, the indexes assigned to each of the entry regions 2011*c* in the conversion table 201*c* are denoted by "0", "1", "2", "3", "4", "5", "6", and "7". In addition, in the example of FIG. 51, the entry regions 2011*c* corresponding to each of the indexes "0", "1", "2", and "3" are included in the decompression bank region 1*c*, and the entry regions 2011*c* corresponding to each of the indexes "4", "5", "6", and "7" are included in the decompression bank region 2*c*.

When a selection signal from the determination unit 202 indicating a bank region to be used for decompression and a compressed symbol are input to the conversion table 201*c*, the conversion table 201*c* converts the input to a binary sequence having the selection signal as most significant bits and the compressed symbol as least significant bits. The conversion table 201*c* outputs the data stored in the entry region 2011*c* corresponding to the index indicated by the converted binary sequence as decompressed data.

FIG. 52 is a diagram illustrating an example of a correspondence between selection signals from the determination unit, compressed symbols, and indexes in the second modified example. In FIG. 52, each item of "selection signal from the determination unit", "compressed symbol", "binary number", and "index" are illustrated. In FIG. 52, the correspondence between the signals from the determination unit 202, the compressed symbols, and binary sequences is illustrated. In the binary sequences illustrated in FIG. 52, the most significant one bit indicates a signal from the determination unit 202, and the least significant two bits indicate compressed symbols. The indexes represent decimal numbers obtained by converting the binary sequences. For example, when "1" is input from the determination unit 202 as a signal indicating the bank region 2012*c* to be used for decompression and "2" is input as a compressed symbol, the index is "6". Thus, in this case, the conversion table 201*c* outputs the data stored in the entry region 2011*c* corresponding to the index "6" as decompressed data. The conversion table 201*c* uniquely determines an entry region 2011*c* based on a selection signal from the determination unit 202 and a compressed symbol as described above.

According to the second modified example, because the determination unit 202 determines a bank region 2012 to be used for decompression, a range in which an entry region 2011*c* corresponding to a compressed symbol is searched can be narrowed. Therefore, according to the second modified example, it is possible to prevent the decompression process from taking a longer time.

The embodiments and the modified examples described above can be combined as appropriate.

[Computer Readable Recording Medium]

An information processing program that can cause a computer, other machines, or devices (hereinafter, a computer or the like) to implement any of the functions described above can be recorded on a recording medium that can be read by a computer or the like. Furthermore, the functions can be provided to a computer or the like by causing the computer or the like to read and execute the program of the recording medium.

Here, a recording medium that can be read by a computer or the like refers to a recording medium that can store information such as data and programs using an electrical, magnetic, optical, mechanical, or chemical action, to be read by a computer or the like. Examples of such a recording medium that can be removed from a computer or the like include, for example, a flexible disk, a magneto-optical disk, a Compact Disc Read Only Memory (CD-ROM), a Compact Disc-Recordable (CD-R), a Compact Disc-ReWriterable (CD-RW), a Digital Versatile Disc (DVD), a Blu-Ray Disc (BD), a Digital Audio Tape (DAT), an 8-mm tape, a memory card such as a flash memory, and the like. Furthermore, a hard disk, a ROM, or the like is used as a recording medium fixed to a computer or the like.

REFERENCE SIGNS LIST 10, 10*a*, 10*b*, Data compressor
20 Receiver, Data decompressor
101, 101*a*, 101*z*, 201, 201*a*, 201*b*, 201*c* Conversion table
102, 102*a*, 102*b*, 202 Determination unit
103, 103*a*, 203 Processing unit
104 Hit status record table
105 Hit rate calculation unit
106 Number-of-occupancies calculation unit
107 Status management table
1011, 1011*a*, 2011, 2011*b*, 2011*c* Entry region
1012, 1012*a*, 2012, 2012*a*, 2012*b*, 2012*c* Bank region
1021, 2021 Hash function
301, 301*a*, 301*b*, 301*z* Matching circuit
302, 302*a*, 302*b*, 302*z* Match encoder
303, 401, 401*a*, 401*b*, 402, 502 Multiplexer
501, 501*a*, 501*b*, 601, Memory element
700 Information processing device
701 CPU
702 Main storage unit
703 Auxiliary storage unit
704 Communication unit
B1 Connection bus
800 Transmission line
P Data compression program

The invention claimed is:

1. A data compressor configured to compress a first data sequence including a plurality of pieces of first data to a second data sequence smaller in size than the first data sequence, the data compressor comprising:
 a conversion table in which a predetermined number of entry regions capable of storing a mapping between the first data and second data smaller in size than the first data are included, the predetermined number of entry regions are divided into a plurality of bank regions, and each of the plurality of bank regions includes entry regions smaller in number than the predetermined number;

a determination unit configured to uniquely determine, among the plurality of bank regions, a bank region corresponding to a value of each of the plurality of pieces of first data; and a processing unit configured to search, for each of the plurality of pieces of first data, entry regions of the corresponding bank region determined by the determination unit the predetermined number of times each or a smaller number of times than the predetermined number each, output, when the second data corresponding to the first data is stored, the stored second data, and acquire, when second data corresponding to the first data is not stored, the second data corresponding to the first data to register the acquired second data in an entry region in which another piece of second data is not stored and output the first data.

2. The data compressor according to claim 1, further comprising:

a calculation unit configured to calculate, for each of the plurality of bank regions, a hit rate that is a rate of the number of times by which storing of the second data corresponding to the first data is detected to the number of times by which the bank region is retrieved and an occupancy rate that is a rate of the number of registered entries to a maximum number of entries that can be registered in the bank region, wherein the determination unit changes a corresponding bank region determined by the determination unit to another bank region in a case that the hit rate and the occupancy rate satisfy a predetermined change condition.

3. The data compressor according to claim 2, wherein, cases in which the predetermined change condition is satisfied include a case in which a hit rate of a corresponding bank region determined by the determination unit is lower than a predetermined first threshold of hit rate and an occupancy rate of a corresponding bank region determined by the determination unit is lower than a predetermined first threshold of occupancy rate, and the other bank region is a bank region having a lowest occupancy rate among the plurality of bank regions.

4. The data compressor according to any one of claims 1 to 3, further comprising:

a calculation unit configured to calculate, for each of the plurality of bank regions, a hit rate that is a rate of the number of times by which storing of the second data corresponding to the first data is detected to the number of times by which the bank region is retrieved and an occupancy rate that is a rate of the number of registered entries to a maximum number of entries that can be registered in the bank region, wherein, in a case that a hit rate and an occupancy rate calculated for a corresponding bank region determined by the determination unit satisfy a predetermined division condition, the bank region is divided into two regions.

5. The data compressor according to claim 4, wherein the predetermined division condition includes a case in which the hit rate is equal to or higher than a predetermined second threshold of hit rate and the occupancy rate is equal to or higher than a predetermined second threshold of occupancy rate.

6. The data compressor according to any one of claims 1 to 5, further comprising:

a calculation unit configured to calculate, for each of the plurality of bank regions, a hit rate that is a rate of the number of times by which storing of the second data corresponding to the first data is detected to the number of times by which the bank region is retrieved and an occupancy rate that is a rate of the number of registered entries to a maximum number of entries that can be registered in the bank region, wherein, in a case that a hit rate and an occupancy rate calculated for a corresponding bank region determined by the determination unit satisfy a predetermined integration condition, the bank region and another bank region are integrated to one region.

7. The data compressor according to claim 6, wherein cases in which the predetermined integration condition is satisfied include a case in which an occupancy rate calculated for a corresponding bank region determined by the determination unit is equal to or higher than a predetermined third threshold of occupancy rate, and an occupancy rate calculated for the other bank region is lower than or equal to a predetermined fourth threshold of occupancy rate set to be lower than the third threshold of occupancy rate.

8. A data decompressor configured to decompress data received from a data compressor, the data compressor being configured to output, when first data is registered in an entry region of a conversion table, second data which corresponds to the first data and is smaller in size than the first data, and acquire, when first data is not registered in an entry region of the conversion table, second data corresponding to the first data to register the acquired second data in an entry region and output the first data, the data decompressor comprising:

a decompression conversion table in which a predetermined number of decompression entry regions capable of storing a mapping between the second data and the first data are included, the predetermined number of decompression entry regions are divided into a plurality of decompression bank regions, and each of the plurality of decompression bank regions includes decompression entry regions smaller in number than the predetermined number;

a determination unit configured to uniquely determine, among the plurality of decompression bank regions, a decompression bank region corresponding to a value of each of the first data and the second data; and a processing unit configured to, when the first data is received, search the decompression entry regions of the corresponding decompression bank region determined by the determination unit the predetermined number of times each or a smaller number of times than the predetermined number each and output the second data corresponding to the first data, and configured to, when the second data is received, search the entry regions of the corresponding decompression bank region determined by the determination unit the predetermined number of times each or a smaller number of times than the predetermined number each and acquire the first data corresponding to the second data to register the acquired first data in a decompression entry region in which another piece of first data is not stored and output the first data.

9. A data compression/decompression system including a data compressor configured to compress a first data sequence including a plurality of pieces of first data to a second data sequence smaller in size than the first data sequence and a data decompressor configured to decompress a data sequence compressed by the data compressor, wherein the data compressor includes a conversion table in which a predetermined number of entry regions capable of storing a mapping between the first data and second data smaller in size than the first data are included, the predetermined number of entry regions are divided into a plurality of bank regions, and each of the plurality of bank regions includes entry regions smaller in number than the predetermined number, a determination unit configured to uniquely determine, among the plurality of bank regions, a bank region corresponding to a value of each of the plurality of pieces of first data, and a processing unit configured to search, for each of the plurality of pieces of first data, entry regions of the corresponding bank region determined by the determination unit the predetermined number of times each or a smaller number of times than the predetermined number each, output, when the second data corresponding to the first data is stored, the stored second data, and acquire, when second data corresponding to the first data is not stored, second data corresponding to the first data to register the acquired second data in an entry region in which another piece of second data is not stored and output the first data, and the data decompressor includes a decompression conversion table in which a predetermined number of decompression entry regions capable of storing a mapping between the second data and the first data are included, the predetermined number of decompression entry regions are divided into a plurality of decompression bank regions, and each of the plurality of decompression bank regions includes decompression entry regions smaller in number than the predetermined number, a determination unit configured to uniquely determine, among the plurality of decompression bank regions, a decompression bank region corresponding to a value of each of the first data and the second data, and a processing unit configured to, when the first data is received, search the decompression entry regions of the corresponding decompression bank region determined by the determination unit the predetermined number of times each or a smaller number of times than the predetermined number each, and output the second data corresponding to the first data, and configured to, when the second data is received, search the entry regions of the corresponding decompression bank region determined by the determination unit the predetermined number of times or a smaller number of times than the predetermined number each, and acquire the first data corresponding to the second data to register the acquired first data in a decompression entry region in which another piece of first data is not stored and output the first data.

* * * * *

UNITED STATES PATENT AND TRADEMARK OFFICE
CERTIFICATE OF CORRECTION

PATENT NO. : 11,196,443 B2
APPLICATION NO. : 17/270601
DATED : December 7, 2021
INVENTOR(S) : Shinichi Yamagiwa et al.

It is certified that error appears in the above-identified patent and that said Letters Patent is hereby corrected as shown below:

In the Claims

At Column 33, Lines 47-48, "any one of claims 1 to 3" should be -- claim 1 --.

At Column 34, Lines 1-2, "any one of claims 1 to 5" should be -- claim 1 --.

Signed and Sealed this
Twenty-ninth Day of March, 2022

Drew Hirshfeld
*Performing the Functions and Duties of the*
*Under Secretary of Commerce for Intellectual Property and*
*Director of the United States Patent and Trademark Office*